US012652966B2

(12) United States Patent
Sato et al.

(10) Patent No.: US 12,652,966 B2
(45) Date of Patent: Jun. 9, 2026

(54) QUANTUM DEVICE AND ITS MANUFACTURING METHOD

(71) Applicant: NEC Corporation, Tokyo (JP)

(72) Inventors: Tetsuro Sato, Tokyo (JP); Tsuyoshi Yamamoto, Tokyo (JP)

(73) Assignee: NEC CORPORATION, Tokyo (JP)

( * ) Notice: Subject to any disclaimer, the term of this patent is extended or adjusted under 35 U.S.C. 154(b) by 425 days.

(21) Appl. No.: 18/039,207

(22) PCT Filed: Dec. 4, 2020

(86) PCT No.: PCT/JP2020/045248
§ 371 (c)(1),
(2) Date: May 26, 2023

(87) PCT Pub. No.: WO2022/118464
PCT Pub. Date: Jun. 9, 2022

(65) Prior Publication Data
US 2023/0422636 A1      Dec. 28, 2023

(51) Int. Cl.
*H10N 60/80* (2023.01)
*H10N 60/01* (2023.01)
*H10N 60/12* (2023.01)

(52) U.S. Cl.
CPC ....... *H10N 60/805* (2023.02); *H10N 60/0912* (2023.02); *H10N 60/12* (2023.02)

(58) Field of Classification Search
CPC .... H10N 60/12; H10N 60/124; H10N 60/126; H10N 60/0912; H10N 60/0941;
(Continued)

(56) References Cited

U.S. PATENT DOCUMENTS

2004/0266209 A1* 12/2004 Hinode ................. H10P 95/064
257/E21.245
2007/0281861 A1* 12/2007 Ishimaru .............. H10N 60/124
505/100
(Continued)

FOREIGN PATENT DOCUMENTS

JP      S59-135783 A      8/1984
JP      S64-074777 A      3/1989
(Continued)

OTHER PUBLICATIONS

Superconducting qubits on silicon substrates for quantum device integration, vol. 111, ISSN 1077-3118, No. 4, Applied Physics Letters, AIP Publishing, Keller, Andrew J. and Dieterle, Paul B. and Fang, Michael and Berger, Brett and Fin (Year: 2017).*
(Continued)

*Primary Examiner* — Aaron J Gray
(74) *Attorney, Agent, or Firm* — Sughrue Mion, PLLC

(57)      ABSTRACT
A quantum device (1) includes a plurality of first conductors (2), a plurality of second conductors (4), and a conductor layer (6). The first conductors (2), the second conductors (4), and the conductor layer (6) are formed of superconducting materials. An oxide film (8) is formed between the first conductors (2) and the second conductors (4). A Josephson junction (10) is formed by a part of one of the plurality of first conductors (2), a part of one of the plurality of second conductors (4), and the oxide film (8). The one first conductor (2) constituting the Josephson junction (10) and the conductor layer (6) are connected to each other directly or through another conductor. The one second conductor (4) constituting the Josephson junction (10) and the conductor layer (6) are connected to each other directly or through another conductor.

2 Claims, 61 Drawing Sheets

50

(58) Field of Classification Search
CPC .............. H10N 60/805; H10N 60/815; H10W 20/056; H10W 20/42; H10W 20/081
See application file for complete search history.

(56) References Cited

U.S. PATENT DOCUMENTS

2019/0363239  A1     11/2019   Yoscovits et al.
2021/0399199  A1*    12/2021   Adiga  ................... H10N 60/12

FOREIGN PATENT DOCUMENTS

| JP | H04-268758 A | 9/1992 |
| JP | 2019-532506 A | 11/2019 |
| WO | 2017/015432 A1 | 1/2017 |
| WO | 2019/032115 A1 | 2/2019 |

OTHER PUBLICATIONS

International Search Report for PCT Application No. PCT/JP2020/045248, mailed on Mar. 9, 2021.
1 JP Office Communication for JP Application No. 2022-566738, mailed on Sep. 3, 2024 with English Translation.
JP Office Action for Japanese Patent Application No. 2022-566738, mailed on Jun. 25, 2024 with English Translation.

* cited by examiner

90

130B

PLAN VIEW

130A

I

I

132B

132A 130B    60    130A

CROSS SECTION TAKEN ALONG LINE I-I

CROSS SECTION TAKEN ALONG LINE I-I

PLAN VIEW

CROSS SECTION TAKEN ALONG LINE I-I

PLAN VIEW

CROSS SECTION TAKEN ALONG LINE I-I

PLAN VIEW

CROSS SECTION TAKEN ALONG LINE I-I

PLAN VIEW

CROSS SECTION TAKEN ALONG LINE I-I

130B          PLAN VIEW          130A

I                                          I 132A                                      132A 130B          60          130A

CROSS SECTION TAKEN ALONG LINE I-I

PLAN VIEW

CROSS SECTION TAKEN ALONG LINE I-I

PLAN VIEW

CROSS SECTION TAKEN ALONG LINE I-I

PLAN VIEW

CROSS SECTION TAKEN ALONG LINE I-I

PLAN VIEW

CROSS SECTION TAKEN ALONG LINE I-I 130B 150A 120B                    PLAN VIEW                    130A 112A 110A 150A 110B                                                    112A  120A

CROSS SECTION TAKEN ALONG LINE I-I

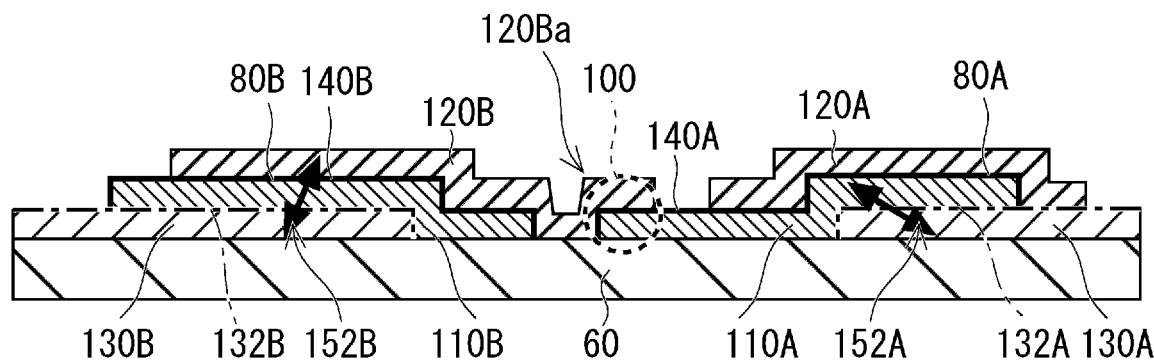
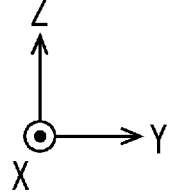
F i g.  25

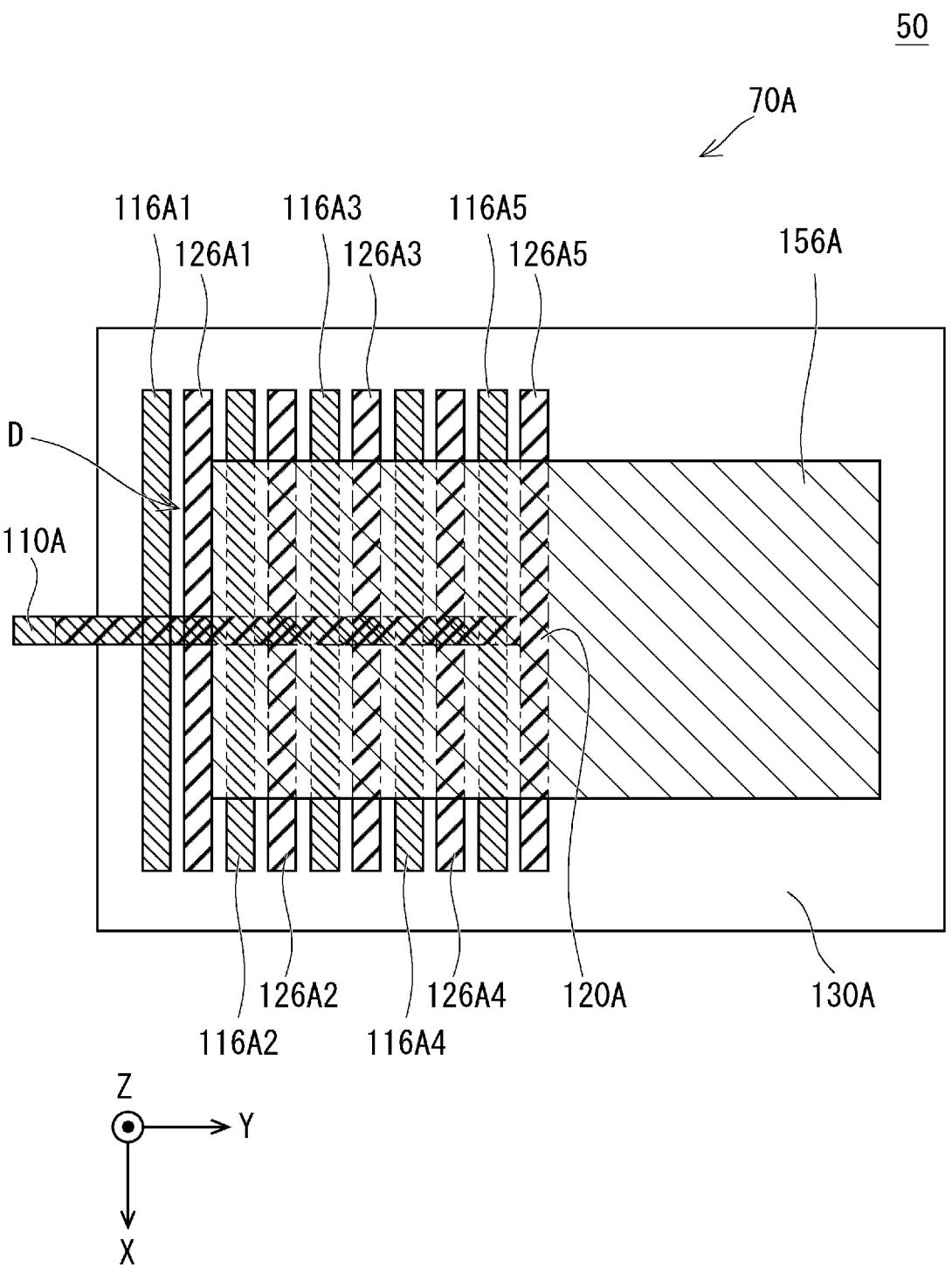
F i g.  30

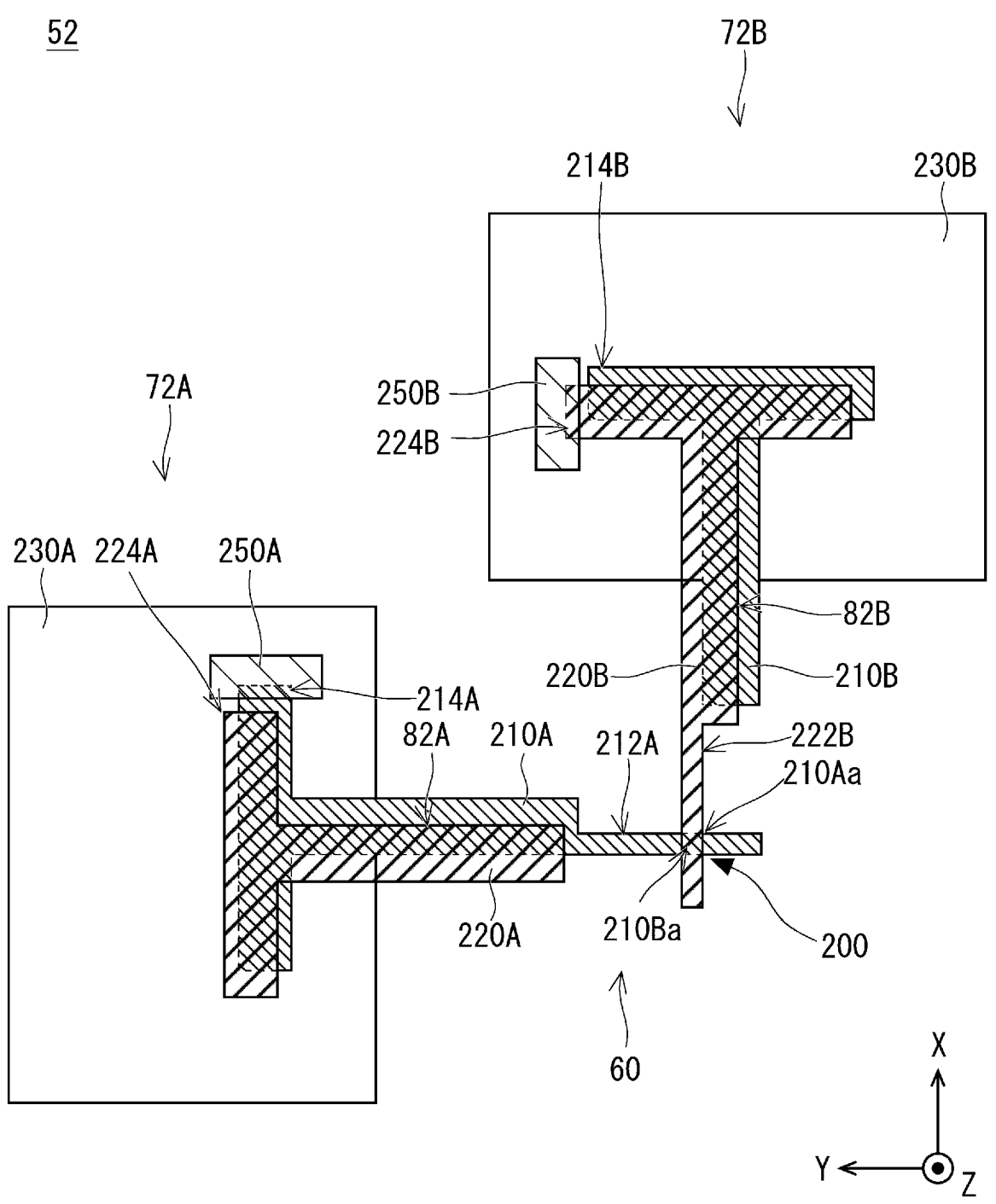
F i g.　32

PLAN VIEW

130B

130A

I                    I 132B                                                                    132A 130B                        60                        130A

CROSS SECTION TAKEN ALONG LINE I-I

CROSS SECTION TAKEN ALONG LINE I-I

PLAN VIEW

CROSS SECTION TAKEN ALONG LINE I-I

PLAN VIEW

CROSS SECTION TAKEN ALONG LINE I-I

PLAN VIEW

CROSS SECTION TAKEN ALONG LINE I-I

PLAN VIEW

CROSS SECTION TAKEN ALONG LINE I-I

PLAN VIEW

CROSS SECTION TAKEN ALONG LINE I-I 130B 412B 120B     PLAN VIEW     130A   110A

I     I 302B     302A 158B 110B     120A 410 120B 140B 142B   100     142A 140A 120A 150X 150X     158B

410

132B    130B     110B    60     110A     130A     132A

CROSS SECTION TAKEN ALONG LINE I-I

PLAN VIEW

CROSS SECTION TAKEN ALONG LINE I-I

PLAN VIEW

130B

130A

I                                                        I 132A                                              132A 130B                  60                  130A

CROSS SECTION TAKEN ALONG LINE I-I

PLAN VIEW

CROSS SECTION TAKEN ALONG LINE I-I

PLAN VIEW

CROSS SECTION TAKEN ALONG LINE I-I

PLAN VIEW

CROSS SECTION TAKEN ALONG LINE I-I

PLAN VIEW

CROSS SECTION TAKEN ALONG LINE I-I

PLAN VIEW

CROSS SECTION TAKEN ALONG LINE I-I

QUANTUM DEVICE AND ITS MANUFACTURING METHOD

This application is a National Stage Entry of PCT/JP2020/045248 filed on Dec. 4, 2020, the contents of all of which are incorporated herein by reference, in their entirety.

TECHNICAL FIELD

The present invention relates to a quantum device and its manufacturing method.

BACKGROUND ART

Patent Literature 1 discloses a method for realizing qubits of a quantum computer. A base aluminum wiring layer, a first aluminum layer formed on the surface of the base aluminum wiring layer, and a second aluminum layer formed on the surface of the first aluminum layer are used to form qubits. Further, a tunnel barrier in a Josephson junction is formed between the first and second aluminum layers by oxidizing the surface of the first aluminum layer that is in contact with the second aluminum layer. In the qubits disclosed in Patent Literature 1, the Josephson junction is formed by the first and second aluminum layers and the tunnel barrier.

CITATION LIST

Patent Literature

Patent Literature 1: Published Japanese Translation of PCT International Publication for Patent Application, No. 2019-532506

SUMMARY OF INVENTION

Technical Problem

Patent Literature 1 does not disclose anything about the connection between the base aluminum wiring layer and the first aluminum layer nor anything about the connection between the base aluminum wiring layer and the second aluminum layer. Therefore, in the technology disclosed in Patent Literature 1, there is a risk that the performance of the qubits (the quantum device) may deteriorate.

The present disclosure has been made to solve the above-described problem, and an object thereof is to provide a quantum device and its manufacturing method capable of suppressing the deterioration of the performance of the quantum device.

Solution to Problem

A quantum device according to the present disclosure includes: a plurality of first conductors formed of a superconducting material in a layered state; a plurality of second conductors formed of a superconducting material, at least a part of the second conductors being deposited on the first conductors; and a conductor layer formed of a superconducting material, in which an oxide film is formed between the first conductors and the second conductors, and a Josephson junction is formed by a part of one of the plurality of first conductors, a part of one of the plurality of second conductors, and the oxide film, the one first conductor constituting the Josephson junction and the conductor layer are connected to each other directly or through a conductor, and the one second conductor constituting the Josephson junction and the conductor layer are connected to each other directly or through a conductor.

Further, a method for manufacturing a quantum device according to the present disclosure includes: forming a resist mask on a substrate, the substrate including a conductor layer formed of a superconducting material formed therein, the resist mask being a mask for forming a Josephson junction by a first conductor formed of a superconducting material and a second conductor formed of a superconducting material; depositing a plurality of first conductors on the substrate, on which the resist mask has been formed, by angled evaporation performed in a first direction; oxidizing a surface of the first conductors and thereby forming an oxide film thereon; depositing at least a part of the second conductors on each of the plurality of first conductors by angled evaporation performed in a second direction, and thereby forming a Josephson junction by a part of one of the first conductors, a part of one of the second conductors, and the oxide film; and connecting the one second conductor constituting the Josephson junction to the conductor layer directly or through a conductor.

Advantageous Effects of Invention

According to the present disclosure, it is possible to provide a quantum device and its manufacturing method capable of suppressing the deterioration of the performance of the quantum device.

BRIEF DESCRIPTION OF DRAWINGS

FIG. 25 shows a quantum device according to a second example embodiment;

FIG. 30 shows a quantum device according to a fourth example embodiment;

FIG. 32 shows a quantum device according to a fifth example embodiment;

EXAMPLE EMBODIMENT

Overview of Example Embodiment According to Present Disclosure

Figure 1:
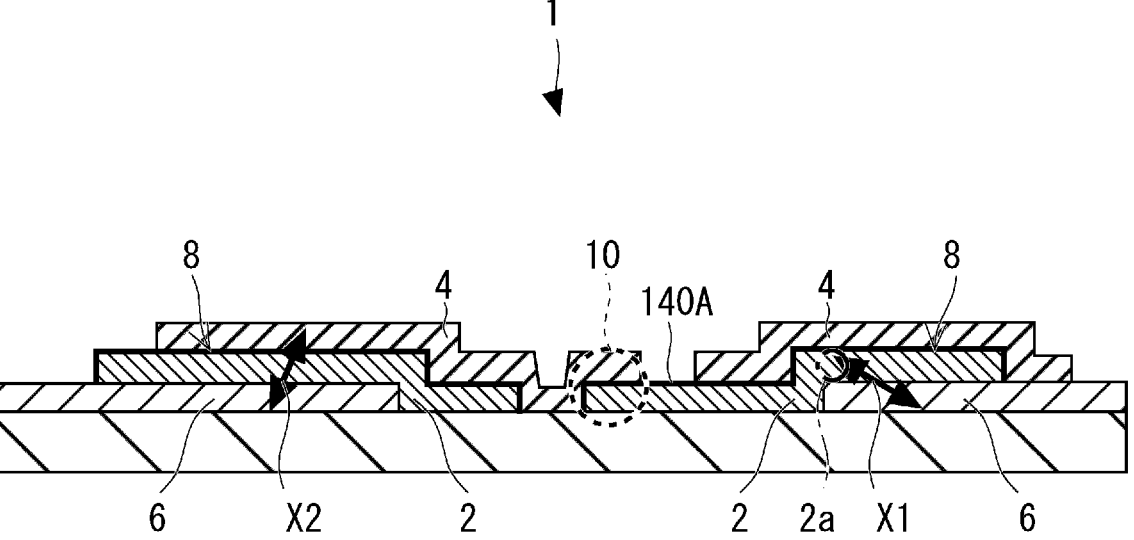
FIG. 1 shows an overview of a quantum device according to an example embodiment.

Prior to describing an example embodiment according to the present disclosure, an overview of the example embodiment according to the present disclosure will be described. FIG. 1 shows an overview of a quantum device 1 according to this example embodiment.

The quantum device 1 includes a plurality of first conductors 2, a plurality of second conductors 4, and a conductor layer 6 (a third conductor). The second conductors 4 are deposited on the first conductors 2. The first conductors 2, the second conductors 4, and the conductor layer 6 are formed of superconducting materials. The first conductors 2 and the second conductors 4 may be formed of, for example, aluminum (Al), but their material is not limited to this example. Further, the conductor layer 6 may be formed of, for example, niobium (Nb), but its material is not limited to this example. Further, the conductor layer 6 constitutes, for example, a circuit of the quantum device 1. The conductor layer 6 may constitute, for example, a superconducting circuit such as wiring lines, resonators, capacitors, and ground planes.

Further, an oxide film 8 is formed between the first conductors 2 and the second conductors 4. The oxide film 8 can be formed, for example, by performing an oxidation process on a surface of the first conductors 2 before the second conductors 4 are deposited on the first conductors 2. Further, a Josephson junction 10 is formed of a part of one of the plurality of first conductors 2, a part of one of the plurality of second conductors 4, and the oxide film 8.

Note that as indicated by an arrow X1, the first conductor 2 constituting the Josephson junction 10 is connected to the conductor layer 6 directly or through another conductor. For example, the first conductor 2 and the conductor layer 6 may be connected to each other without the oxide film (dielectric), which is not a conductor, interposed therebetween. Similarly, as indicated by an arrow X2, the second conductor 4 constituting the Josephson junction 10 is connected to the conductor layer 6 directly or through another conductor. For example, the second conductors 4 and the conductor layer 6 may be connected to each other without the oxide film (dielectric), which is not a conductor, interposed therebetween. Note that, for example, the first conductor 2 and the conductor layer 6 may be (electrically) connected to each other without not only the oxide film 8 formed between the first conductor 2 and the second conductor 4 but also without any other oxide film interposed therebetween. Similarly, for example, the second conductor 4 and the conductor layer 6 may be (electrically) connected to each other without not only the oxide film 8 formed between the first conductor 2 and the second conductor 4 but also without any other oxide film interposed therebetween. Note that the expression "(the first conductor 2 and the conductor layer 6) are connected to each other without the oxide film (dielectric) interposed therebetween" does not necessarily mean that there is no oxide film at all between the first conductor 2 and the conductor layer 6. The expression "connected without the oxide film (dielectric) interposed therebetween" means that there is, in the connection route between the first conductor 2 and the conductor layer 6, at least a place at which the first conductor 2 and the conductor layer 6 are connected to each other directly or through another conductor(s) without the oxide film (dielectric) interposed therebetween. That is, in this example embodiment, as long as there is, in the connection route between the first conductor 2 and the conductor layer 6, at least a place at which the first conductor 2 and the conductor layer 6 are connected to each other directly or through another conductor(s), the first conductor 2 and the conductor layer 6 may be connected to each other through the oxide film (dielectric) in the remaining part of the connection route. Further, the expression "(the first conductor 2 and the conductor layer 6) are directly connected to each other" means that there is, in the connection surface between the first conductor 2 and the conductor layer 6, at least a place at which the first conductor 2 and the conductor layer 6 are connected to each other without the oxide film (dielectric) interposed therebetween. The above-described matters apply to other example embodiments described later.

Note that at least one projecting part 2a (a first projecting part) that is not covered by the second conductors 4 may be formed in the first conductors 2 constituting the Josephson junction 10. Further, the projecting part 2a and the conductor layer 6 may be connected to each other directly or through another conductor. For example, the projecting part 2a and the conductor layer 6 may be connected to each other without the oxide film 8 interposed therebetween.

By forming the quantum device 1 according to this example embodiment as described above, it can suppress the deterioration of the performance thereof. That is, the quantum device 1 according to this example embodiment can suppress the decoherence. The above-described matters will be described hereinafter in detail with comparative examples shown below.

Comparative Example

First Comparative Example

Figure 2:
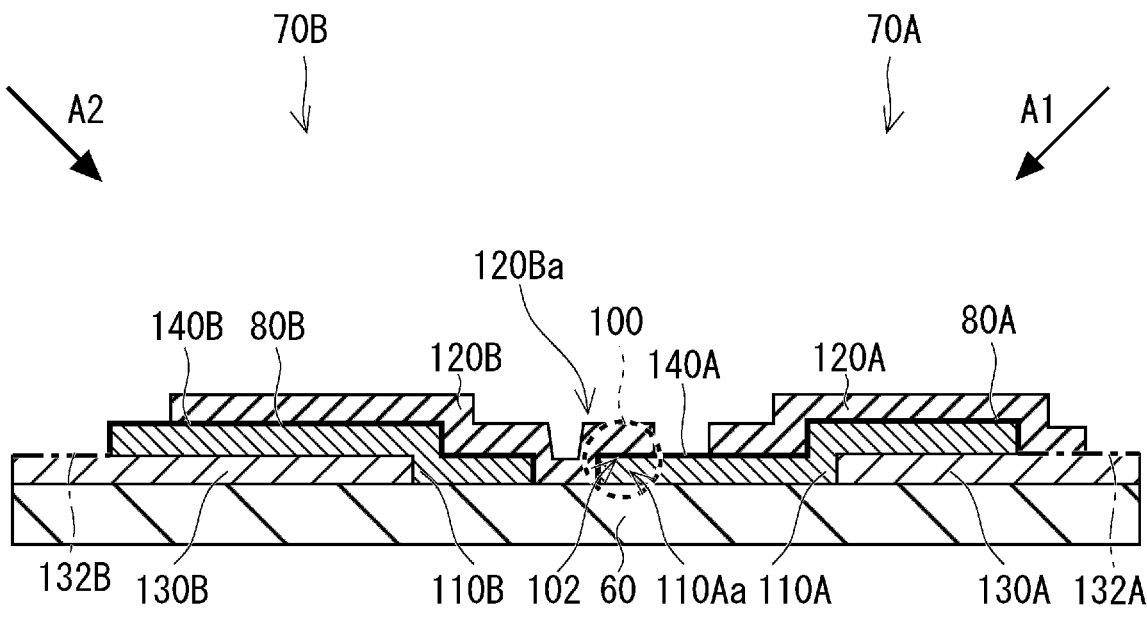
FIG. 2 shows a quantum device according to a first comparative example.

FIG. 2 shows a quantum device 90 according to a first comparative example. FIG. 2 is a cross-sectional diagram of the quantum device 90 according to the first comparative example. The quantum device 90 according to the first comparative example includes a substrate 60, a plurality of first conductors 110 (110A and 110B), a plurality of second conductors 120 (120A and 120B), and conductor layers 130 (130A and 130B) that constitute a superconducting circuit. The first conductors 110, the second conductors 120, and the conductor layers 130 are deposited on the substrate 60.

The first conductors 110 are deposited on the conductor layers 130. The second conductors 120 are deposited on the first conductors 110. The first conductors 110, the second conductors 120, and the conductor layers 130 are formed of superconducting materials. In the following description, it is assumed that the first and second conductors 110 and 120 are formed of aluminum (Al). Further, in the following description, it is assumed that the conductor layers 130 (a third conductor) are formed of niobium (Nb).

Further, oxide films 140 (140A and 140B) are formed between the first and second conductors 110 and 120. The oxide films 140 can be formed, for example, by performing an oxidation process on surfaces of the first conductors 110 before the second conductors 120 are deposited on the first conductors 110. Further, a Josephson junction 100 is formed by a part of the first conductors 110 (110A) (a first conductor part 110Aa), a part of the second conductors 120 (120B) (a second conductor part 120Ba), and the oxide film 140 (140A).

Note that the side on which the first conductor 110A constituting the Josephson junction 100 is formed so as to extend, with respect to the Josephson junction 100, toward the conductor layer 130A (i.e., the right side in FIG. 2) is referred to as a first side 70A. That is, the first side 70A corresponds to the right side of the Josephson junction 100 in FIG. 2. Further, the side on which the second conductor 120B constituting the Josephson junction 100 is formed so as to extend, with respect to the Josephson junction 100, toward the conductor layer 130B (i.e., the left side in FIG. 2) is referred to as a second side 70B. That is, the second side 70B corresponds to the left side of the Josephson junction 100 in FIG. 2. Note that, as will be described later, two first conductors 110 are evaporated by performing angled evapo- ration (which is also called "angled deposition", "oblique- angle deposition", or "oblique deposition") in a first direc- tion (indicated by an arrow A1), which is the direction inclined from the vertical direction toward the first side 70A as viewed from the substrate 60 side. Further, two second conductors 120 are evaporated by performing angled evapo- ration in a second direction (indicated by an arrow A2), which is the direction inclined from the vertical direction toward the second side 70B as viewed from the substrate 60 side. Note that the "vertical direction" refers to the direction perpendicular to the surface of the substrate 60 on which the Josephson junction 100 is formed, i.e., the surface on which the first conductors 110, the second conductors 120, and the conductor layers 130 are deposited. The above-described matter applies to the description below.

On the first side 70A, the first conductor 110A is deposited on the substrate 60 and the conductor layer 130A. Further, the second conductor 120A is deposited on the first conduc- tor 110A and the conductor layer 130A. Further, an oxide film 132A (NbOx: niobium oxide) is formed on a part of the surface of the conductor layer 130A that is not in contact with the substrate 60 nor with the first conductor 110A. Further, an oxide film 140A (AlOx: aluminum oxide) is formed on a part of the surface of the first conductor 110A that is not in contact with the substrate 60 nor with the conductor layer 130A. That is, the oxide film 140A is formed on a part of the surface of the first conductor 110A that is in contact with the second conductor 120A or 120B.

Meanwhile, on the second side 70B, the first conductor 110B is deposited on the substrate 60 and the conductor layer 130B. Further, the second conductor 120B is deposited on the substrate 60 and the first conductor 110B. Note that a second conductor part 120Ba of the second conductor 120B, which is the end of the second conductor 120B on the first side 70A, is deposited on a first conductor part 110Aa of the first conductor 110A, which is the end of the first conductor 110A on the second side 70B, with the oxide film 140A interposed therebetween. The Josephson junction 100 is formed by depositing the second conductor part 120Ba on the first conductor part 110Aa with the oxide film 140A (a tunnel barrier layer 102) interposed therebetween. Further, an oxide film 132B (NbOx) is formed on a part of the surface of the conductor layer 130B that is not in contact with the substrate 60 nor with the first conductor 110B. Further, an oxide film 140B (AlOx) is formed on a part of the surface of the first conductor 110B that is not in contact with the substrate 60 nor with the conductor layer 130B. That is, the oxide film 140B is formed on a part of the surface of the first conductor 110B that is in contact with the second conductor 120B.

An outline of a method for fabricating the Josephson junction 100 according to the first comparative example will be described hereinafter. The Josephson junction 100 is formed by using an angled evaporation method. In this method, a resist mask conforming to the shapes of the first and second conductors 110 and 120 is provided on the substrate 60 in advance. Then, thin films made of a superconducting material (i.e., the first and second conductors 110 and 120) are formed by performing evaporation twice while changing the direction of the evaporation with respect to the substrate 60 between the first evaporation and the second evaporation. That is, the first conductors 110 is evaporated by the first evaporation process and the second conductors 120 is evaporated by the second evaporation process. The surfaces of the first conductors 110 are oxidized after the first evaporation process. The oxide film 140 formed in this process functions as a tunnel barrier layer 102 of the Josephson junction 100. Further, as will be described later, since the same resist mask is used in the two evaporation processes without moving it relative to the substrate 60, superconductors (the first and second conductors 110 and 120) having the same shape are formed on top of one another and their positions are slightly shifted from each other. In this overlapping part, the Josephson junction 100 is inten- tionally formed and a spurious junction 80 (a parasitic junction) is unintentionally formed. The spurious junction 80 (the spurious junction) will be described later.

FIGS. 3 to 8 are diagrams showing steps included in a method for manufacturing a quantum device 90 according to the first comparative example. In each of FIGS. 3 to 8, an upper part is a plan view and a lower part is a cross-sectional diagram taken along a line I-I in the plan view. Further, the substrate 60 is omitted in the plan view. The above-de- scribed matters apply to diagrams showing steps described later. Further, for the sake of explanation, the plan view is drawn in such a manner that, in the parts where the first and second conductors 110 and 120 overlap each other, the first conductor 110 located under the second conductor 120 is visible. The above-described matter applies to other plan views.

Figure 3:
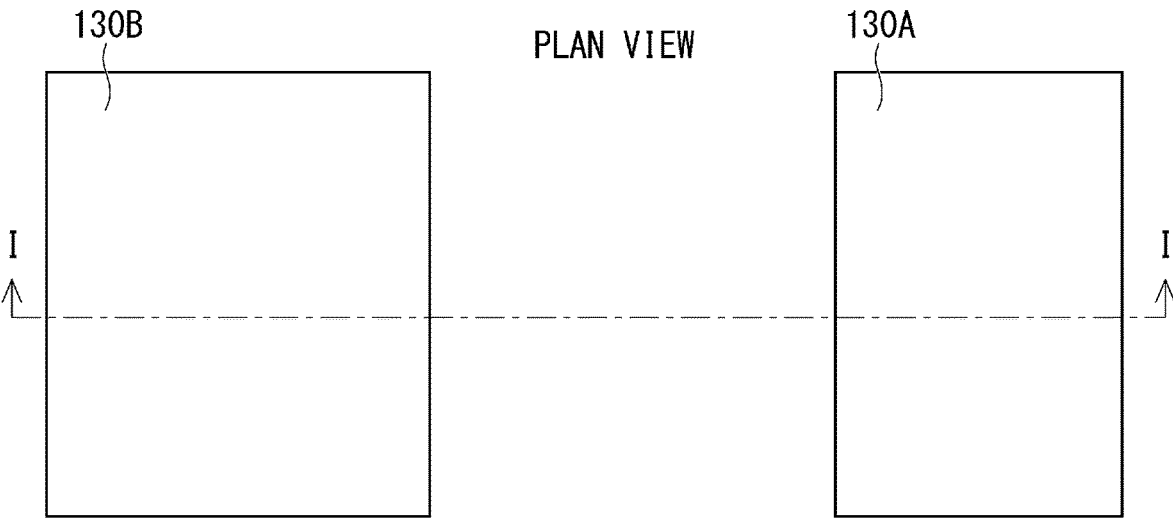
FIG. 3 is a diagram showing a step included in a method for manufacturing a quantum device according to the first comparative example.
Figure 3:
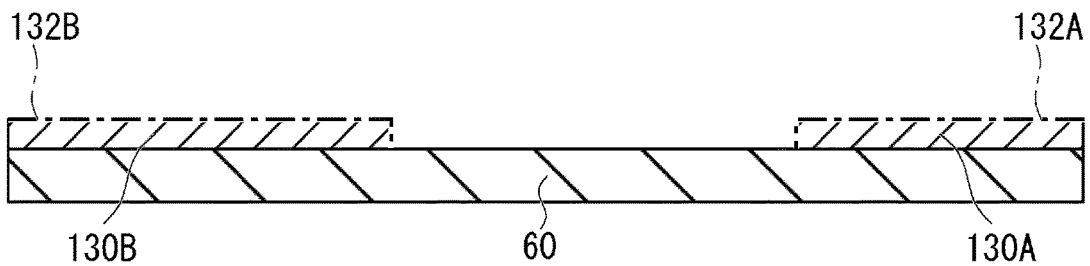

Firstly, as shown in FIG. 3, a substrate 60 is prepared and a conductor layer 130 is formed on the substrate 60 (a conductor layer deposition step). The deposition of the conductor layer 130 can be performed, for example, by sputtering. Alternatively, the deposition of the conductor layer 130 may be performed by evaporation or CVD (Chemical Vapor Deposition). Then, the formation of a circuit pattern in the conductor layer 130 can be performed, for example, by a combination of optical lithography and reactive ion etching. Note that an electron beam lithography method or the like may be used instead of using the optical lithography. Further, wet etching or the like may be used instead of using the reactive ion etching. Note that an oxide film 132 (a niobium oxide layer) is formed on a part of the surface of the conductor layer 130 (a part of the surface that is not in contact with the substrate 60).

Figure 4:
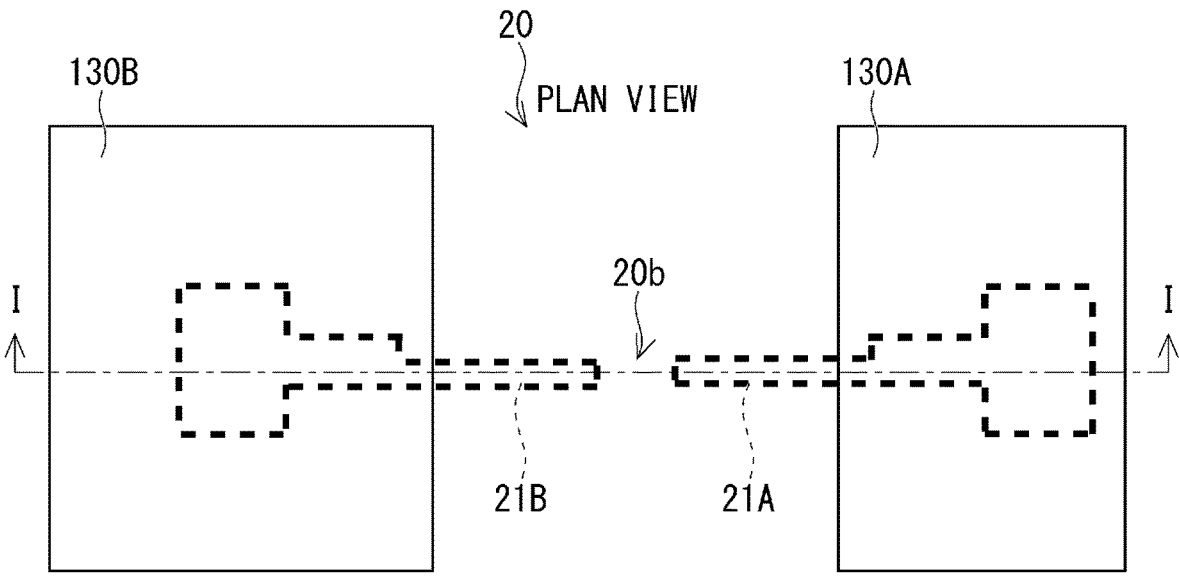
FIG. 4 is a diagram showing a step included in the method for manufacturing the quantum device according to the first comparative example.
Figure 4:
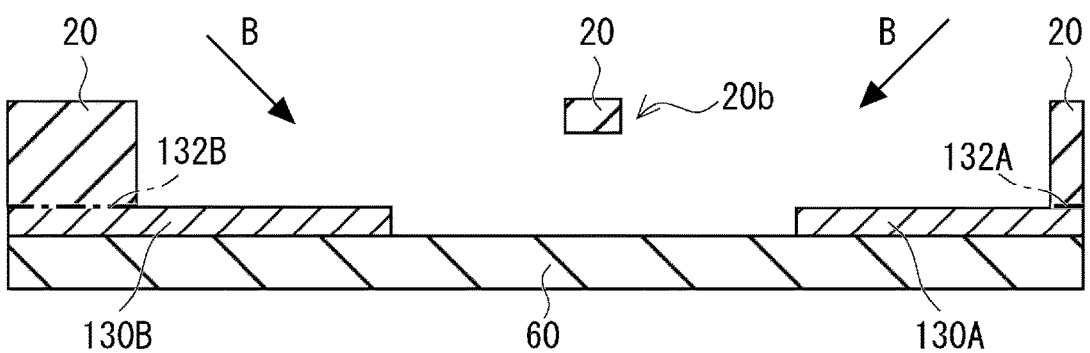

Next, as shown in FIG. 4, a resist mask 20 (a resist pattern) is formed (a resist mask formation step). In this process, the substrate 60 and the like are placed in a vacuum environment. That is, the substrate 60 and the like are placed and vacuum-sealed inside a vacuumed chamber. Further, the resist mask 20 is fixed and is not moved relative to the substrate 60 until the resist mask 20 is removed. Openings 21 (21A and 21B) are formed by the resist pattern of the resist mask 20. The openings 21 are indicated by thick dashed lines in the plan view. The areas surrounded by the thick dashed lines correspond to the openings 21 (the same applies to other plan views in which an opening(s) is shown). Note that the substrate 60 and the conductor layer 130, except for the areas corresponding to the openings 21, are covered by the resist mask 20 in the subsequent steps until the resist mask 20 is removed. Further, the resist mask 20 includes a resist bridge 20b. In this way, the openings 21 are separated into two openings 21A and 21B.

In this state, the oxide film 132 formed on the surface of the conductor layer 130 is removed (an oxide film removal step). The removal of the oxide film 132 is performed by, for example, ion milling or the like in which an ion beam is applied through the openings 21 as indicated by arrows B. The ion milling is performed, for example, by applying an argon ion beam. Note that the oxide film 132 on the surface of the conductor layer 130 is removed in order to form a connection (a superconducting contact) between the conductor layer 130 and the superconductors (the first and second conductors 110 and 120). Note that not the whole oxide film 132 formed on the part of the surface corresponding to the openings 21 has to be removed in the oxide film removal step. A part of the oxide film 132 formed on the part of the surface corresponding to the opening 21 may be left unremoved in the oxide film removal step as long as the connection between the conductor layer 130 and the superconductors are ensured. The above-described matter applies to other oxide film removal steps.

Figure 5:
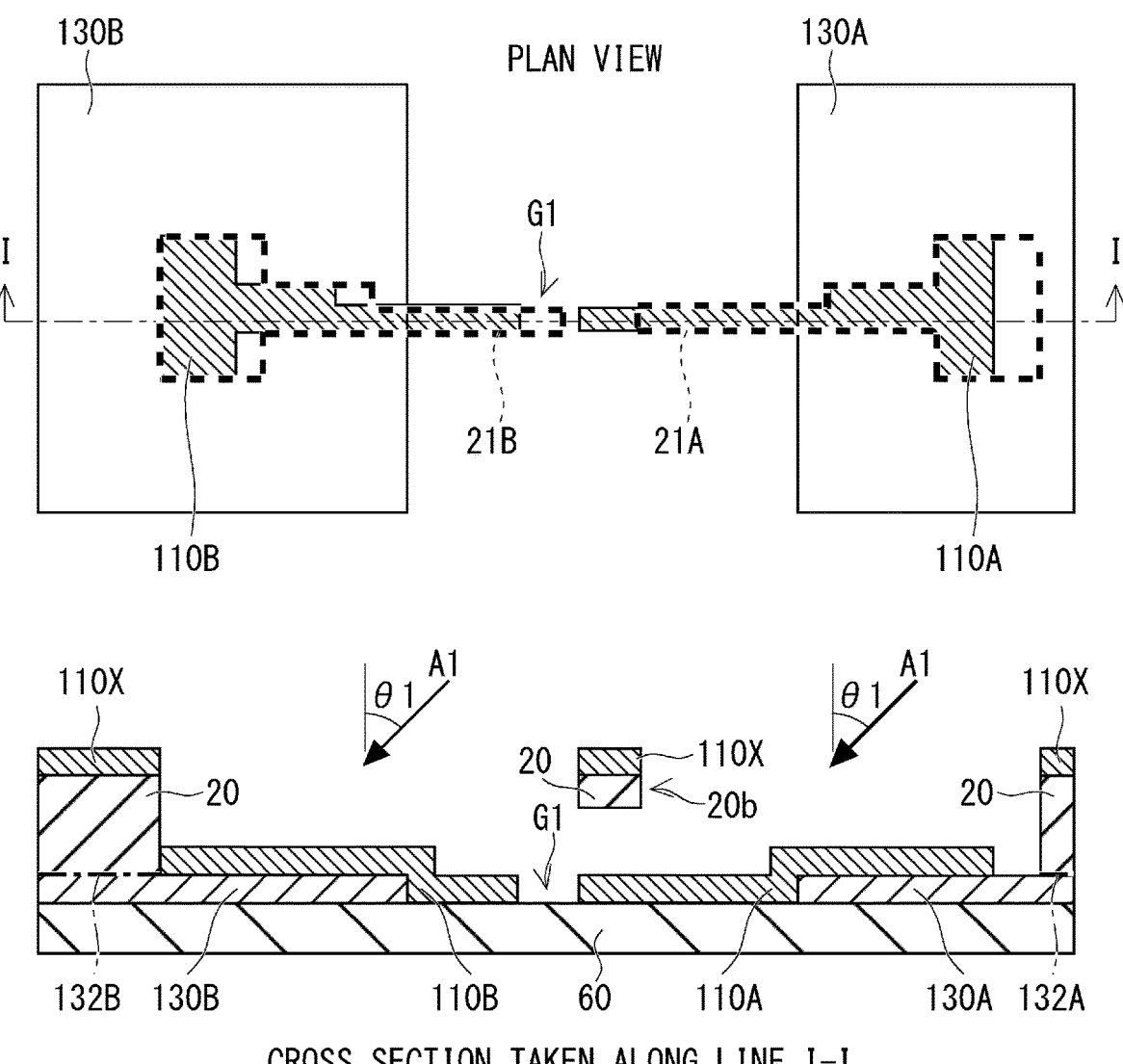
FIG. 5 is a diagram showing a step included in the method for manufacturing the quantum device according to the first comparative example.

Next, as shown in FIG. 5, first conductors 110 are evaporated by angled evaporation in a direction indicated by arrows A1 (a first evaporation processing step). The direction of the angled evaporation is, for example, a direction about 20 degrees inclined from the direction perpendicular to the surface of the substrate 60 to the first side 70A as viewed from the substrate 60 side. That is, when the angle from the direction perpendicular to the surface of the substrate 60 is represented by θ1, a superconducting material is evaporated roughly in the direction expressed as θ1=20 degrees. As shown in FIG. 5, in the first evaporation processing step, the superconducting material is ejected in the direction inclined from the direction perpendicular to the surface of the substrate 60 to the first side 70A by the angle θ1 as viewed from the substrate 60 side. Note that the adjustment of the direction of the angled evaporation may be performed by inclining the substrate 60 or by changing the direction of the nozzle from which the superconducting material is ejected.

In this way, the first conductor 110A is evaporated through the opening 21A. Further, the first conductor 110B is evaporated through the opening 21B. Further, a superconducting material 110X (Al) that has been evaporated together with the first conductors 110 is deposited on the resist mask 20. Note that there is a part on the substrate 60 where the film of the first conductor 110 is not formed because it is shielded by the resist bridge 20b. That is, a gap G1 by which the first conductors 110A and 110B are separated from each other is formed by the resist bridge 20b.

Figure 6:
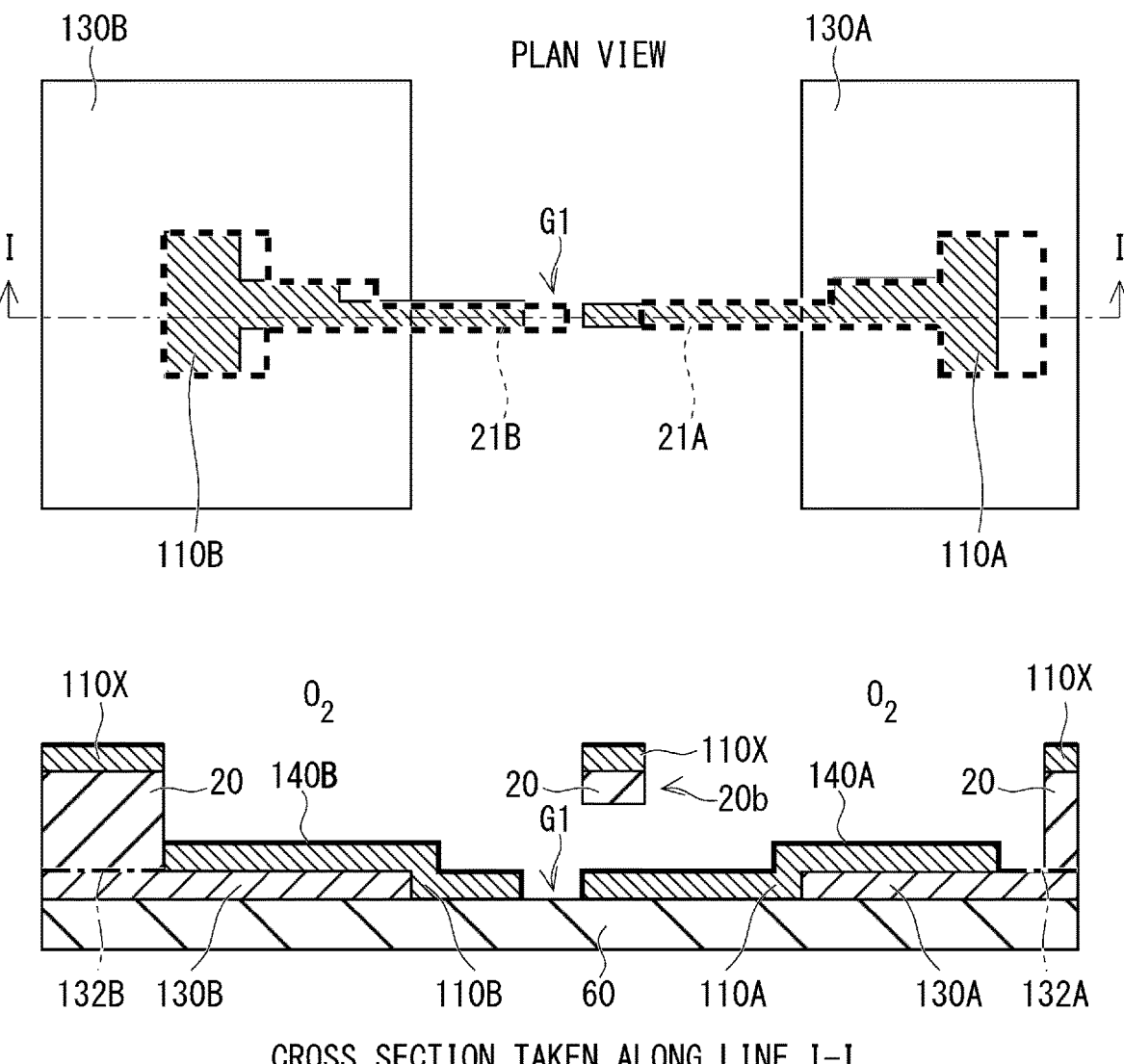
FIG. 6 is a diagram showing a step included in the method for manufacturing the quantum device according to the first comparative example.

Next, as shown in FIG. 6, the surfaces of the first conductors 110 are oxidized (an oxidation step). Specifically, the surfaces of the first conductors 110 are oxidized by filling an oxygen gas in the chamber in which the substrate 60 and the like are disposed. As a result, an oxide film 140A (AlOx) is formed on the surface of the first conductor 110A. Further, an oxide film 140B (AlOx) is formed on the surface of the first conductor 110B. Further, an oxide film 132A (NbOx) is formed in the part of the conductor layer 130 that is not covered by the first conductor 110A nor with the resist mask 20.

Figure 7:
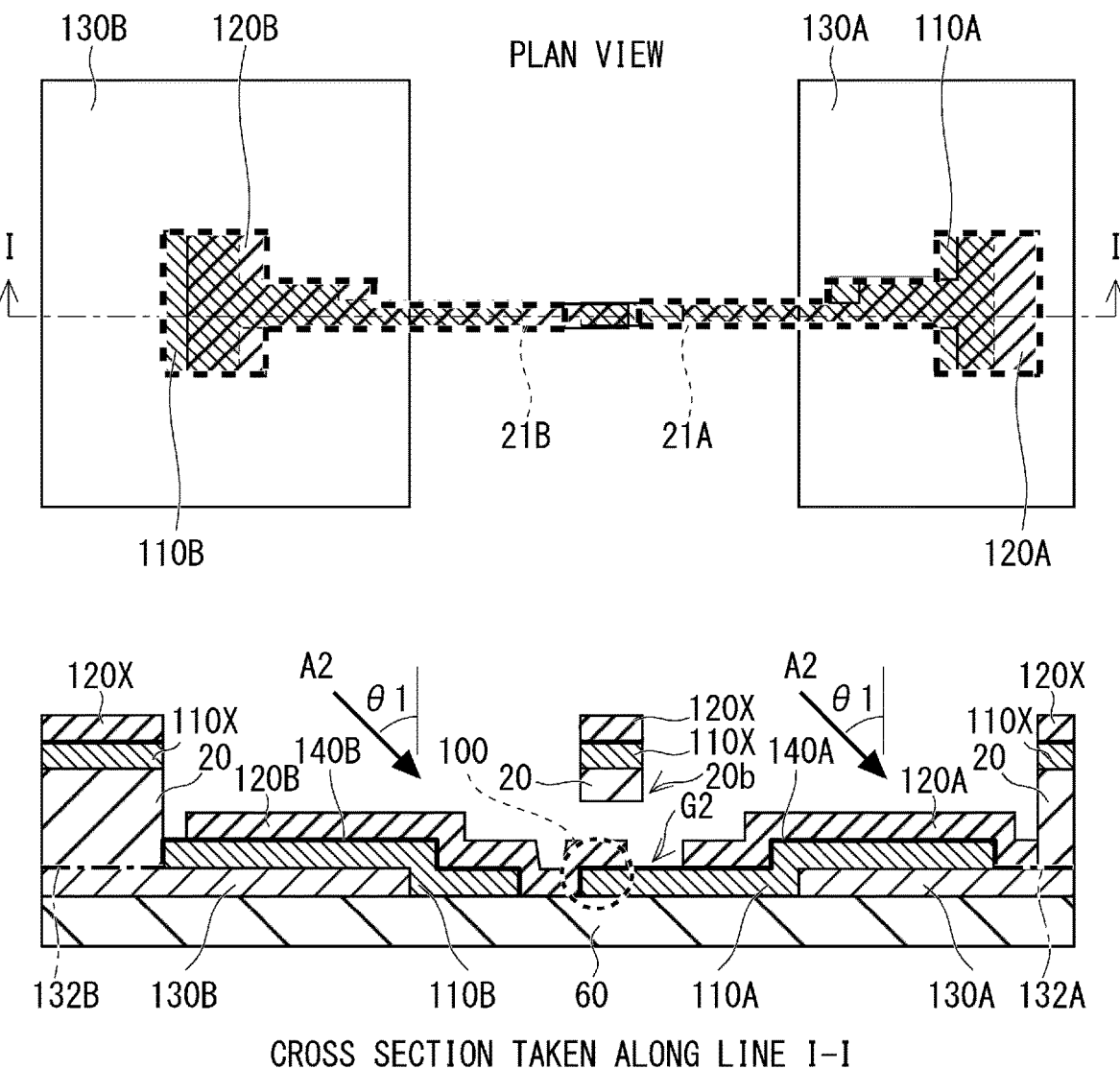
FIG. 7 is a diagram showing a step included in the method for manufacturing the quantum device according to the first comparative example.

Next, as shown in FIG. 7, second conductors 120 are evaporated by angled evaporation in a direction indicated by arrows A2 (a second evaporation processing step). In the second evaporation processing step, the superconducting material is ejected in the direction inclined from the direction perpendicular to the surface of the substrate 60 to the second side 70B by the angle θ1 as viewed from the substrate 60 side. In this process, the second conductor 120A is evaporated through the opening 21A. Further, the second conductor 120B is evaporated through the opening 21B. Further, a superconducting material 120X (Al) that has been evaporated together with the second conductors 120 is deposited on the resist mask 20. Note that there is a part on the first conductor 110 where the film of the second conductor 120 is not formed because it is shielded by the resist bridge 20b. That is, a gap G2 by which the second conductors 120A and 120B are separated from each other is formed on the first conductor 110A by the resist bridge 20b. Further, the Josephson junction 100 is formed in a part where the first conductor 110A and second conductor 120B overlap each other. Further, the area (i.e., the size) of the Josephson junction 100 is reduced by the gaps G1 and G2. Conversely, the direction of the angled evaporation (the angle from the direction perpendicular to the surface of the substrate 60) can be determined so that the Josephson junction 100 has an appropriate area (i.e., an appropriate size). The area (i.e., the size) of the Josephson junction 100 will be described later.

Figure 8:
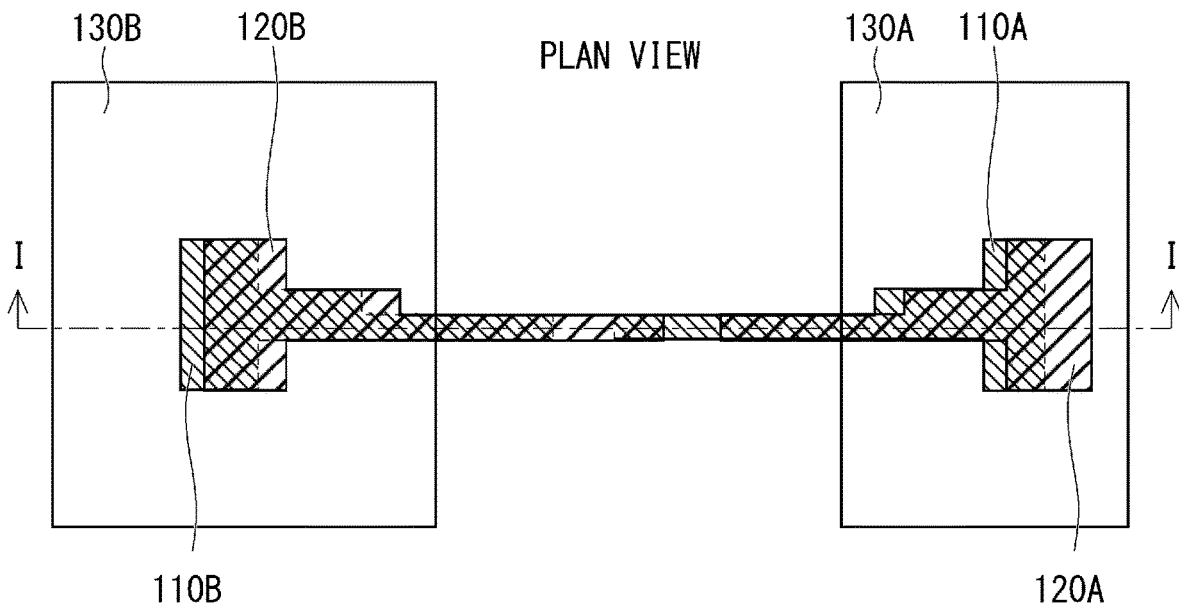
FIG. 8 is a diagram showing a step included in the method for manufacturing the quantum device according to the first comparative example.
Figure 8:
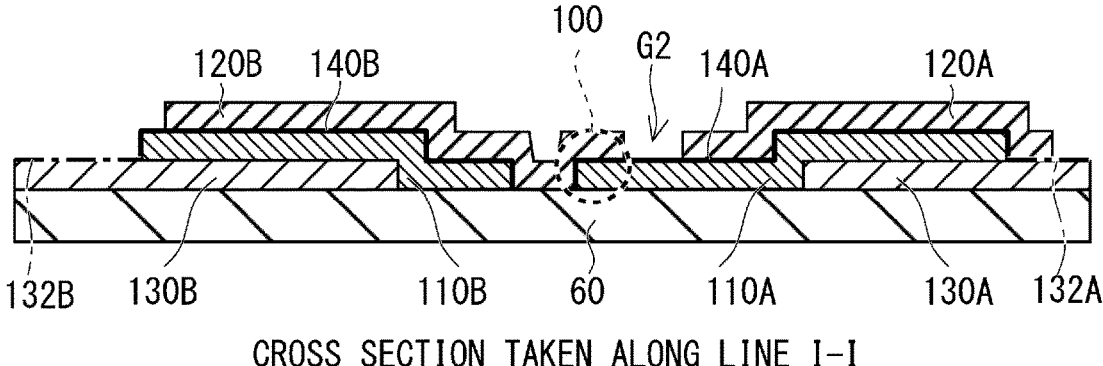

Next, as shown in FIG. 8, the resist mask 20 is removed (a lift-off step). As a result, the resist mask 20 and the excessive superconducting materials 110X and 120X deposited on the resist mask 20 are removed. Through the above-described processes, the quantum device 90 according to the first comparative example shown in FIG. 2 is manufactured. Note that the steps shown in FIGS. 4 to 7 are performed in the same vacuum-sealed state. The "same vacuum-sealed state" means that the substrate 60 and the like are vacuum-sealed in the chamber throughout the steps, and are not released into (e.g., exposed to) the atmospheric environment from the vacuum-sealed environment in which the pressure is lower than the atmospheric pressure. Note that, in the same vacuum-sealed state, argon or the like is vacuum-sealed in the chamber in the oxide film removal step (FIG. 4), and oxygen is vacuum-sealed in the chamber in the oxidation step (FIG. 6). However, in the other steps, the inside of the chamber is in the vacuum environment. Regarding the "same vacuum-sealed state", the above-described matter also applies to comparative examples and example embodiments described later.

The above-described spurious junction 80 will be described hereinafter with reference to FIG. 2. As described above, the Josephson junction 100 is formed of the first conductor part 110Aa of the first conductor 110A, the second conductor part 120Ba of the second conductor 120B, and the oxide film 140A interposed therebetween. Meanwhile, besides the Josephson junction 100, there is a part(s) where the oxide film 140 is formed between the first and second conductors 110 and 120. The spurious junction 80 is formed in this part(s). Specifically, a spurious junction 80A is formed by the first conductor 110A, the second conductor 120A, and the oxide film 140A. Further, a spurious junction 80B is formed by the first conductor 110B, the second conductor 120B, and the oxide film 140B. Note that the spurious junction 80 is formed so that its area (i.e., its size) becomes larger than that of the Josephson junction 100. This is because if the area (i.e., the size) of the spurious junction 80 is smaller than that of the Josephson junction 100, the spurious junction 80 will behave as the Josephson junction 100.

Note that the spurious junction 80 could cause the deterioration of the performance (the coherence) of the quantum device as explained below. That is, one of the decoherence factors for deteriorating the coherence of the quantum device (the superconducting qubit) is a two-level system (TLS: Two-Level System). The two-level system is a kind of a qubit that is naturally formed in an amorphous material or the like, and could couple with an intentionally-generated qubit and thereby adversely affect the operation of this qubit such as deteriorating the coherence of the qubit. Such two-level systems are widely present in dielectrics such as an oxide layer and an amorphous layer in the component. That is, two-level systems are also present in the oxide film 140 and in the oxide film 132.

Note that the spurious junction 80 is formed through the same processes as those for the Josephson junction 100 (FIGS. 5 to 7). Therefore, two-level systems are contained in the oxide film 140 of the spurious junction 80 at the same density as that of the tunnel barrier layer 102 (the oxide film 140A) of the Josephson junction 100. Note that since the area (i.e., the size) of the Josephson junction 100 is small as described above, the probability of the presence of two-level systems in the tunnel barrier layer 102 is low. In other words, the quantum device is designed so that the area of the Josephson junction 100 becomes as small as possible in order to reduce the probability of the presence of two-level systems.

On the other hand, since the area (i.e., the size) of the spurious junction 80 is larger than that of the Josephson junction 100 as described above, the probability of the presence of two-level systems in the oxide film 140 of the spurious junction 80 is high. As described above, the presence of the spurious junction 80 in the quantum device manufactured by the angled evaporation method could become the main cause of the decoherence. Specifically, the spurious junction 80 formed by the oxide film 140 behaves as a capacitor between the first and second conductors 110 and 120. Further, when an electric field that intersects this capacitor increases, electric dipoles of two-level systems in the oxide film 140 are coupled with the qubit, thus causing the decoherence (the loss). Therefore, it is desirable to prevent the spurious junction 80 from causing the decoherence.

Figure 9:
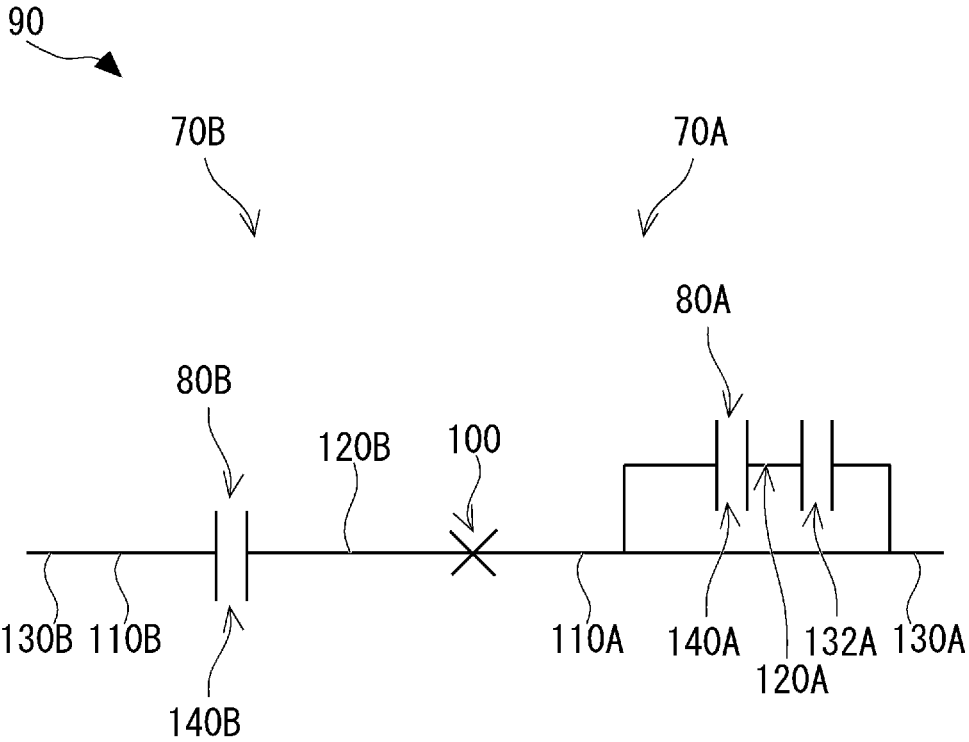
FIG. 9 schematically shows a circuit configuration of a quantum device according to the first comparative example.

FIG. 9 schematically shows a circuit configuration of the quantum device 90 according to the first comparative example. On the second side 70B, the only electrical path from the Josephson junction 100 to the conductor layer 130B is one that passes through the spurious junction 80B functioning as a capacitor. That is, the Josephson junction 100 is connected to the second conductor 120B; the second conductor 120B is connected to the first conductor 110B through the spurious junction 80B corresponding to the oxide film 140B; and the first conductor 110B is connected to the conductor layer 130B. Therefore, since the electric field generated in the spurious junction 80B increases, the spurious junction 80B contributes to the cause of the loss.

Meanwhile, on the first side 70A, as an electrical path from the Josephson junction 100 to the conductor layer 130A, there is a second path as well as the first path that passes through the spurious junction 80A functioning as a capacitor. That is, the first path is one through which the Josephson junction 100 is connected to the conductor layer 130A through the first conductor 110A, the spurious junction 80A (the oxide film 140A), the second conductor 120A, and the oxide film 132A. Note that the oxide film 132A is formed by the oxidation step (FIG. 6). Meanwhile, the second path is one through which the Josephson junction 100 is connected to the first conductor 110A, and the first conductor 110A is directly connected to the conductor layer 130A. That is, the conductors at both ends of the spurious junction 80A (i.e., the first conductor 110A and the conductor layer 130A) are short-circuited, so that the spurious junction 80A is electrically disabled. Therefore, since the electric field generated in the spurious junction 80A does not increase, the spurious junction 80A does not contribute to the cause of the loss.

Note that it is desired to disable the spurious junction 80B also on the second side 70B. Therefore, a method for short-circuiting the second conductor 120B and the conductor layer 130B will be examined as described hereinafter. Accordingly, in a second comparative example described hereinafter, a method for short-circuiting the second conductor 120B and the conductor layer 130B by using a connection conductor(s) will be examined.

Second Comparative Example

Figure 10:
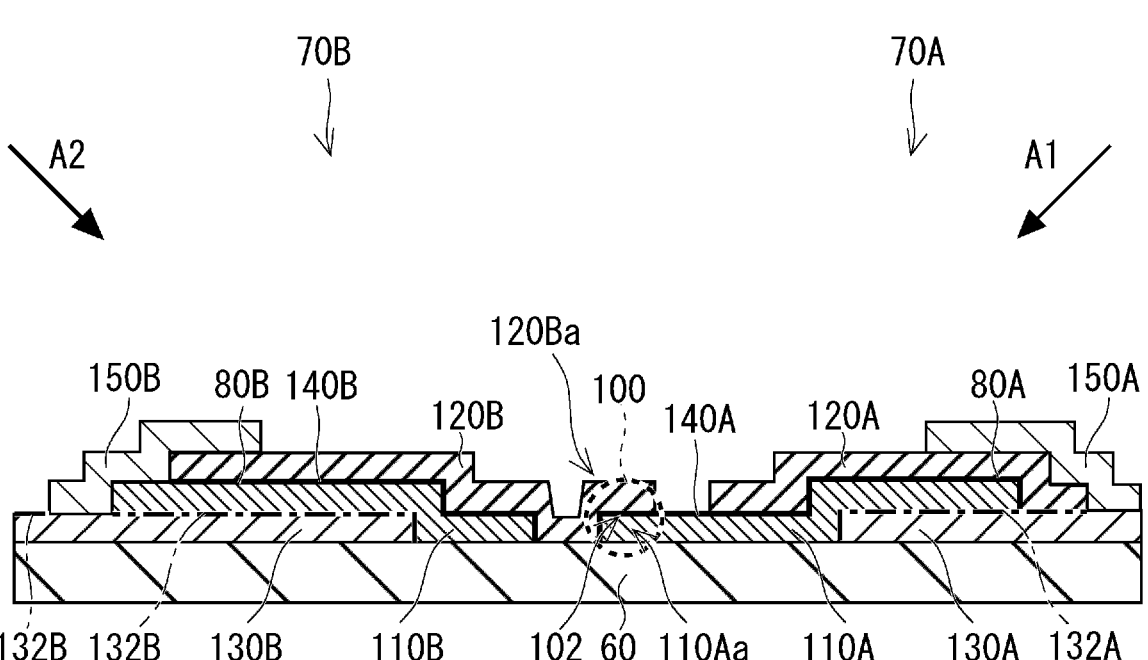
FIG. 10 shows a quantum device according to a second comparative example.

FIG. 10 shows a quantum device 90 according to the second comparative example. FIG. 10 is a cross-sectional diagram of the quantum device 90 according to the second comparative example. Similarly to the first comparative example, the quantum device 90 according to the second comparative example includes a substrate 60, a plurality of first conductors 110 (110A and 110B), a plurality of second conductors 120 (120A and 120B), and conductor layers 130 (130A and 130B) that constitute a superconducting circuit. The first conductors 110, the second conductors 120, and the conductor layers 130 are deposited on the substrate 60. The structure of the first conductors 110, the second conductors 120, and the conductor layers 130 are substantially the same as that in the first comparative example unless otherwise specified, and therefore descriptions thereof are omitted as appropriate.

Further, the quantum device 90 according to the second comparative example further includes connection conductors 150 (150A and 150B). The connection conductors 150 are formed of a superconducting material. In the following description, it is assumed that the connection conductors 150 are formed of aluminum (Al).

Further, oxide films 140 (140A and 140B) are formed between the first and second conductors 110 and 120. Further, a Josephson junction 100 is formed by a part of the first conductors 110 (110A) (a first conductor part 110Aa), a part of the second conductors 120 (120B) (a second conductor part 120Ba), and the oxide film 140 (140A). The structure of the Josephson junction 100 is substantially the same as that in the first comparative example, and therefore the description thereof is omitted as appropriate.

Further, on the first side 70A, the first conductor 110A is deposited on the substrate 60 and the conductor layer 130A. Further, the second conductor 120A is deposited on the first conductor 110A and the conductor layer 130A. Further, the connection conductor 150A is deposited on the conductor layer 130A and the second conductor 120A. Further, an oxide film 132A (NbOx) is formed on a part of the surface of the conductor layer 130A that is in contact with the first conductor 110A or the second conductor 120A, and on the exposed part of the surface thereof. Note that the oxide film 132A is not formed on a part of the surface of the conductor layer 130A that is in contact with the connection conductor 150A. Further, an oxide film 140A (AlOx) is formed on a part of the surface of the first conductor 110A that is not in contact with the substrate 60 nor with the conductor layer 130A (a part of the surface that is in contact with the second conductor 120A or 120B).

Meanwhile, on the second side 70B, the first conductor 110B is deposited on the substrate 60 and the conductor layer 130B. Further, the second conductor 120B is deposited on the substrate 60 and the first conductor 110B. Further, the connection conductor 150B is deposited on the conductor layer 130B, the first conductor 110B, and the second conductor 120B. Further, an oxide film 132B (NbOx) is formed on a part of the surface of the conductor layer 130B that is in contact with the first conductor 110B, and on the exposed part of the surface thereof. Further, an oxide film 140B (AlOx) is formed on a part of the surface of the first conductor 110B that is in contact with the second conductor 120B. Note that the oxide film 132B is not formed on a part of the surface of the conductor layer 130B that is in contact with the connection conductor 150B. Similarly, the oxide film 140B is not formed on a part of the surface of the first conductor 110B that is in contact with the connection conductor 150B.

Note that in the first comparative example, as shown in FIG. 4, the oxide film removal step (ion milling) for removing the oxide film 132 formed on the surface of the conductor layer 130 is performed before the evaporation process for the first conductors 110. In contrast, in the second comparative example, the oxide film removal step is not performed for the conductor layer 130 before the evaporation process for the first conductors 110. The reason for not performing the oxide film removal step is that if the oxide film removal step is performed before the evaporation process for the first conductors 110, a damaged layer may be formed on the surface of the substrate 60. This damaged layer could become a cause for causing a loss that deteriorates the coherence. Therefore, in the second comparative example, by forming the connection conductors 150, the connection (the superconducting contact) between the conductor layer 130 and the superconductors (the first and second conductors 110 and 120) is formed without performing the oxide film removal step before the evaporation process for the first conductors 110.

A method for manufacturing a quantum device 90 according to the second comparative example will be described while comparing it with the manufacturing method according to the first comparative example. Firstly, the conductor layer deposition step shown in FIG. 3 is performed, and then the resist mask formation step shown in FIG. 4 is performed. Note that as described above, at this point, the oxide film removal step is not performed. Then, each of the first evaporation processing step, the oxidation step, and the second evaporation processing step shown in FIGS. 5 to 7 is performed. Then, the oxide film removal step is performed in the state in which the resist mask for the connection conductors 150 is formed, and after that, the connection conductors 150 are evaporated. Note that in this oxide film removal step, the oxide film formed in the part where a film of the connection conductor 150 will be formed is removed. Meanwhile, since the substrate 60 is covered by the resist mask for the connection conductors 150, no damaged layer is formed on the surface of the substrate 60.

Figure 11:
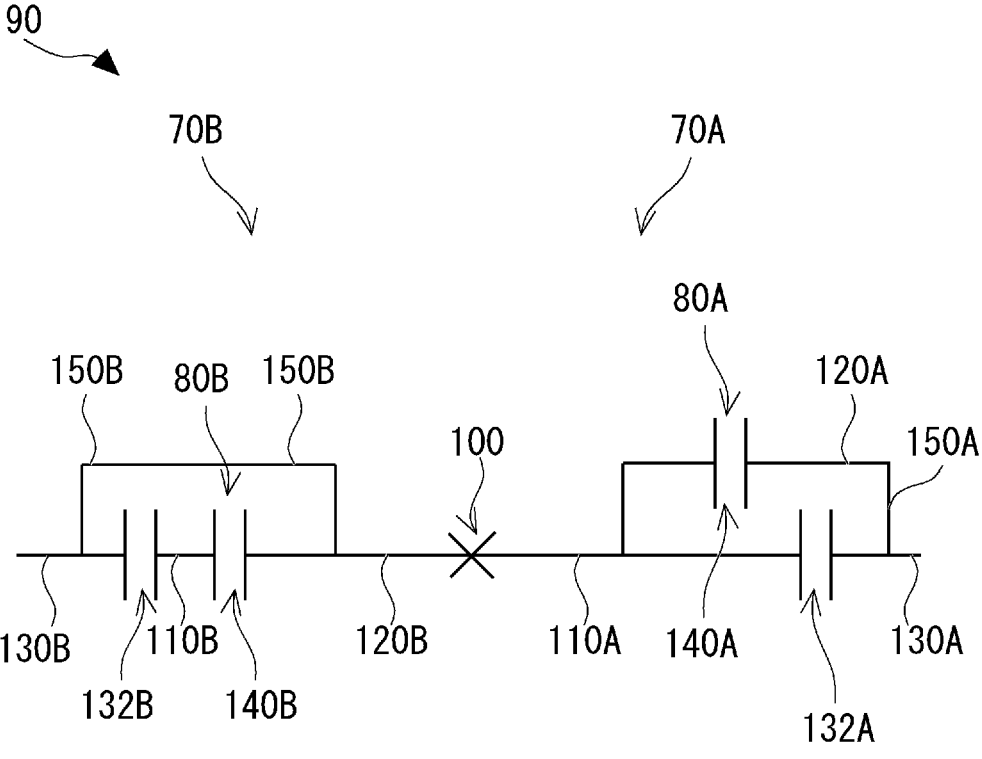
FIG. 11 schematically shows a circuit configuration of a quantum device according to the second comparative example.

FIG. 11 schematically shows a circuit configuration of the quantum device 90 according to the second comparative example. On the second side 70B, as an electrical path from the Josephson junction 100 to the conductor layer 130B, there is a second path as well as a first path that passes through the spurious junction 80B functioning as a capacitor. That is, the first path is one through which the Josephson junction 100 is connected to the conductor layer 130B through the second conductor 120B, the spurious junction 80B (the oxide film 140B), the first conductor 110B, and the oxide film 132B. Note that the oxide film 132B is formed by the oxidation step. Meanwhile, the second path is one through which the Josephson junction 100 is connected to the second conductor 120B, and the second conductor 120B is connected to the conductor layer 130B through the connection conductor 150B. That is, the conductors at both ends of the spurious junction 80B (the second conductor 120B and the conductor layer 130B) are short-circuited by the connection conductor 150B, so that the spurious junction 80B is electrically disabled. Therefore, since the electric field generated in the spurious junction 80B does not increase, the spurious junction 80B does not contribute to the cause of the loss.

Meanwhile, on the first side 70A, the only electrical path from the Josephson junction 100 to the conductor layer 130A is one that passes through the spurious junction 80A or the oxide film 132A, both of which function as capacitors. That is, the Josephson junction 100 is connected to the first conductor 110A, and the first conductor 110A is connected to the conductor layer 130A through the spurious junction 80A (the oxide film 140A), the second conductor 120A, and the connection conductor 150A. Alternatively, the first conductor 110A is connected to the conductor layer 130A through the oxide film 132A. Therefore, the conductors at both ends of the spurious junction 80 are not short-circuited and hence the electric field generated in the spurious junction 80A increases, so that the spurious junction 80A contributes to the cause of the loss.

Therefore, in the second comparative example, it is difficult to suppress the decoherence. In contrast to this, as described above, in the quantum device 1 according to this example embodiment, the first conductor 2 and the conductor layer 6, which constitute the Josephson junction 10, form a superconducting contact. Similarly, the second conductor 4 and the conductor layer 6, which constitutes the Josephson junction 10, form a superconducting contact. As a result, the quantum device 1 according to this example embodiment can suppress the deterioration of the performance thereof. That is, the quantum device 1 according to this example embodiment can suppress the decoherence.

Third Comparative Example

Figure 12:
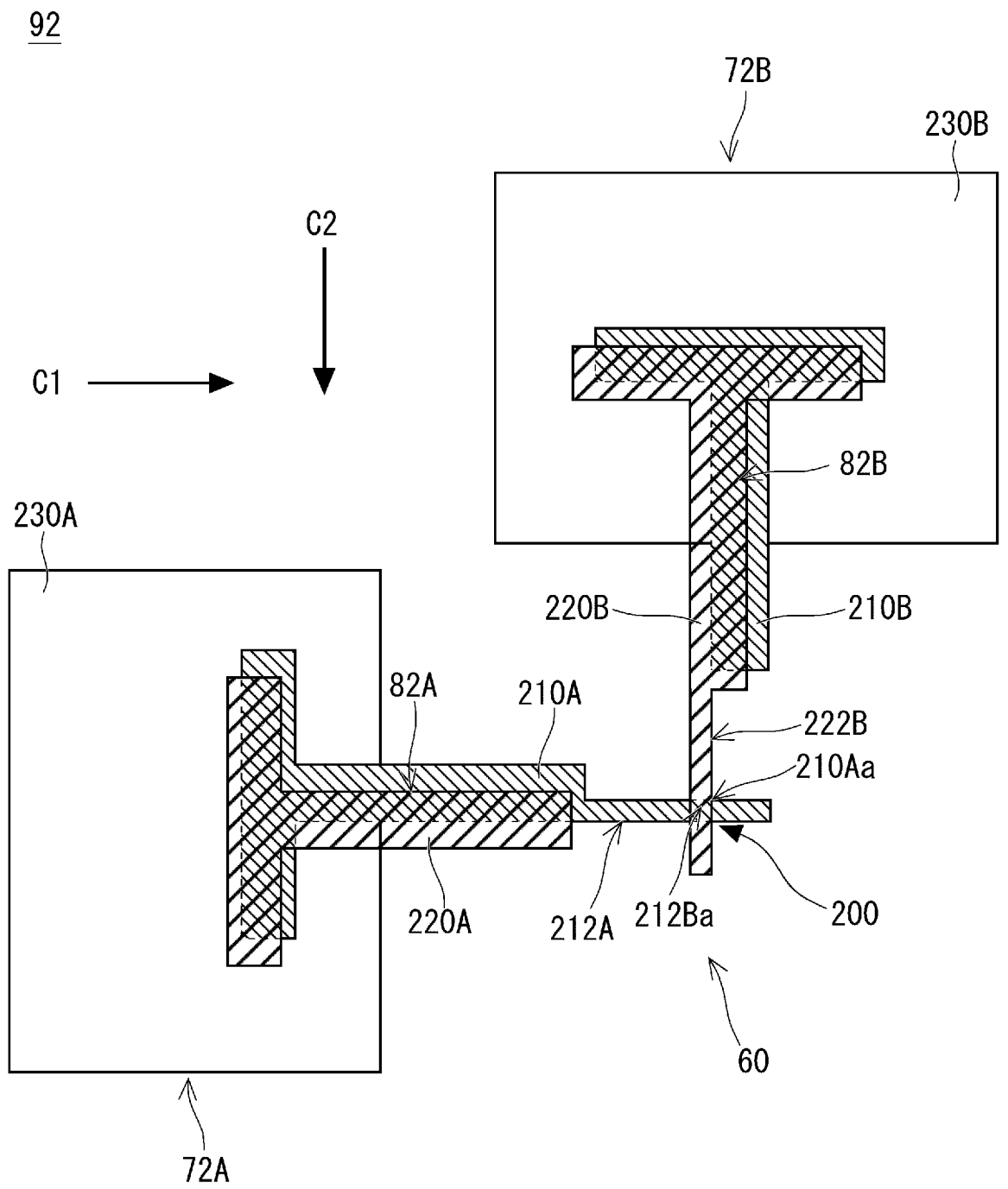
FIG. 12 shows a quantum device according to a third comparative example.

FIG. 12 shows a quantum device 92 according to a third comparative example. FIG. 12 is a plan view of the quantum device 92 according to the third comparative example. The quantum device 92 according to the third comparative example is one that is obtained by manufacturing a structure corresponding to that of the quantum device 90 according to the first comparative example by a different manufacturing method.

In the first and second comparative examples, as shown in FIG. 4 and the like, the quantum device 90 is manufactured by using the resist mask 20 having the resist bridge 20b. That is, in the first and second comparative examples, the Josephson junction 100 is formed by the resist bridge 20b. Therefore, the manufacturing methods according to the first and second comparative examples are referred to as a "bridge type". In contrast, in the third comparative example, a Josephson junction is formed by using a resist mask including no resist bridge as will be described later. Therefore, the manufacturing method according to the third comparative example is called a "bridge-less-type". Note that even in the third comparative example, the Josephson junction is formed by using only one resist mask.

The quantum device 92 according to the third comparative example includes first conductors 210 (210A and 210B), second conductors 220 (220A and 220B), and conductor layers 230 (230A and 230B) that constitute a superconducting circuit. The first conductors 210, the second conductors 220, and the conductor layers 230 are deposited on a substrate 60.

The first conductors 210 are deposited on the conductor layer 230. The second conductors 220 are deposited on the first conductors 210. The first conductors 210, the second conductors 220, and the conductor layers 230 are formed of superconducting materials. In the following description, it is assumed that the first conductors 210 and the second conductors 220 are formed of aluminum (Al). Further, in the following description, it is assumed that the conductor layers 230 (third conductors) are formed of niobium (Nb).

Further, similarly to the first comparative example, an oxide film (AlOx) is formed between the first and second conductors 210 and 220. The oxide film can be formed, for example, by performing an oxidation process on surfaces of the first conductors 210 before the second conductors 220 are deposited on the first conductors 210. Further, similarly to the first comparative example, a Josephson junction 200 is formed of a part of the first conductors 210 (210A) (a first conductor part 210Aa), a part of the second conductors 220 (220B) (a second conductor part 220Ba), and the oxide film. That is, the Josephson junction 200 is formed by the first conductor part 210Aa, the second conductor part 220Ba deposited on the first conductor part 210Aa, and the oxide film interposed between the first and second conductor parts 210Aa and 220Ba.

As shown in FIG. 12, the quantum device 92 according to the third comparative example is formed roughly in an inverted L-shape centered at the Josephson junction 200 in a plan view. Further, the Josephson junction 200 and the area in the vicinity thereof are formed in a cross shape as the first and second conductors 210 (210A) and 220 (220B) cross each other in the plan view. Further, a narrow part 212A extending in a narrow and long shape is formed in the vicinity of the Josephson junction 200 of the first conductor 210A. Further, a narrow part 222B extending in a narrow and long shape is formed in the vicinity of the Josephson junction 200 of the second conductor 220B. Further, the Josephson junction 200 is formed as the narrow parts 212A and 222B cross each other. Note that no narrow part is formed in the first conductor 210B. Further, no narrow part is formed in the second conductor 220A.

Note that the side on which the first conductor 210A constituting the Josephson junction 200 is formed so as to extend, with respect to the Josephson junction 200, toward the conductor layer 230A (i.e., the lower-left side in FIG. 12) is referred to as a first side 72A. That is, the first side 72A corresponds to the left side of the Josephson junction 200 in FIG. 12. Further, the side on which the second conductor 220B constituting the Josephson junction 200 is formed so as to extend, with respect to the Josephson junction 200, toward the conductor layer 230B (i.e., the upper-right side in FIG. 12) is referred to as a second side 72B. That is, the second side 72B corresponds to the upper side of the Josephson junction 200 in FIG. 12. Note that, as will be described later, the first conductors 210 are evaporated by performing angled evaporation in a first direction (indicated by an arrow C1), which is a direction inclined from the direction perpendicular to the surface of the substrate 60 (i.e., the direction from the front side of the paper toward the rear side thereof), toward the first side 72A. Further, the second conductors 220 are evaporated by performing angled evaporation in a second direction (indicated by an arrow C2), which is a direction inclined from the direction perpendicular to the surface of the substrate 60 (i.e., the direction from the front side of the paper toward the rear side thereof), toward the second side 72B.

On the first side 72A, the first conductor 210A is deposited on the substrate 60 and the conductor layer 230A.

Further, the second conductor 220A is deposited on the first conductor 210A and the conductor layer 230A. Further, an oxide film (NbOx) is formed on a part of the surface of the conductor layer 230A that is not in contact with the substrate 60 nor with the first conductor 210A. Further, an oxide film (AlOx) is formed on a part of the surface of the first conductor 210A that is not in contact with the substrate 60 nor with the conductor layer 230A. That is, the oxide film is formed on a part of the surface of the first conductor 210A that is in contact with second conductor 220A or 220B.

Meanwhile, on the second side 72B, the first conductor 210B is deposited on the substrate 60 and the conductor layer 230B. Further, the second conductor 220B is deposited on the substrate 60 and the first conductor 210B. Note that a second conductor part 220Ba, which is a part of the narrow part 222B of the second conductor 220B, is deposited on a first conductor part 210Aa, which is a part of the narrow part 212A of the first conductor 210A, with the oxide film interposed therebetween. The Josephson junction 200 is formed by depositing the second conductor part 220Ba on the first conductor part 210Aa with the oxide film (a tunnel barrier layer) interposed therebetween. Further, an oxide film (NbOx) is formed on a part of the surface of the conductor layer 230B that is not in contact with the substrate 60 nor with the first conductor 210B. Further, an oxide film (AlOx) is formed on a part of the surface of the first conductor 210B that is not in contact with the substrate 60 nor with the conductor layer 230B. That is, the oxide film (AlOx) is formed on a part of the surface of the first conductor 210B that is in contact with the second conductor 220B.

An outline of a method for fabricating a Josephson junction 200 according to the third comparative example will be described hereinafter. The Josephson junction 200 is formed by using a bridge-less-type angled evaporation method. In this method, a resist mask conforming to the shapes of the first and second conductors 210 and 220 is provided on the substrate 60 in advance (a resist mask formation step). In this state, an oxide film formed on the surface of the conductor layer 230 is removed (an oxide film removal step). Then, thin films made of a superconducting material (i.e., the first and second conductors 210 and 220) are formed by performing evaporation twice while changing the direction of the evaporation with respect to the substrate 60 between the first evaporation and the second evaporation. That is, the first conductors 210 is evaporated by the first evaporation process (a first evaporation processing step), and the second conductors 220 is evaporated by the second evaporation process (a second evaporation processing step). The surfaces of the first conductors 210 are oxidized after the first evaporation process (an oxidation step). The oxide film formed by this process functions as a tunnel barrier layer of the Josephson junction 200.

Further, as will be described later, since the same resist mask is used in the two evaporation processes, on the conductor layer 230, superconductors having shapes corresponding to each other (i.e., the first and second conductors 210 and 220) are formed on top of one another and their positions are slightly shifted from each other. In this overlapping region, while the Josephson junction 200 is intentionally formed, a spurious junction 82 is unintentionally formed. That is, on the first side 72A, a spurious junction 82A is formed at a place where the first and second conductors 210A and 220A are connected to each other with the oxide film interposed therebetween. Further, on the second side 72B, a spurious junction 82B is formed at a place where the first and second conductors 210B and 220B are connected to each other with the oxide film interposed therebetween.

Figure 13:
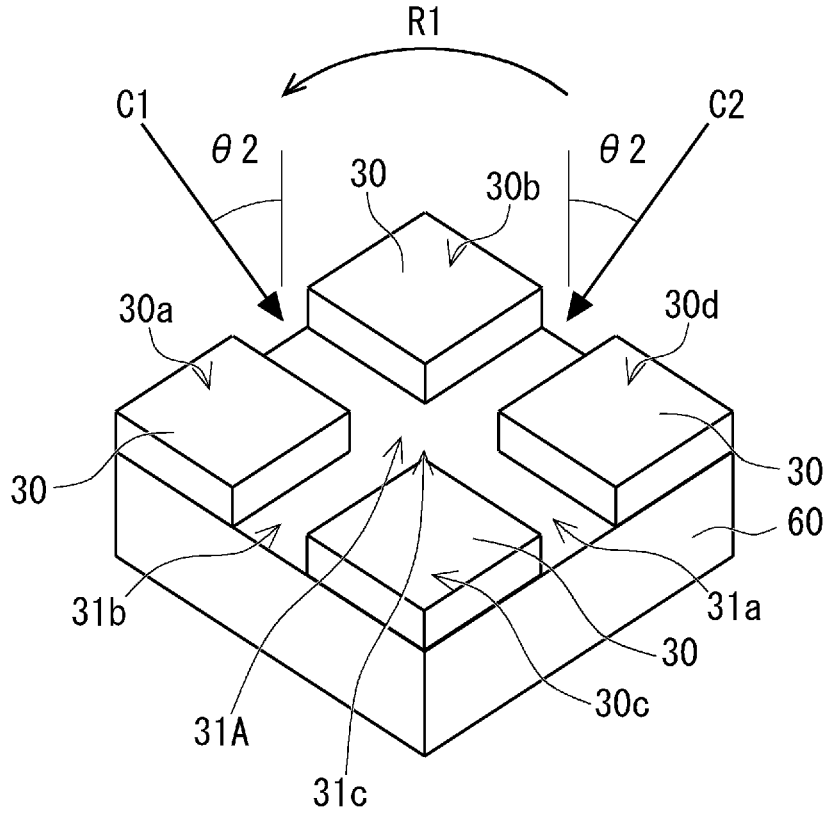
FIG. 13 is a diagram for explaining a method for manufacturing a quantum device according to the third comparative example.
Figure 14:
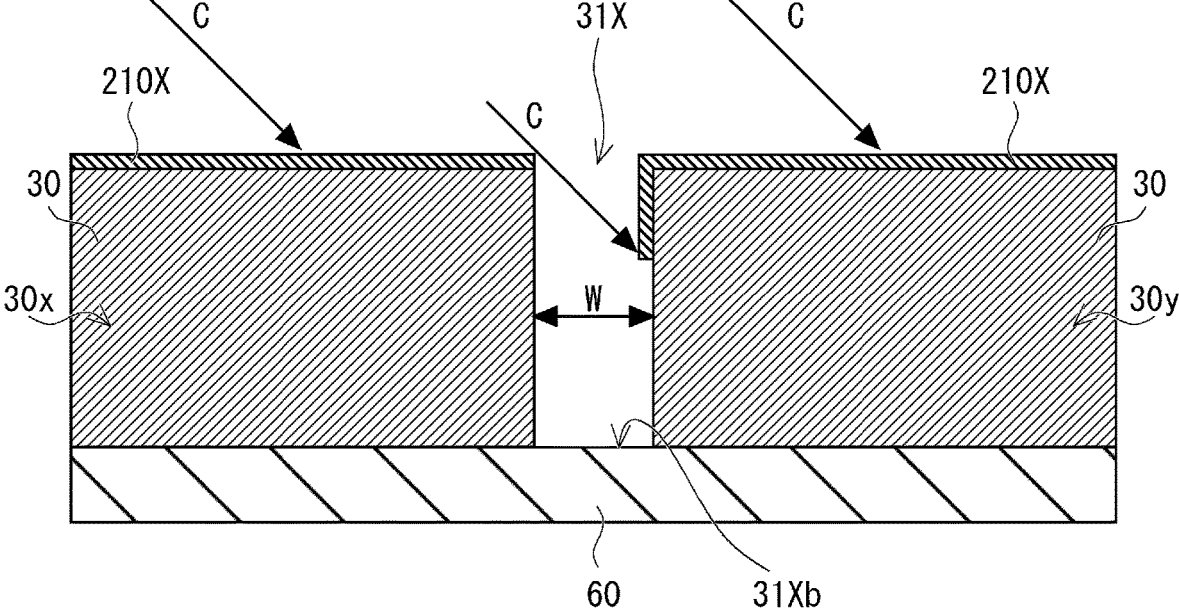
FIG. 14 is a diagram for explaining the method for manufacturing the quantum device according to the third comparative example.
Figure 15:
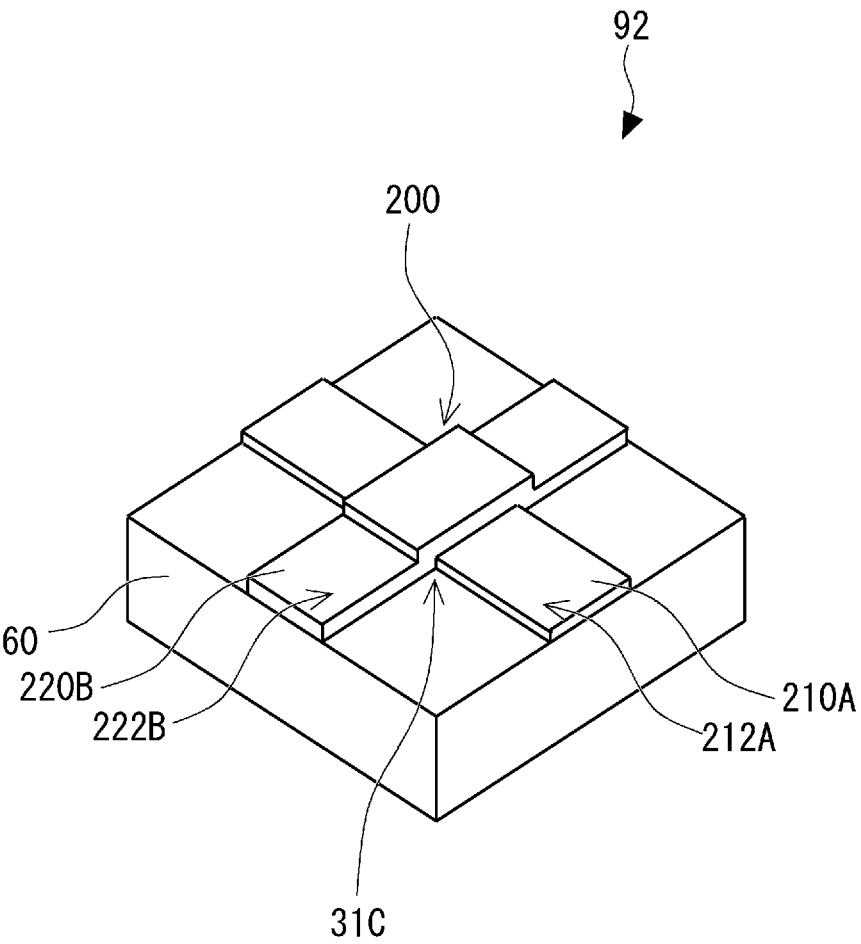
FIG. 15 is a diagram for explaining the method for manufacturing the quantum device according to the third comparative example.

FIGS. 13 to 15 are diagrams for explaining a method for manufacturing a quantum device 92 according to the third comparative example. An outline of the method for fabricating a Josephson junction 200 according to the third comparative example will be described with reference to FIGS. 13 to 15. The Josephson junction 200 is generated by using a bridge-less-type angled evaporation method. Firstly, as shown in FIG. 13, a resist mask 30 conforming to the shapes of the first and second conductors 210 and 220 are provided on the substrate 60 in advance (a resist mask formation step). The resist mask 30 includes resist mask parts 30a, 30b, 30c and 30d so that a cross-shaped opening 31A is formed around the place where the Josephson junction 200 will be formed.

The substrate 60, in which the resist mask 30 is disposed, is placed and vacuum-sealed in a chamber, and thereby placed under a vacuum environment. Then, after an oxide film formed on the surface of the conductor layer 230 is removed, first conductors 210 are evaporated by angled evaporation in a direction indicated by an arrow C1 in FIG. 13 (a first evaporation processing step). The direction of the angled evaporation is, for example, a direction about 45 degrees inclined from the direction perpendicular to the surface of the substrate 60 to the direction parallel to the longitudinal direction of an opening part 31a (which will be described later) as viewed from the substrate 60 side. That is, when the angle from the vertical direction is represented by θ2, a superconducting material is evaporated roughly in a direction expressed as θ2=45 degrees. Note that the opening part 31a includes a part between a resist mask part 30a and a resist mask part 30b, a part between a resist mask part 30c and a resist mask part 30d, and a central part 31c between these parts (i.e., the intersection of these parts). In the example shown in FIG. 13, in the first evaporation processing step, the superconducting material is evaporated in the direction inclined from the vertical direction toward the resist mask parts 30a and 30b located in the direction parallel to the longitudinal direction of the opening part 31a by the angle θ2 as viewed from the substrate 60 side. Note that the adjustment of the direction of the angled evaporation may be performed by rotating the substrate 60 or by changing the direction of the nozzle from which the superconducting material is ejected.

Note that in the first evaporation processing step, the first conductor 210 is evaporated, of the cross-shaped opening 31A, on the bottom (i.e., the surface of the substrate 60) of the opening part 31a extending in the direction indicated by the arrow C1. That is, as described with reference to FIG. 14, in the first evaporation processing step, the superconducting material does not reach the bottom part between the resist mask parts 30a and 30c because the superconducting material is blocked by the resist mask part 30a. Similarly, in the first evaporation processing step, the superconducting material does not reach the bottom part between the resist mask parts 30b and 30d because the superconducting material is blocked by the resist mask part 30b.

Next, the surfaces of the first conductors 210 are oxidized in a manner similar to that shown in FIG. 6 (an oxidation step). Specifically, the surfaces of the first conductors 210 are oxidized by filling an oxygen gas in the chamber in which the substrate 60 and the like are disposed. As a result, an oxide film (AlOx) is formed on the surface of the first conductor 210A. Further, an oxide film (AlOx) is formed on the surface of the first conductor 210B. Further, although not shown in FIG. 13, an oxide film (NbOx) is formed in the part of the conductor layer 230 that is not covered by the first conductors 210 nor with the resist mask 30.

Next, second conductors 220 are evaporated by angled evaporation in a direction indicated by an arrow C2 in FIG. 13 (a second evaporation processing step). The direction of the angled evaporation is, for example, a direction about 45 degrees inclined from the direction perpendicular to the surface of the substrate 60 to the direction parallel to the longitudinal direction of an opening part 31b (which will be described later) as viewed from the substrate 60 side. That is, when the angle from the vertical direction is represented by θ2, a superconducting material is evaporated roughly in a direction expressed as θ2=45 degrees. Note that the opening part 31b includes a part between the resist mask parts 30a and 30b, a part between the resist mask parts 30c and 30d, and a central part 31c between these parts (i.e., the intersection of these parts). In the example shown in FIG. 13, in the second evaporation processing step, the superconducting material is evaporated in the direction inclined from the vertical direction toward the resist mask parts 30b and 30d located in the direction parallel to the longitudinal direction of the opening part 31b by the angle θ2 as viewed from the substrate 60 side. The changing of the direction of the angled evaporation from the direction C1 to the direction C2 may be performed, for example, by rotating the substrate 60 by 90 degrees in a direction indicated by an arrow R1 after the first evaporation processing step.

Note that in the second evaporation processing step, the second conductor 220 are evaporated, of the cross-shaped opening 31A, on the bottom of the opening part 31b extending in the direction indicated by the arrow C2. That is, as described with reference to FIG. 14, in the second evaporation processing step, the superconducting material does not reach the bottom part between the resist mask parts 30a and 30b because the superconducting material is blocked by the resist mask part 30b. Similarly, in the second evaporation processing step, the superconducting material does not reach the bottom part between the resist mask parts 30c and 30d because the superconducting material is blocked by the resist mask part 30d. Note that since the first conductors 210 have been deposited in the central part 31c, the second conductors 220 are deposited on the first conductors 210. Then, as shown in FIG. 15, the resist mask 30 is removed (a lift-off step).

As shown in FIG. 14, in the resist mask 30, a space between a resist mask part 30x and a resist mask part 30y is referred to as an opening 31X. In this case, when the width W of the opening 31X in a direction corresponding to the direction of the evaporation (indicated by an arrow C) is small, a bottom part 31Xb of the opening 31X is shadowed by the resist mask part 30x. In other words, the bottom part 31Xb is shielded by the resist mask part 30x. Therefore, a superconducting material 210X ejected in the direction indicated by the arrow C is deposited (i.e., deposited) only on the upper surface of the resist mask 30 and a part of the wall surface of the resist mask part 30y located inside the opening 31X, but is not deposited (i.e., is not deposited) on the bottom part 31Xb.

Therefore, as shown in FIG. 15, the first conductor 210A and the second conductor 220B are formed in a cross-shaped structure. Then, the Josephson junction 200 is formed at the part where the first conductor 210A and the second conductor 220 overlap each other in the central part 31c. Further, a narrow part 212A (the first conductor 210A) and a narrow part 222B (the second conductor 220B), which constitute the Josephson junction 200, are formed at the narrow parts of the opening 31 of the resist mask 30.

Note that the circuit configuration of the quantum device 92 according to the third comparative example is substantially the same as that shown in FIG. 9. That is, on the first side 72A, as an electrical path from the Josephson junction 200 to the conductor layer 230A, there is a second path as well as a first path that passes through the spurious junction 82A functioning as a capacitor. That is, the first path is one through which the Josephson junction 200 is connected to the conductor layer 230A through the first conductor 210A, the spurious junction 82A, the second conductor 220A, and the oxide film formed on the conductor layer 230A. Meanwhile, the second path is one through which the Josephson junction 200 is connected to the first conductor 210A, and the first conductor 210A and the conductor layer 230A are directly connected to each other. That is, the conductors at both ends of the spurious junction 82A are short-circuited, so that the spurious junction 82A is electrically disabled. Therefore, since the electric field generated in the spurious junction 82A does not increase, the spurious junction 82A does not contribute to the cause of the loss.

Meanwhile, on the second side 72B, the only electrical path from the Josephson junction 200 to the conductor layer 230B is one that passes through the spurious junction 82B functioning as a capacitor. That is, the Josephson junction 200 is connected to the second conductor 220B, the second conductor 220B is connected to the first conductor 210B through the spurious junction 82B corresponding to the oxide film. Further, the first conductor 210B is connected to the conductor layer 230B. Therefore, since the electric field generated in the spurious junction 82B increases, the spurious junction 82B contributes to the cause of the loss.

Therefore, in the third comparative example, it is difficult to suppress the decoherence. In contrast to this, as described above, in the quantum device 1 according to this example embodiment, the first conductor 2 and the conductor layer 6, which constitute the Josephson junction 10, form a superconducting contact. Similarly, the second conductor 4 and the conductor layer 6, which constitutes the Josephson junction 10, form a superconducting contact. As a result, the quantum device 1 according to this example embodiment can suppress the deterioration of the performance thereof. That is, the quantum device 1 according to this example embodiment can suppress the decoherence.

First Example Embodiment

An example embodiment will be described hereinafter with reference to the drawings. The following descriptions and drawings are partially omitted and simplified as appropriate to clarify the explanation. Further, the same reference numerals (or symbols) are assigned to the same components/structure, and redundant descriptions thereof are omitted as appropriate.

Figure 16:
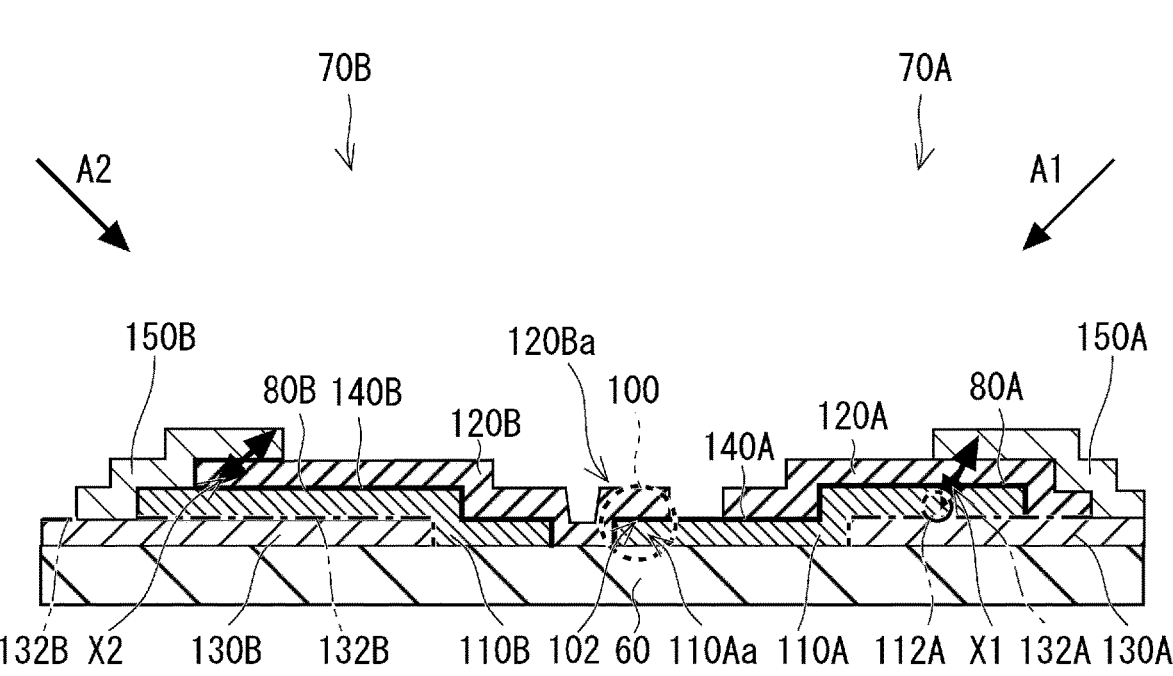
FIG. 16 shows a quantum device according to a first example embodiment.

FIG. 16 shows a quantum device 50 according to a first example embodiment. FIG. 16 is a cross-sectional diagram of the quantum device 50 according to the first example embodiment. Similarly to the second comparative example, the quantum device 50 according to the first example embodiment includes a substrate 60, a plurality of first conductors 110 (110A and 110B), a plurality of second conductors 120 (120A and 120B), and conductor layers 130 (130A and 130B) that constitutes a superconducting circuit. The structure of the first conductors 110, the second conductors 120, and the conductor layers 130 are substantially the same as those in the second comparative example unless otherwise specified, and therefore descriptions thereof are omitted as appropriate.

The first conductors 110 correspond to the first conductors 2 shown in FIG. 1. The first conductors 110 are deposited on the conductor layers 130. Note that the conductor layers 130 correspond to the conductor layers 6 shown in FIG. 1. Further, the second conductors 120 correspond to the second conductors 4 shown in FIG. 1. The second conductors 120 are deposited on the first conductors 110. The first conductors 110, the second conductors 120, and the conductor layers 130 are formed of superconducting materials as will be described later (the same applies to other example embodiments described later). For example, the first and second conductors 110 and 120 are formed of aluminum (Al). Further, for example, the conductor layers 130 (third conductors) are formed of niobium (Nb). However, the first and second conductors 110 and 120 do not necessarily have to be formed of aluminum (Al). Further, the conductor layers 130 do not necessarily have to be formed of niobium (Nb).

Further, the quantum device 50 according to the first example embodiment includes connection conductors 150 (150A and 150B). The connection conductors 150 are formed of at least one of superconducting materials listed later (the same applies to other example embodiments described later). For example, the connection conductors 150 are formed of a superconducting material such as aluminum (Al). Further, oxide films 140 (140A and 140B) are formed between the first and second conductors 110 and 120 by oxidizing the surfaces of the first conductors 110. The oxide films 140 correspond to the oxide film 8 shown in FIG. 1. Further, a Josephson junction 100 is formed by a part of the first conductors 110 (110A) (a first conductor part 110Aa), a part of the second conductors 120 (120B) (a second conductor part 120Ba), and the oxide film 140 (140A). The Josephson junction 100 corresponds to the Josephson junction 10 shown in FIG. 1. The structure of the Josephson junction 100 is substantially the same as those in the first and second comparative examples, and therefore the description thereof is omitted as appropriate.

Note that although a silicon substrate is used for the substrate 60 in this example embodiment, the material of the substrate is not limited to this example. For example, a sapphire substrate, a glass substrate, or the like may be used for the substrate 60. Further, examples of superconducting materials include niobium, niobium nitride, aluminum, indium, lead, tin, rhenium, titanium, titanium nitride, tantalum, and alloys containing any of these. Note that not the whole conductor layers 130 necessarily have to be made of a superconducting material, and a normal conducting material may be used for at least a part of the conductor layers 130. Examples of normal conducting materials include copper, silver, gold, platinum, and alloys containing any of these. Note that in order to achieve a superconducting state, the quantum device 50 is used in an environment having a temperature of, for example, 10 mK (millikelvin) which is realized by a refrigerator. The above-described matters also apply to other example embodiments.

Further, similarly to the second comparative example, the first conductor 110A is deposited on the substrate 60 and the conductor layer 130A on the first side 70A. Further, the second conductor 120A is deposited on the first conductor 110A and the conductor layer 130A. Further, the connection conductor 150A is deposited on the conductor layer 130A and the second conductor 120A.

Further, similarly to the second comparative example, an oxide film 132A (NbOx) is formed on a part of the surface of the conductor layer 130A that is in contact with the first conductor 110A or the second conductor 120A. Further, similarly to the second comparative example, an oxide film 140A (AlOx) is formed on a part of the surface of the first conductor 110A that is not in contact with the substrate 60 nor with the conductor layer 130A (the surface that is in contact with the second conductor 120A or 120B).

Note that in the first example embodiment, a projecting part 112A (a first projecting part) that is not covered by the second conductor 120A is formed in the first conductor 110A. The projecting part 112A is integrally formed with the first conductor 110A. The projecting part 112A corresponds to the projecting part 2a shown in FIG. 1. As indicated by an arrow X1, the connection conductor 150A is deposited on and connected to this projecting part 112A (a superconducting contact). The projecting part 112A can be formed by making some contrivance to the shape of the resist mask. By connecting the projecting part 112A to the connection conductor 150A as described above, the conductors at both ends of the spurious junction 80A (i.e., the first conductor 110A and the conductor layer 130A) are short-circuited. Therefore, the spurious junction 80A is electrically disabled. Accordingly, since the electric field generated in the spurious junction 80A does not increase, the spurious junction 80A does not contribute to the cause of the loss.

Meanwhile, similarly to the second comparative example, the first conductor 110B is deposited on the substrate 60 and the conductor layer 130B on the second side 70B. Further, the second conductor 120B is deposited on the substrate 60 and the first conductor 110B. Further, the connection conductor 150B is deposited on the conductor layer 130B, the first conductor 110B, and the second conductor 120B. As a result, the second conductor 120B is connected to the connection conductor 150B as indicated by an arrow X2. Therefore, the second conductor 120B is connected to the conductor layer 130B through the connection conductor 150B. For example, the second conductor 120B may be connected to the conductor layer 130B with no oxide film (no dielectric) interposed therebetween. That is, the conductors at both ends of the spurious junction 80B (i.e., the second conductor 120B and the conductor layer 130B) are short-circuited by the connection conductor 150B, so that the spurious junction 80B is electrically disabled. Therefore, since the electric field generated in the spurious junction 80B does not increase, the spurious junction 80B does not contribute to the cause of the loss.

Further, similarly to the second comparative example, an oxide film 132B (NbOx) is formed on a part of the surface of the conductor layer 130B that is in contact with the first conductor 110B, and on an exposed part of the surface thereof. Further, an oxide film 140B (AlOx) is formed on a part of the surface of the first conductor 110B that is in contact with the second conductor 120B. Note that in the first example embodiment, similarly to the second comparative example, the oxide film removal step is not performed for the conductor layer 130 before the evaporation process for the first conductors 110. Further, by forming the connection conductor 150, the connection (the superconducting contact) between the conductor layer 130 and the superconductors (the first and second conductors 110 and 120) is formed as described above without performing the oxide film removal step before the evaporation process for the first conductors 110.

As described above, in the quantum device 50 according to the first example embodiment, the projecting part 112A and the conductor layer 130A are connected to each other through the connection conductor 150A. As a result, there is a connection path between the conductors at both ends of the spurious junction 80A (i.e., the first conductor 110A and the conductor layer 130A) that connects them without either of the oxide films 140 and 132 interposed therebetween. That is, the conductors at both ends of the spurious junction 80A (i.e., the first conductor 110A and the conductor layer 130A) are short-circuited. Therefore, as described above, the spurious junction 80A does not contribute to the cause of the loss. Further, in the quantum device 50 according to the first example embodiment, the second conductor 120B and the conductor layer 130B are connected to each other through the connection conductor 150B. As a result, there is a connection path between the conductors at both ends of the spurious junction 80B (i.e., the second conductor 120B and the conductor layer 130B) that connects them without either of the oxide films 140 and 132 interposed therebetween. That is, the conductors at both ends of the spurious junction 80B (i.e., the second conductor 120B and the conductor layer 130B) are short-circuited. Therefore, as described above, the spurious junction 80B does not contribute to the cause of the loss. Therefore, the quantum device 50 according to the first example embodiment can suppress the deterioration of the performance thereof.

Further, in the quantum device 50 according to the first example embodiment, since the projecting part 112A and the connection conductor 150A are connected to each other, a separate process, which would otherwise be required to connect the first conductor 110A to the connection conductor 150A, becomes unnecessary. That is, the quantum device 50 according to the first example embodiment can be manufactured without substantially increasing the number of steps from that in the second comparative example. Therefore, in the first example embodiment, it is possible to manufacture, by a simple method, a quantum device 50 capable of suppressing the deterioration of the performance thereof.

Figure 17:
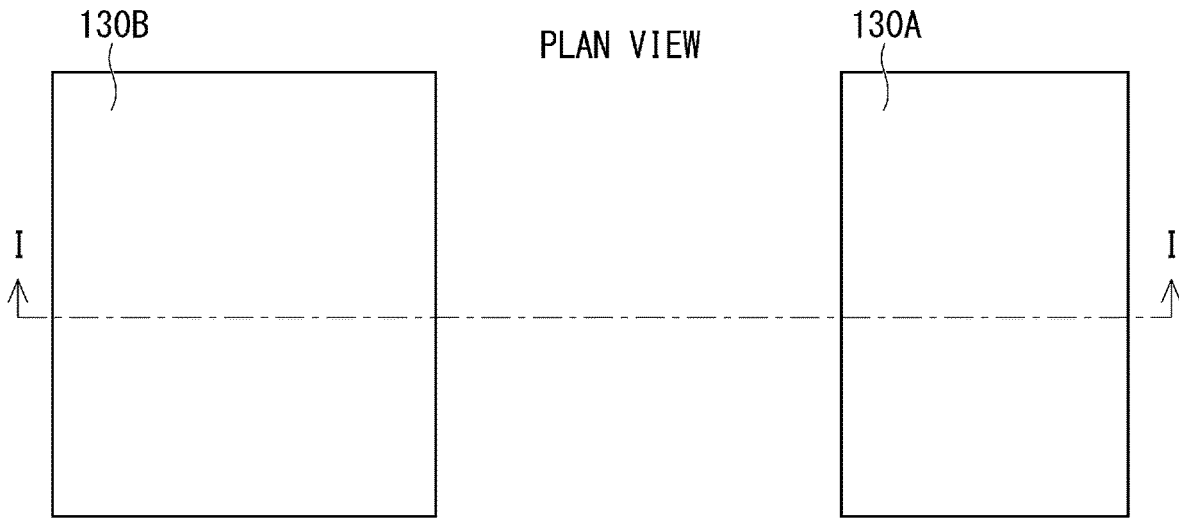
FIG. 17 is a diagram showing a step included in a method for manufacturing a quantum device according to the first example embodiment.
Figure 17:
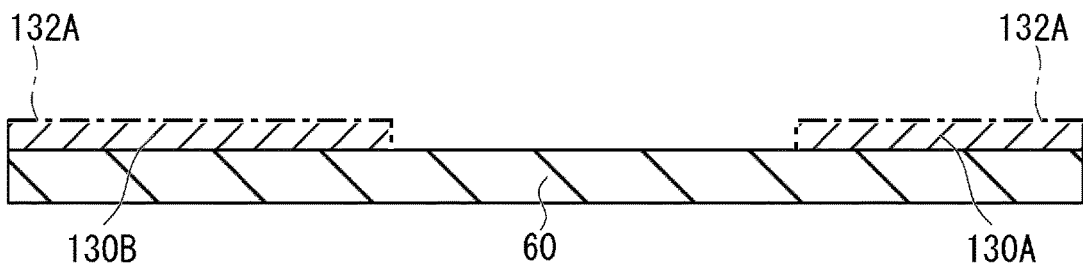

FIGS. 17 to 24 are diagrams showing steps included in a method for manufacturing a quantum device 50 according to the first example embodiment. Firstly, as shown in FIG. 17, a substrate 60 is prepared, and conductor layers 130 are formed on the substrate 60 (a conductor layer deposition step). The deposition of the conductor layers 130 can be performed, for example, by sputtering. Alternatively, the deposition of the conductor layers 130 can be performed by evaporation or CVD. Further, the formation of a circuit pattern on the conductor layers 130 can be performed, for example, by a combination of optical lithography and reactive ion etching. Note that an electron beam lithography method or the like may be used instead of using the optical lithography. Further, wet etching or the like may be used instead of using the reactive ion etching. Note that an oxide film 132 (NbOx) has been formed on a part of the surface of the conductor layers 130 (a part of the surface that is not in contact with the substrate 60).

Figure 18:
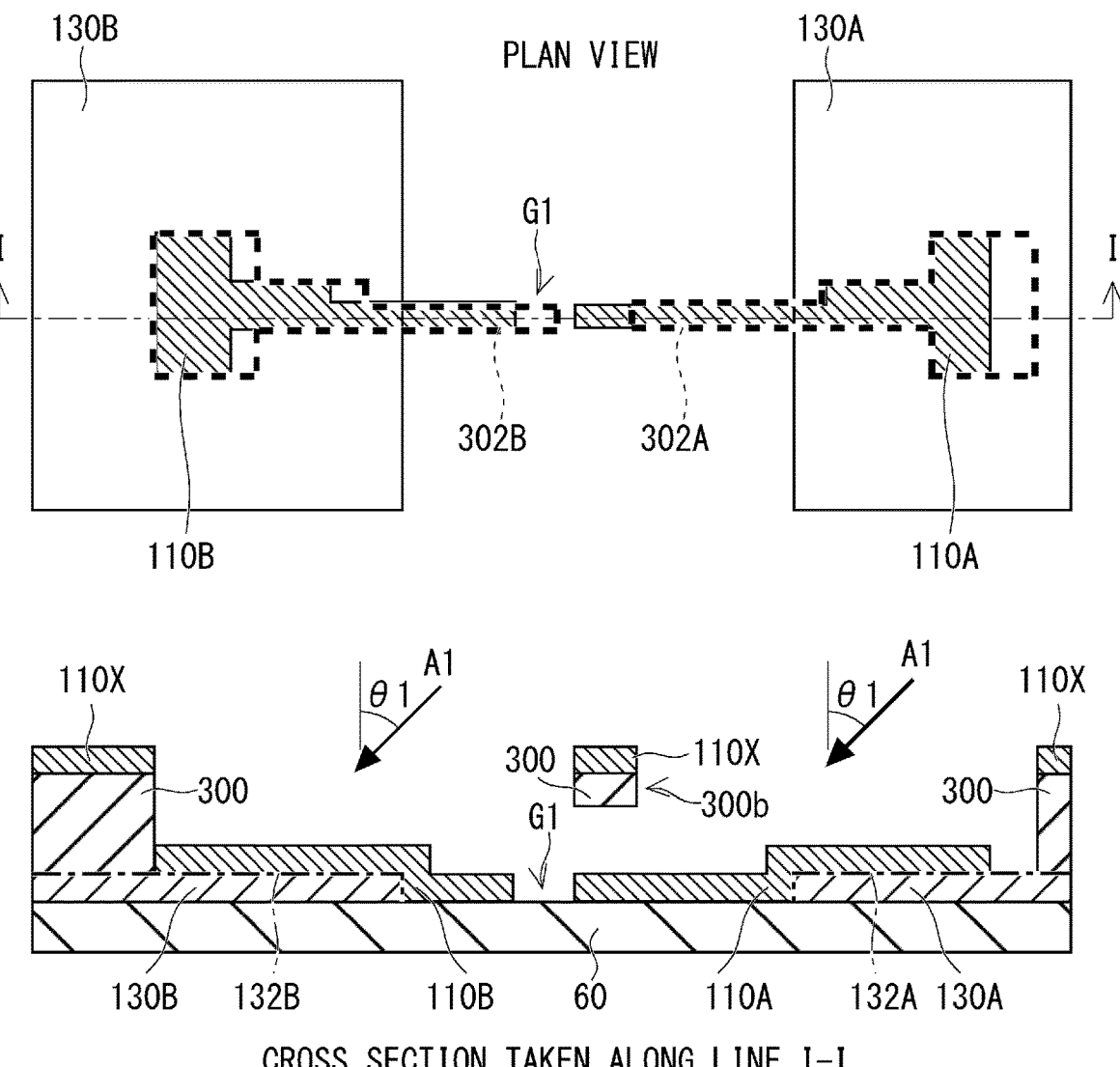
FIG. 18 is a diagram showing a step included in the method for manufacturing the quantum device according to the first example embodiment.

Next, as shown in FIG. 18, a resist mask 300 (a resist pattern) is formed on the substrate 60 (a resist mask formation step). In this process, the substrate 60 and the like are placed in a vacuum environment. That is, the substrate 60 and the like are disposed in a vacuum-sealed state inside a chamber inside of which is in a vacuum state. Openings 302 (302A and 302B) are formed by the resist pattern of the resist mask 300. Note that after that and until the resist mask 300 is removed, the substrate 60 and the conductor layers 130 except for the parts thereof corresponding to the openings 302 are covered by the resist mask 300. Further, the resist mask 300 includes a resist bridge 300b. By this resist bridge 300b, the openings 302 are separated into two openings 302A and 302B.

Further, in the first example embodiment, the resist mask 300 is formed so that the first conductor 110A includes the projecting part 112A. That is, the resist mask 300 according to the first example embodiment is formed so that the Josephson junction 100 is formed by the first conductor 110 including the projecting part 112A and the second conductor 120.

In contrast to the first comparative example, the oxide film removal step is not performed at this stage in the first example embodiment. In this state, the first conductors 110 are evaporated by angled evaporation in a direction indicated by arrows A1 (a first evaporation processing step). The direction of the angled evaporation is, for example, a direction about 20 degrees inclined from the direction perpendicular to the substrate 60 (i.e., the downward direction in the cross-sectional diagram) to the first side 70A as viewed from the substrate 60 side. That is, when the angle from the direction perpendicular to the substrate 60 to the first side 70A is represented by θ1, the superconducting material is evaporated roughly in the direction expressed as θ1=20 degrees.

In this way, the first conductor 110A is evaporated through the opening 302A. Further, the first conductor 110B is evaporated through the opening 302B. Further, a superconducting material 110X (Al) that has been evaporated together with the first conductors 110 is deposited on the resist mask 300. Further, a gap G1, by which the first conductors 110A and 110B are separated from each other, is formed by the resist bridge 300b. Further, since the oxide film removal step has not been performed, an oxide film 132A has been formed between the first conductor 110A and the conductor layer 130A. Further, an oxide film 132B has been formed between the first conductor 110B and the conductor layer 130B.

Figure 19:
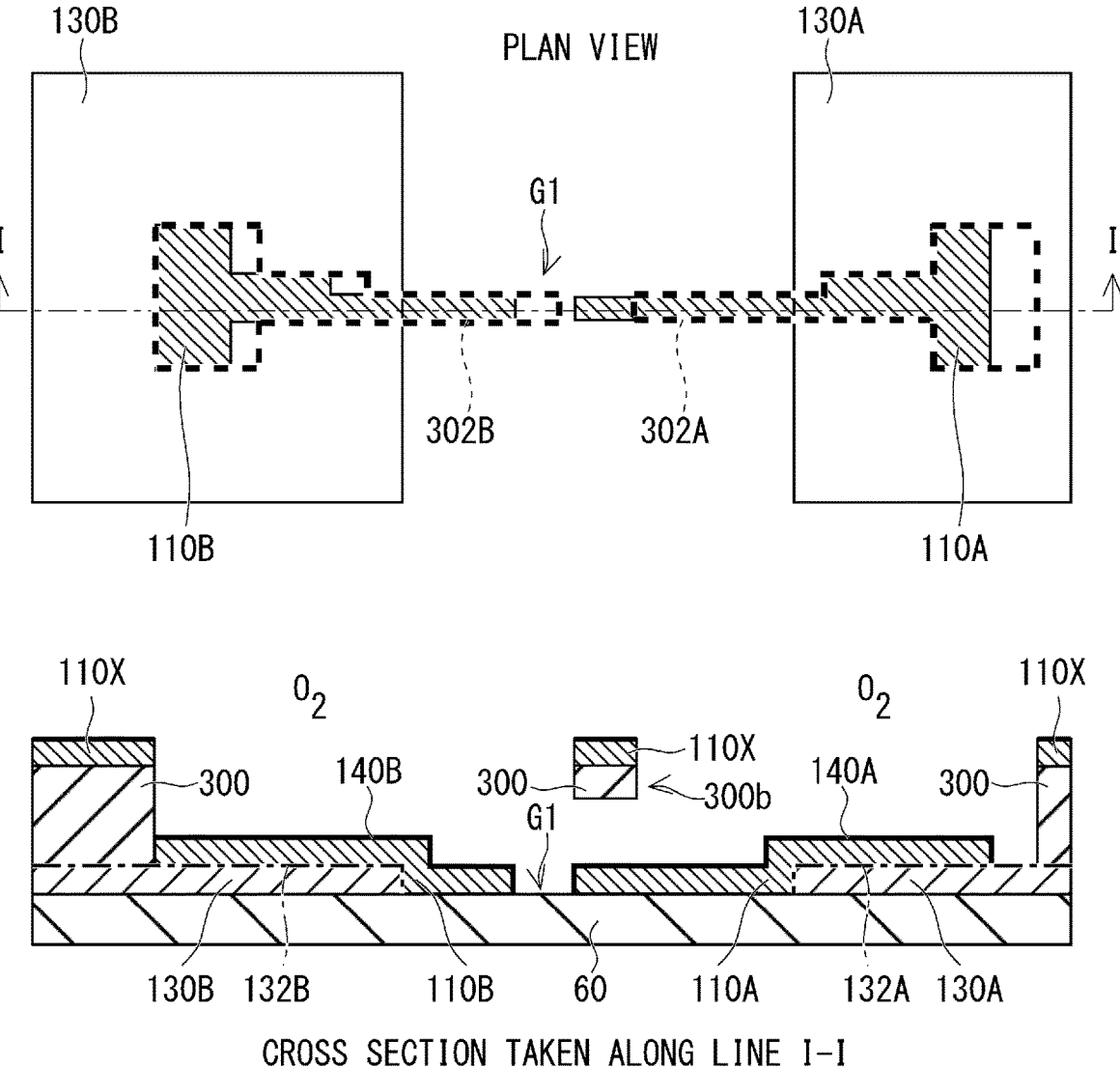
FIG. 19 is a diagram showing a step included in the method for manufacturing the quantum device according to the first example embodiment.

Next, as shown in FIG. 19, similarly to the first comparative example, the surface of the first conductors 110 is oxidized (FIG. 6) (an oxidation step). As a result, an oxide film 140A (AlOx) is formed on the surface of the first conductor 110A. Further, an oxide film 140B (AlOx) is formed on the surface of the first conductor 110B.

Figure 20:
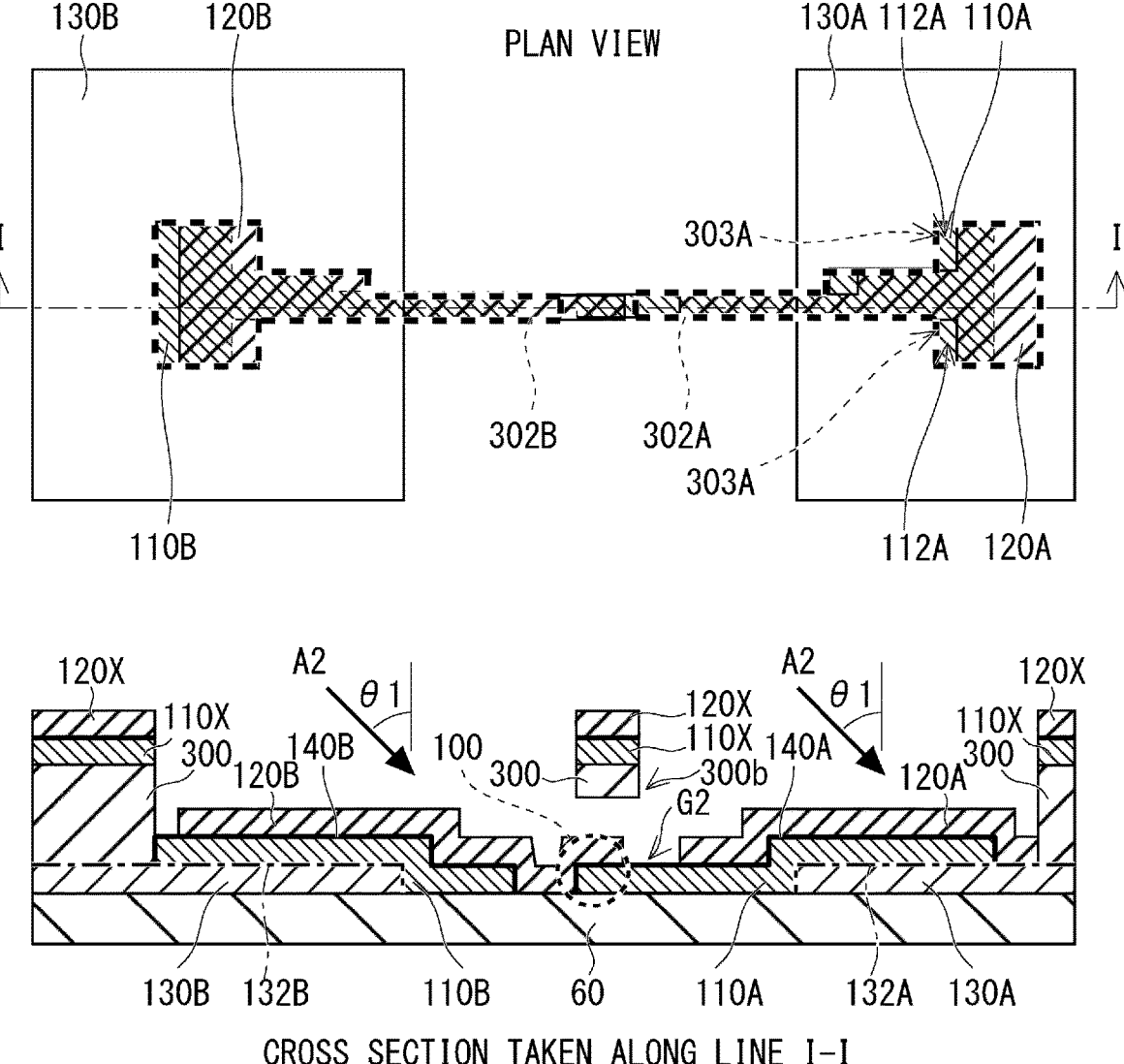
FIG. 20 is a diagram showing a step included in the method for manufacturing the quantum device according to the first example embodiment.

Next, as shown in FIG. 20, similarly to the first comparative example (FIG. 7), the second conductors 120 are evaporated by angled evaporation in a direction indicated by arrows A2 (a second evaporation processing step). The direction of the angled evaporation is, for example, a direction about 20 degrees inclined from the direction perpendicular to the substrate 60 (i.e., the downward direction in the cross-sectional diagram) to the second side 70B as viewed from the substrate 60 side. That is, when the angle from the direction perpendicular to the substrate 60 to the second side 70B is represented by θ1, the superconducting material is evaporated roughly in the direction expressed as θ1=20 degrees.

In this process, the second conductor 120A is evaporated through the opening 302A. Further, the second conductor 120B is evaporated through the opening 302B. Further, a superconducting material 120X (Al) that has been evaporated together with the second conductors 120 is deposited on the resist mask 300. Further, a gap G2, by which the second conductors 120A and 120B are separated from each other, is formed on the first conductor 110A by the resist bridge 300b. Further, the Josephson junction 100 is formed in a part where the first conductor 110A and second conductor 120B overlap each other.

Further, in the first example embodiment, since the superconducting material reaches the vicinity of the wall part 303A on the first side 70A, which forms the opening 302A, in the first evaporation processing step, a film of the first conductor 110A is formed there. In contrast, the vicinity of the wall part 303A is shielded by the wall part 303A in the second evaporation processing step, there is a place on the first conductor 110A where no film of the second conductor 120A is formed. The projecting part 112A of the first conductor 110A is formed in this place where no film of the second conductor 120A formed.

Figure 21:
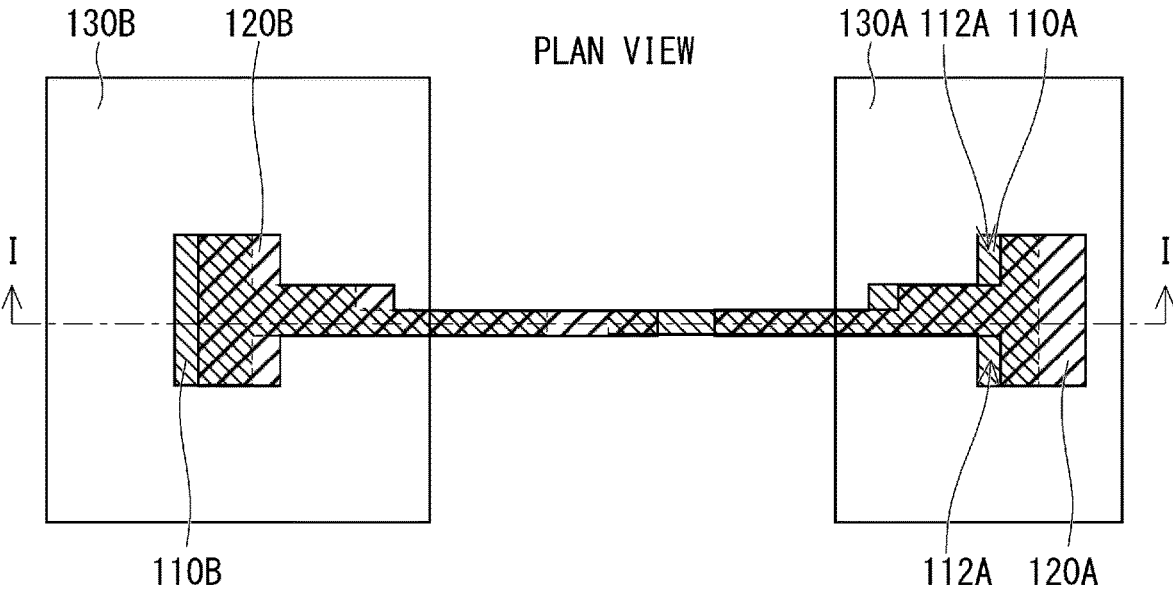
FIG. 21 is a diagram showing a step included in the method for manufacturing the quantum device according to the first example embodiment.
Figure 21:
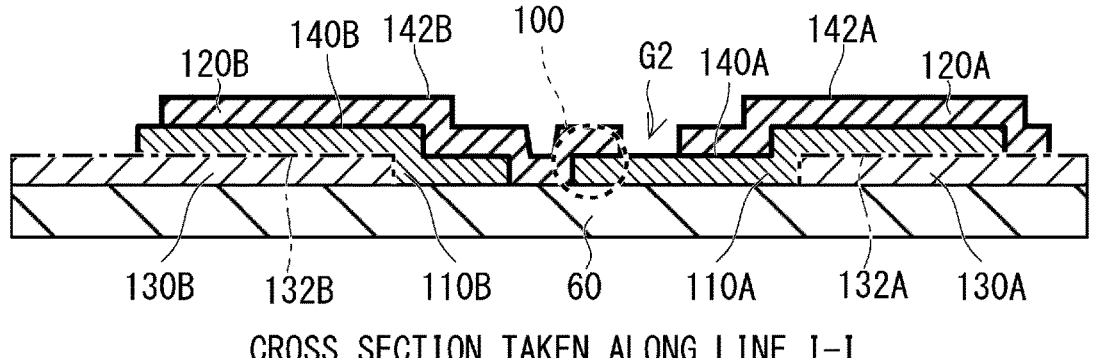

Next, as shown in FIG. 21, the resist mask 300 is removed (a lift-off step). As a result, the resist mask 300 and the excessive superconducting materials 110X and 120X deposited on the resist mask 300 are removed. At this point, the vacuum state (the sealed state) is released to the atmospheric environment. That is, the apparatus in which the substrate 60 is disposed is released from the vacuum state (the vacuum-sealed state) and is placed under the atmospheric environment. Note that since the substrate 60 is placed under the atmospheric environment, an oxide film 142 is formed on the surface of the second conductors 120. That is, an oxide film 142A is formed on the surface of the second conductor 120A, and an oxide film 142B is formed on the surface of the second conductor 120B.

Figure 22:
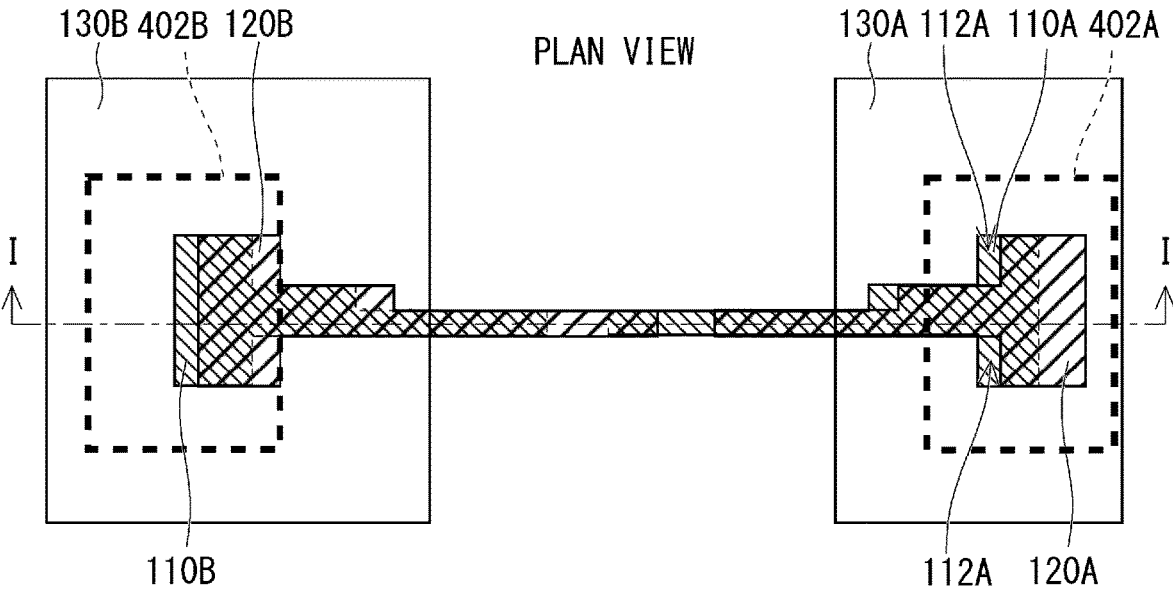
FIG. 22 is a diagram showing a step included in the method for manufacturing the quantum device according to the first example embodiment.
Figure 22:
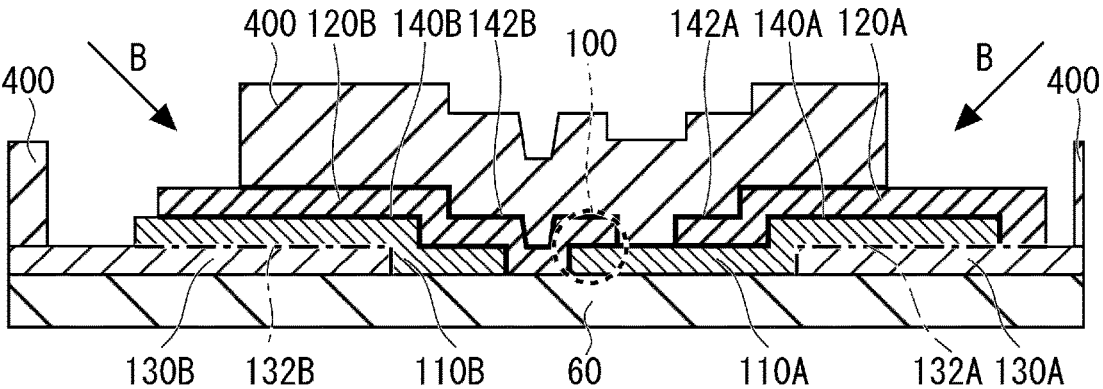

Next, as shown in FIG. 22, a resist mask 400 (a resist pattern) for forming connection conductors 150 is formed (a connection conductor resist mask formation step). In this process, the substrate 60 and the like are placed in a vacuum environment. That is, the substrate 60 and the like are disposed in a vacuum-sealed state inside a chamber inside of which is in a vacuum state. Openings 402 (402A and 402B) are formed by the resist pattern of the resist mask 400. In the resist mask 400, the opening 402A is provided on the first side 70A and the opening 402B is provided on the second side 70B. Note that after that and until the resist mask 400 is removed, the substrate 60 and like except for the parts thereof corresponding to the openings 402 are covered by the resist mask 400. Note that as will be described later, the connection conductors 150 are formed at the places corresponding to the openings 402.

In this state, oxide films formed in the exposed parts of the first conductors 110, the second conductors 120, and the conductor layers 130 not covered by the resist mask 400 are removed (an oxide film removal step). As a result, a part of the oxide film 132 formed on a part of the surface of the conductor layer 130 that is not covered by the resist mask 400, a part of the oxide film 142 formed on a part of the surface of the second conductors 120 that is not covered by the resist mask 400, and a part of the oxide film 140 formed on a part of the surface of the first conductors 110 that is not covered by the resist mask 400 are removed. The removal of the oxide films 132, 140 and 142 is performed by, for example, ion milling or the like in which ion beams are applied to the oxide films through the openings 402 as indicated by arrows B. Note that the oxide films 132, 140 and 142 are removed in order to form a connection (a superconducting contact) between the conductor layers 130 and the superconductor (the first and second conductors 110 and 120) by the connection conductors 150.

Figure 23:
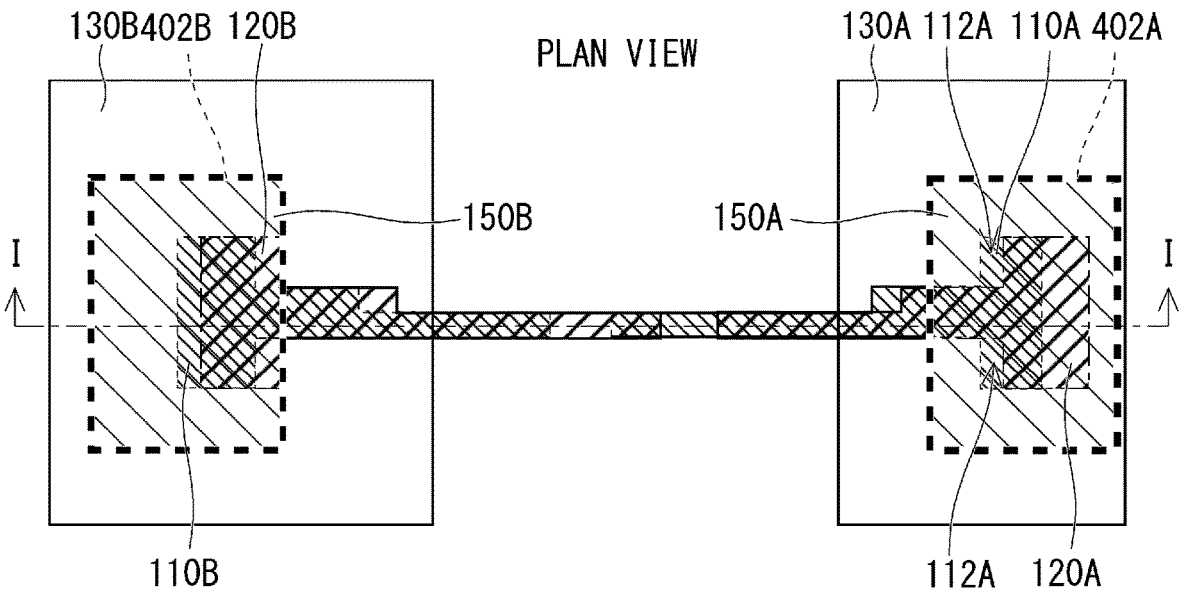
FIG. 23 is a diagram showing a step included in the method for manufacturing the quantum device according to the first example embodiment.
Figure 23:
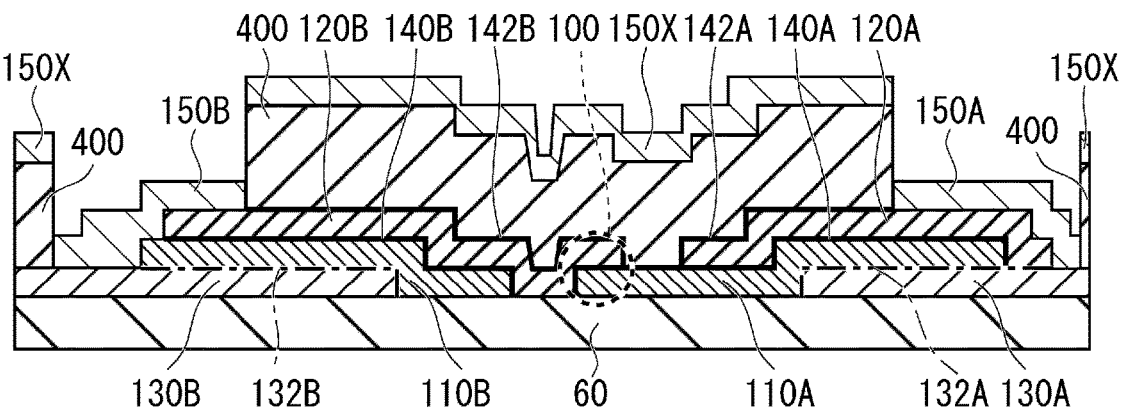

Next, as shown in FIG. 23, the connection conductors 150 are evaporated through the openings 402 (a connection conductor evaporation step). Note that the evaporation process for the connection conductors 150 does not necessarily have to be the angled evaporation. As a result, a film of the connection conductor 150A is formed through the opening 402A. Further, a film of the connection conductor 150B is formed through the opening 402B. Further, a superconducting material 150X (Al) that has been evaporated together with the connection conductors 150 is deposited on the resist mask 400.

Since the film of the connection conductor 150A is formed at a place corresponding to the opening 402A, the projecting part 112A formed in the first conductor 110A is directly connected to the connection conductor 150A (a superconducting contact). Further, the conductor layer 130A is directly connected to the connection conductor 150A (a superconducting contact). Therefore, the projecting part 112A formed in the first conductor 110A and the conductor layer 130A are connected to each other through the conductor (the connection conductor 150A). Note that the second conductor 120A is directly connected to the connection conductor 150A (a superconducting contact). Therefore, the second conductor 120A and the conductor layer 130A are connected to each other through the conductor (the connection conductor 150A).

Further, since the film of the connection conductor 150B is formed at a place corresponding to the opening 402B, the second conductor 120B is directly connected to the connection conductor 150B (a superconducting contact). Further, the conductor layer 130B is directly connected to the connection conductor 150B (a superconducting contact). Therefore, the second conductor 120B and the conductor layer 130B are connected to each other through the conductor (the connection conductor 150B). Note that the first conductor 110B is directly connected to the connection conductor 150B (a superconducting contact). Therefore, the first conductor 110B and the conductor layer 130B are connected to each other through the conductor (the connection conductor 150B).

Figure 24:
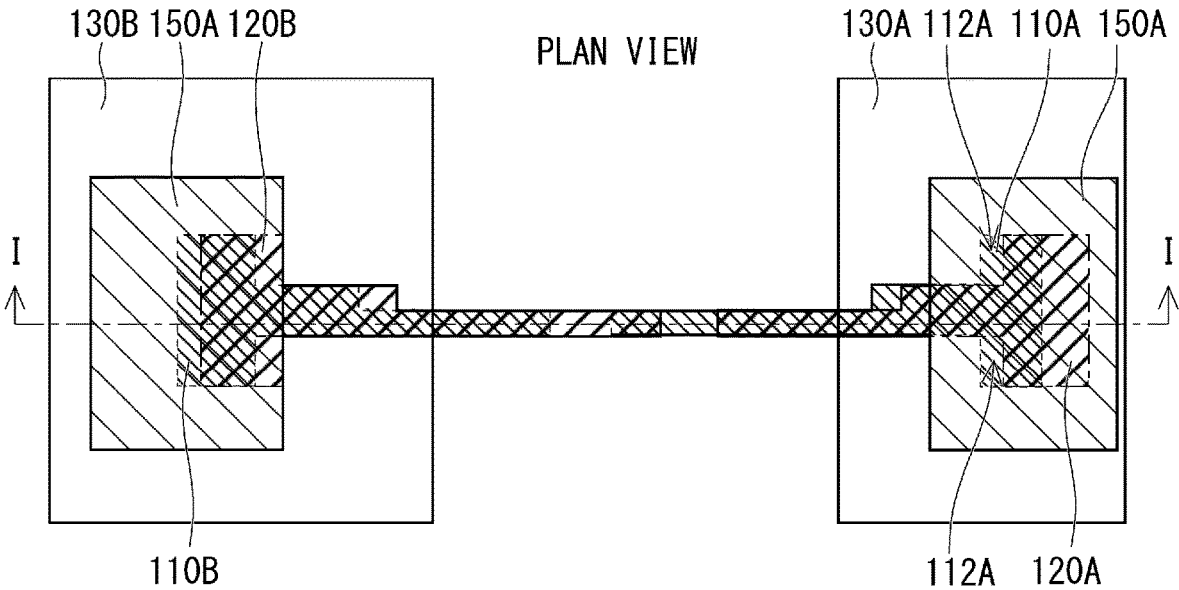
FIG. 24 is a diagram showing a step included in the method for manufacturing the quantum device according to the first example embodiment.
Figure 24:
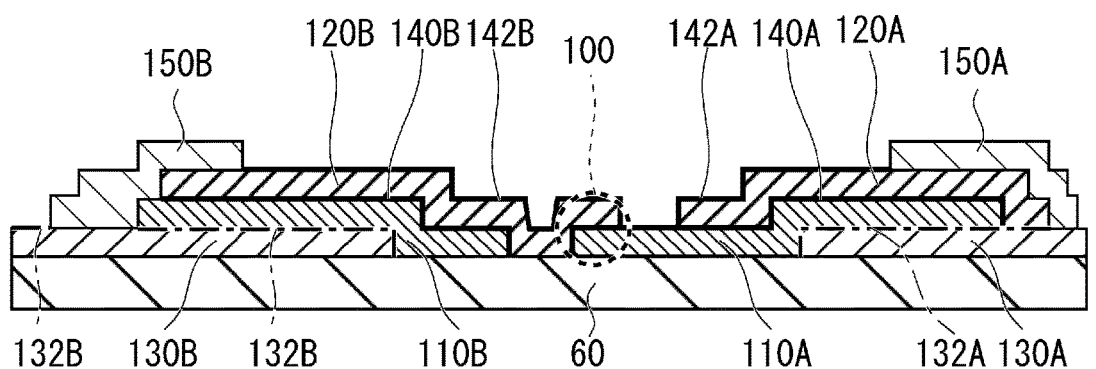

Next, as shown in FIG. 24, the resist mask 400 is removed (a lift-off step). As a result, the resist mask 400 and the excessive superconducting material 150X deposited on the resist mask 400 are removed. Through the above-described processes, the quantum device 50 according to the first example embodiment shown in FIG. 16 is manufactured. Note that the steps shown in FIGS. 18 to 20 are performed in the same vacuum-sealed state. That is, in the steps shown in FIGS. 18 to 20, the vacuum-sealed state is not released to the atmospheric environment. Further, the steps shown in FIGS. 22 and 23 are performed in the same vacuum-sealed state. That is, in the steps shown in FIGS. 22 and 23, the vacuum-sealed state is not released to the atmospheric environment.

Second Example Embodiment

Next, a second example embodiment will be described. The following descriptions and drawings are partially omitted and simplified as appropriate to clarify the explanation. Further, the same reference numerals (or symbols) are assigned to the same components/structure, and redundant descriptions thereof are omitted as appropriate. The positions at which the connection conductors 150 are formed in the second example embodiment are different from those in the first example embodiment.

FIG. 25 shows a quantum device 50 according to the second example embodiment. FIG. 25 is a cross-sectional diagram of the quantum device 50 according to the second example embodiment. Similarly to the first example embodiment, the quantum device 50 according to the second example embodiment includes a substrate 60, a plurality of first conductors 110 (110A and 1101B), a plurality of second conductors 120 (120A and 120B), and conductor layers 130 (130A and 130B) that constitute a superconducting circuit.

The structures of the first conductors 110, the second conductors 120, and the conductor layers 130 are substantially the same as those in the first example embodiment unless otherwise specified, and therefore descriptions thereof are omitted as appropriate.

Note that in the second example embodiment, an XYZ-orthogonal coordinate system is introduced for the sake of explanation of the quantum device 50. In FIG. 25, a right-handed XYZ-coordinate system is shown. A plane parallel to the plane on which the conductor layers 130 and superconductors and the like are mounted on the substrate 60 is defined as an XY-plane, and the direction perpendicular to this plane is defined as a Z-axis direction. The upward direction in FIG. 25 is defined as a +Z direction, and the downward direction in FIG. 25 is defined as a −Z direction. Note that the upward and downward directions are defined just for explanatory purposes and do not indicate the directions in which the actual quantum device 50 is disposed when it is used. Further, the position of the origin of the XYZ-orthogonal coordinate system is arbitrarily determined. Further, the direction along the XY-plane (the XY-direction) corresponds to the lateral direction in FIG. 25. Further, the Z-axis direction corresponds to the vertical direction (the direction perpendicular to the surface of the substrate 60) in FIG. 25. Further, the direction from the Josephson junction 100 toward the first side 70A is defined as a +Y direction, and the direction from the Josephson junction 100 toward the second side 70B is defined as −Y direction. Further, the direction from the back of the paper toward the front thereof is defined as a +X direction. The above-described matters also apply to other bridge-type example embodiments described later.

The first conductors 110 are deposited on the conductor layers 130. The second conductors 120 are deposited on the first conductors 110. The first conductors 110, the second conductors 120, and the conductor layers 130 are formed of superconducting materials. Further, oxide films 140 (140A and 140B) have been formed between the first and second conductors 110 and 120. Further, a Josephson junction 100 is formed by a part of the first conductors 110 (110A) (a first conductor part 110Aa), a part of the second conductors 120 (120B) (a second conductor part 120Ba), and the oxide film 140 (140A). The structure of the Josephson junction 100 is substantially the same as those in the first example embodiment, and the first and second comparative examples, and therefore the description thereof is omitted as appropriate.

The quantum device 50 according to the second example embodiment further includes connection conductors 152 (152A and 152B). The connection conductors 152 are formed of a superconducting material. The connection conductors 152 may be formed of, for example, aluminum (Al). The connection conductor 152A is directly connected to the first conductor 110A and the conductor layer 130A on the first side 70A. As a result, the connection conductor 152A connects the first conductor 110A to the conductor layer 130A on the first side 70A (a superconducting contact). Note that in the second example embodiment, the connection conductor 152A is not connected to the second conductor 120A on the first side 70A.

Further, the connection conductor 152B is directly connected to the second conductor 120B and the conductor layer 130B on the second side 70B. As a result, the connection conductor 152B connects the second conductor 120B to the conductor layer 130B on the second side 70B (a superconducting contact). Note that in the second example embodiment, the connection conductor 152B is not connected to the first conductor 110B on the second side 70B.

Figure 26:
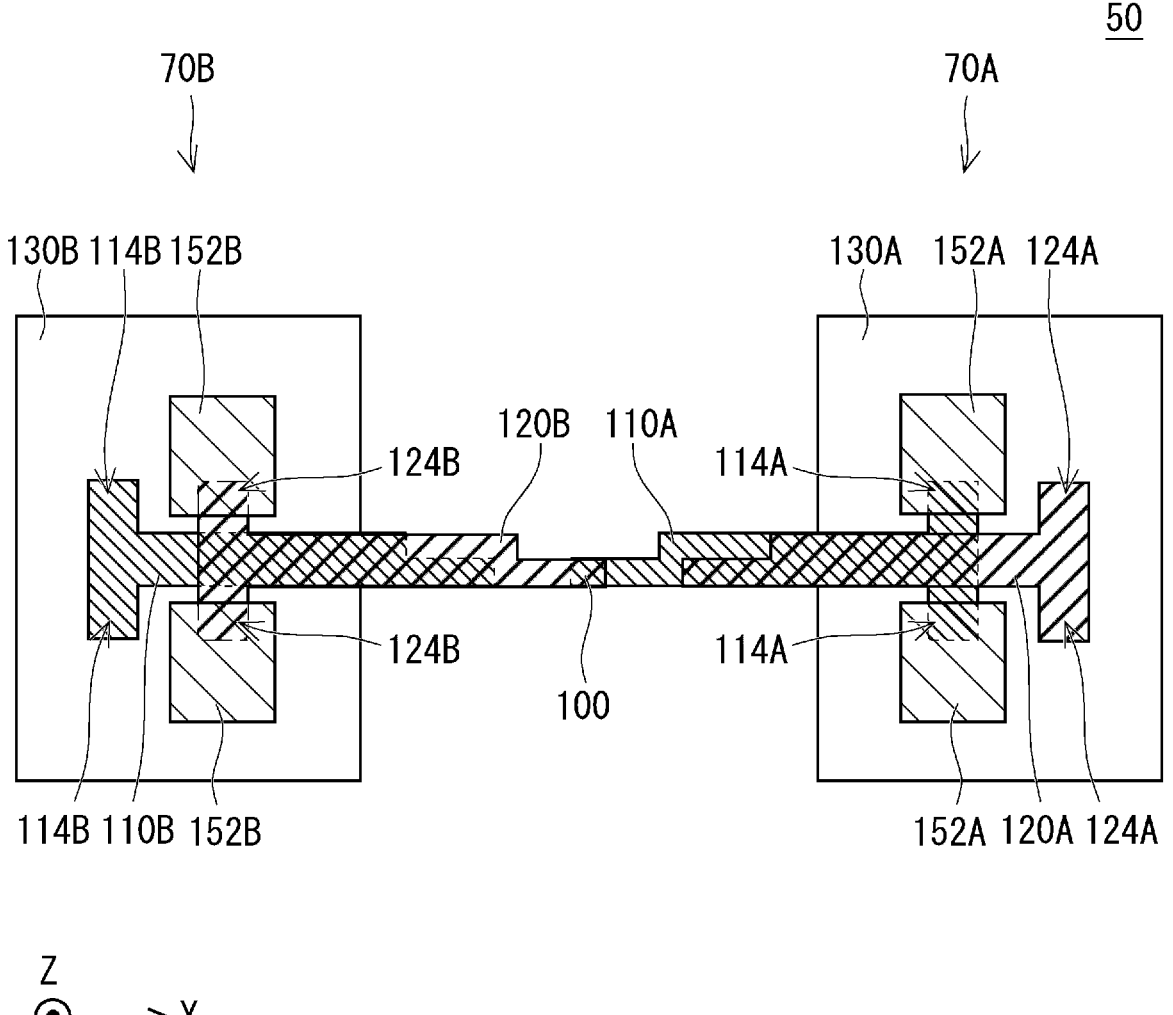
FIG. 26 shows an example of implementation of a quantum device according to the second example embodiment.

FIG. 26 shows an example of implementation of a quantum device 50 according to the second example embodiment. FIG. 26 is a plan view of the quantum device 50 according to the second example embodiment. FIG. 26 shows an example in which the quantum device 50 according to the second example embodiment is manufactured by a bridge type. Note that in the plan view shown in FIG. 26, an XYZ-orthogonal coordinate system, which corresponds to that defined in FIG. 25 (the cross-sectional diagram), is also introduced.

On the first side 70A, the first conductor 110A includes a projecting part 114A (a first projecting part) projecting in the X-axis direction at the end thereof in the +Y direction. Further, on the first side 70A, the second conductor 120A includes a projecting part 124A projecting in the X-axis direction at the end thereof in the +Y direction. The projecting part 114A projects so as not to be covered by the second conductor 120A deposited on the first conductor 110A. Note that the projecting part 124A is disposed in the vicinity of the projecting part 114A. Note that in the second example embodiment, one projecting part 114A is provided in the +X direction and another projecting part 114A is provided in the −X direction. The same applies to the projecting part 124A. Note that since the first conductor 110A and the second conductor 120A are formed by using the same resist mask while fixing the resist mask to the substrate 60 as described above, the shapes and numbers of projecting parts 114A and those of projecting parts 124A correspond to each other (i.e., are the same as each other).

The connection conductor 152A is directly connected to the projecting part 114A and the conductor layer 130A (a superconducting contact). As a result, the first conductor 110A and the conductor layer 130A are directly connected to each other on the first side 70A. Note that in the second example embodiment, the connection conductor 152A is not connected to the projecting part 124A.

Further, on the second side 70B, the first conductor 110B includes a projecting part 114B projecting in the X-axis direction at the end thereof in the −Y direction. Further, on the second side 70B, the second conductor 120B includes a projecting part 124B projecting in the X-axis direction at the end thereof in the −Y direction. The projecting part 124B projects beyond the first conductor 110B, on which the second conductor 120B is deposited, in the X-axis direction. Note that the projecting part 124B is disposed in the vicinity of the projecting part 114B. Note that in the second example embodiment, one projecting part 114B is provided in the +X direction and another projecting part 114B is provided in the −X direction. The same applies to the projecting part 124B. Note that since the first conductor 110B and the second conductor 120B are formed by using the same resist mask while fixing the resist mask to the substrate 60 as described above, the shapes and numbers of projecting parts 114B and those of projecting parts 124B correspond to each other (i.e., are the same as each other).

The connection conductor 152B is directly connected to the projecting part 124B and the conductor layer 130B (a superconducting contact). In this way, the second conductor 120B and the conductor layer 130B are directly connected to each other on the second side 70B. Note that in the second example embodiment, the connection conductor 152B is not connected to the projecting part 114B.

Figure 27:
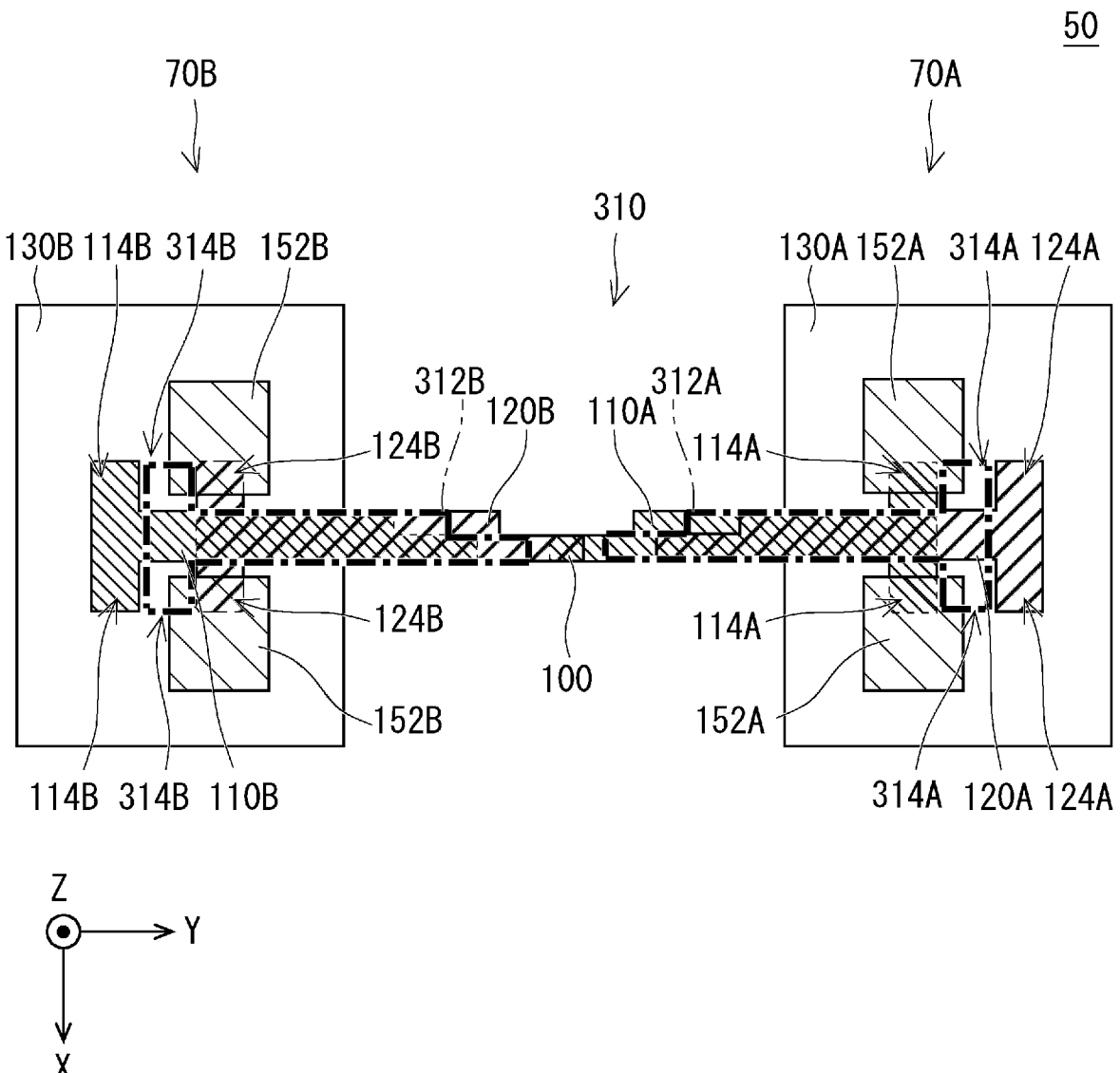
FIG. 27 is a diagram for explaining a method for manufacturing the quantum device shown in FIG. 26.

FIG. 27 is a diagram for explaining a method for manufacturing a quantum device 50 shown in FIG. 26. The quantum device 50 according to the second example embodiment is manufactured by substantially the same method as that according to the first example embodiment (FIGS. 17 to 24). However, the shape of the resist mask used in the second example embodiment is different from that of the resist mask used in the first example embodiment.

In FIG. 27, openings 312 (312A and 312B) of the resist mask 310, which are used to form the first and second conductors 110 and 120, are indicated by thick dashed lines. The areas other than the areas corresponding to the openings 312 are covered by the resist mask 310. The opening 312A is formed on the first side 70A and the opening 312B is formed on the second side 70B.

Further, a recessed part(s) 314A recessed in the X-axis direction is provided at the end of the opening 312A in the +Y direction. The shape and number of the recessed part(s) 314A correspond to (i.e., are same as) those of the projecting parts 114A and 124A. Further, a recessed part(s) 314B recessed in the X-axis direction is provided at the end of the opening 312B in the −Y direction. The shape and number of the recessed part(s) 314B correspond to those of the projecting parts 114B and 124B.

In the second example embodiment, similarly to the first example embodiment, after the conductor layer deposition step (FIG. 17), a resist mask 310 is formed on the substrate 60 in a resist mask formation step (FIG. 18). Then, in a first evaporation processing step (FIG. 18), first conductors 110 are evaporated in a direction inclined from the −Z direction to the +Y direction by an angle θ1 as viewed from the substrate 60 side. Specifically, the first conductor 110A is evaporated through the opening 312A. Further, the first conductor 110B is evaporated through the opening 312B. In this process, a projecting part(s) 114A having a shape conforming to that of the recessed part(s) 314A is formed. Further, a projecting part(s) 114B having a shape conforming to that of the recessed part(s) 314B is formed.

Then, after the oxidation step (FIG. 19), in a second evaporation processing step (FIG. 20), second conductors 120 are evaporated in a direction inclined from the −Z direction to the −Y direction by the angle θ1 as viewed from the substrate 60 side. Specifically, the second conductor 120A is evaporated through the opening 312A. Further, the second conductor 120B is evaporated through the opening 312B. In this process, a projecting part(s) 124A having a shape conforming to that of the recessed part(s) 314A is formed. Further, a projecting part(s) 124B having a shape conforming to that of the recessed part(s) 314B is formed.

Next, after the resist mask 310 is removed in the lift-off step (FIG. 21), a resist mask for forming connection conductors 152 is formed (FIG. 22). Note that in the resist mask for forming the connection conductors 152, openings are provided at positions that are corresponding to, in the Z-axis direction, the place where the connection conductors 152 are formed. Then, after the oxide film removal step (FIG. 22), the connection conductors 152 are formed in a connection conductor evaporation step (FIG. 23). Specifically, on the first side 70A, the connection conductor 152A is deposited on the projecting part 114A and the conductor layer 130A in such a manner that the connection conductor 152A is not in contact with the projecting part 124A. Further, on the second side 70B, the connection conductor 152B is deposited on the projecting part 124B and the conductor layer 130B in such a manner that the connection conductor 152B is not in contact with the projecting part 114B. As a result, the projecting part 114A and the conductor layer 130A are connected to each other by the connection conductor 152A on the first side 70A. Further, the projecting part 124B (the second conductor 120B) and the conductor layer 130B are connected to each other by the connection conductor 152B on the second side 70B.

In the second example embodiment, the first conductor 110A (the projecting part 114A) is connected to the conductor layer 130A on the first side 70A, and the second conductor 120B (the projecting part 124B) is connected to the conductor layer 130B on the second side 70B. Note that the first conductor 110A and the second conductor 120B constitute the Josephson junction 100. Further, in the second example embodiment, the second conductor 120A, which does not constitute the Josephson junction 100, is not connected to the connection conductor 152A. Similarly, the first conductor 110B, which does not constitute the Josephson junction 100, is not connected to the connection conductor 152B.

Note that on the first side 70A, if the second conductor 120A, which does not constitute the Josephson junction 100, is connected to the connection conductor 152A, which connects the first conductor 110A to the conductor layer 130A, there is a risk that the coherence deteriorates. That is, in this case, since the second conductor 120A, which does not constitute the Josephson junction 100, is connected to the electrical path between the first conductor 110A and the conductor layer 130A, there is a possibility that the spurious junction 80A may not be completely disabled. Therefore, it is impossible to eliminate the possibility that the spurious junction 80A may contribute to the cause of the loss. Similarly, on the second side 70B, if the first conductor 110B, which does not constitute the Josephson junction 100, is connected to the connection conductor 152B, which connects the second conductor 120B to the conductor layer 130B, there is a risk that the coherence deteriorates. That is, in this case, since the first conductor 110B, which does not constitute the Josephson junction 100, is connected to the electrical path between the second conductor 120B and the conductor layer 130B, there is a possibility that the spurious junction 80B may not be completely disabled. Therefore, it is impossible to eliminate the possibility that the spurious junction 80B may contribute to the cause of the loss.

In contrast, as described above, in the quantum device 50 according to the second example embodiment, the second conductor 120A, which does not constitute the Josephson junction 100, is not connected to the connection conductor 152A. Similarly, the first conductor 110B, which does not constitute the Josephson junction 100, is not connected to the connection conductor 152B. Therefore, the possibility that the spurious junction 80 can be disabled is high in the second example embodiment. Therefore, the quantum device 50 according to the second example embodiment can further suppress the deterioration of the coherence (the performance).

Third Example Embodiment

Next, a third example embodiment will be described. The following descriptions and drawings are partially omitted and simplified as appropriate to clarify the explanation. Further, the same reference numerals (or symbols) are assigned to the same components/structure, and redundant descriptions thereof are omitted as appropriate. The positions at which the connection conductors 150 are formed in the third example embodiment are different from those in the second example embodiment.

Figure 28:
FIG. 28 shows a quantum device according to a third example embodiment.
Figure 28:
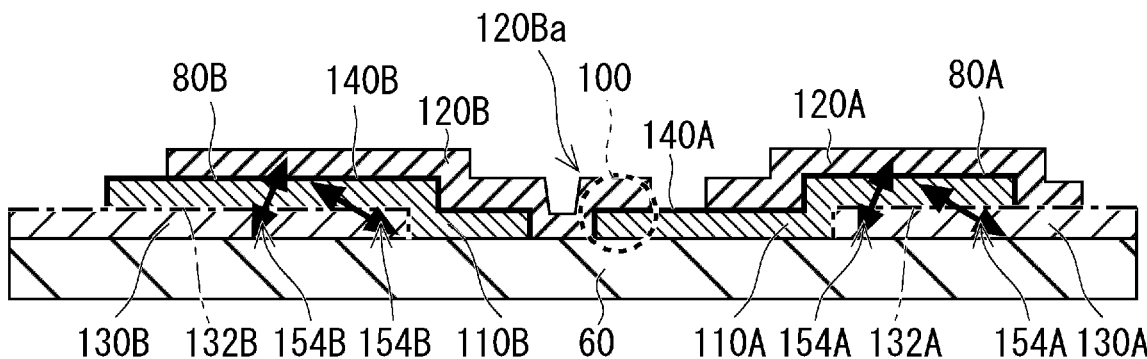
Figure 28:
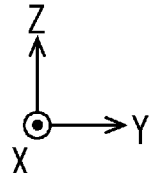

FIG. 28 shows a quantum device 50 according to the third example embodiment. FIG. 28 is a cross-sectional diagram of the quantum device 50 according to the third example embodiment. Similarly to the second example embodiment, the quantum device 50 according to the third example embodiment includes a substrate 60, first conductors 110 (110A and 110B), second conductors 120 (120A and 120B), and conductor layers 130 (130A and 130B) that constitute a superconducting circuit. The structures of the first conductors 110, the second conductors 120, and the conductor layers 130 are substantially the same as those in the second example embodiment unless otherwise specified, and therefore descriptions thereof are omitted as appropriate. Further, the XYZ-orthogonal coordinate system introduced in the second example embodiment is also introduced in the third example embodiment.

The first conductors 110 are deposited on the conductor layers 130. The second conductors 120 are deposited on the first conductors 110. The first conductors 110, the second conductors 120, and the conductor layers 130 are formed of superconducting materials. Further, oxide films 140 (140A and 140B) are formed between the first and second conductors 110 and 120. Further, a Josephson junction 100 is formed by a part of the first conductors 110 (110A) (a first conductor part 110Aa), a part of the second conductors 120 (120B) (a second conductor part 120Ba), and the oxide film 140 (140A). The structure of the Josephson junction 100 is substantially the same as that of the second example embodiment, and therefore the description thereof is omitted as appropriate.

The quantum device 50 according to the third example embodiment further includes connection conductors 154 (154A and 154B). The connection conductors 154 are formed of a superconducting material. The connection conductors 154 may be formed of, for example, aluminum (Al). The connection conductor 154A is directly connected to the first conductor 110A and the conductor layer 130A on the first side 70A. As a result, the connection conductor 154A connects the first conductor 110A to the conductor layer 130A on the first side 70A (a superconducting contact). Further, the connection conductor 154A is directly connected to the second conductor 120A and the conductor layer 130A on the first side 70A. As a result, the connection conductor 154A connects the second conductor 120A to the conductor layer 130A on the first side 70A (a superconducting contact).

Further, the connection conductor 154B is directly connected to the second conductor 120B and the conductor layer 130B on the second side 70B. As a result, the connection conductor 154B connects the second conductor 120B to the conductor layer 130B on the second side 70B (a superconducting contact). Further, the connection conductor 154B is directly connected to the first conductor 110B and the conductor layer 130B on the second side 70B. As a result, the connection conductor 154B connects the first conductor 110B to the conductor layer 130B on the second side 70B (a superconducting contact).

Figure 29:
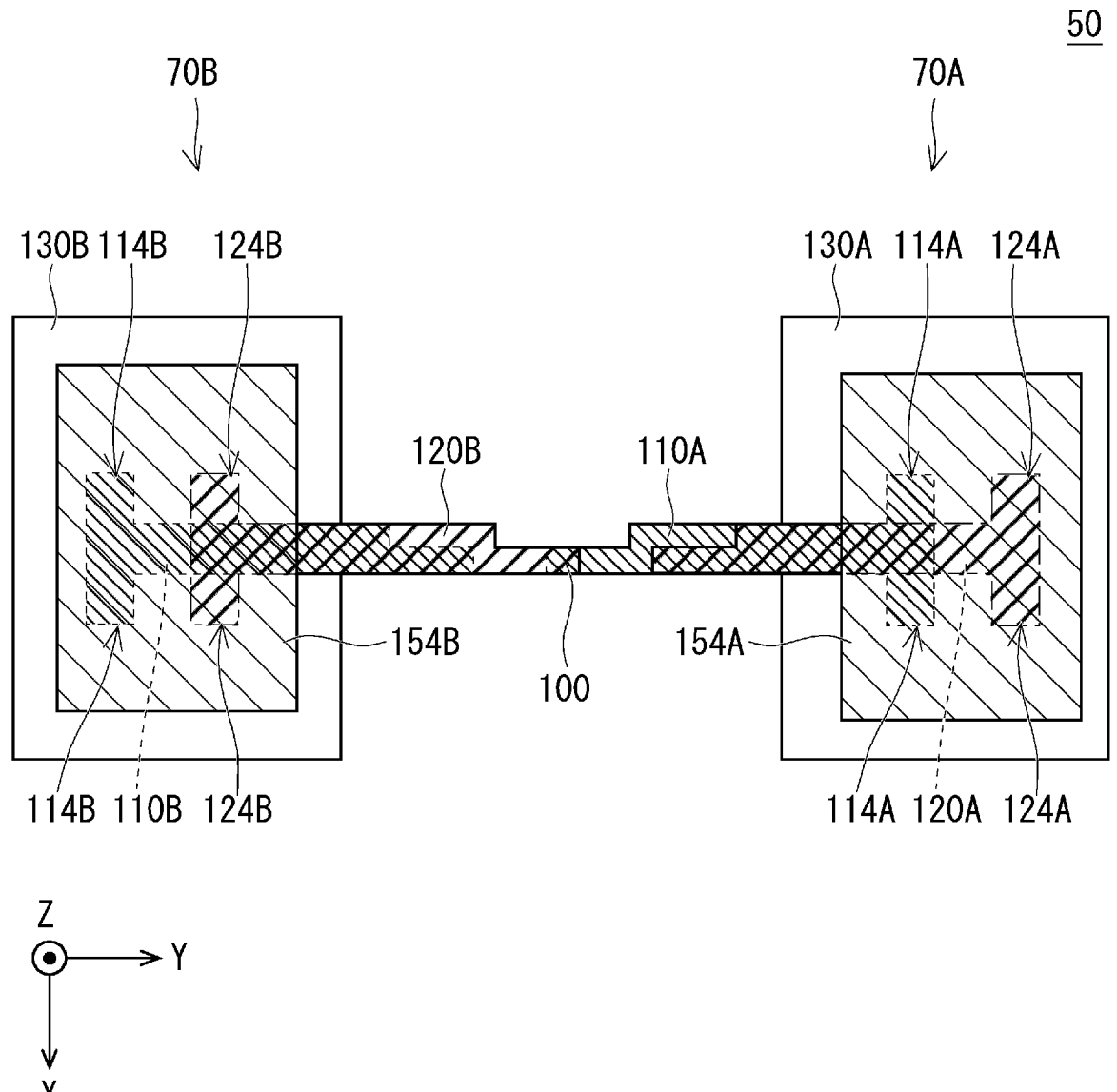
FIG. 29 shows an example of implementation of a quantum device according to the third example embodiment.

FIG. 29 shows an example of implementation of a quantum device 50 according to the third example embodiment. FIG. 29 is a plan view of the quantum device 50 according to the third example embodiment. FIG. 29 shows an example in which the quantum device 50 according to the third example embodiment is manufactured by a bridge type. Note that the method for manufacturing the quantum device 50 according to the third example embodiment is substantially the same as that described above with reference to FIG. 27, and therefore the description thereof is omitted.

Similarly to the second example embodiment shown in FIG. 26, on the first side 70A, the first conductor 110A includes a projecting part 114A (a first projecting part) projecting in the X-axis direction at the end thereof in the +Y direction. Further, on the first side 70A, the second conductor 120A includes a projecting part 124A projecting in the X-axis direction at the end thereof in the +Y direction. The projecting part 114A projects so as not to be covered by the second conductor 120A deposited on the first conductor 110A. Further, the projecting part 124A is disposed in the vicinity of the projecting part 114A.

The connection conductor 154A is directly connected to the projecting part 114A, the second conductor 120A, and the conductor layer 130A (a superconducting contact). Note that as shown in FIG. 26, a physically integral film of the connection conductor 154A may be formed so as to cover the whole areas near the projecting parts 114A and 124A. In other words, the connection conductor 154A covers both the first conductor 110A (the projecting part 114A) and the second conductor 120A (the projecting part 124A). In this way, the first conductor 110A and the conductor layer 130A are directly connected to each other on the first side 70A. Further, the second conductor 120A and the conductor layer 130A are directly connected to each other on the first side 70A. Note that since at least the projecting part 124A is disposed in the vicinity of the projecting part 114A, the second conductor 120A and the conductor layer 130A are connected to each other in the vicinity of the projecting part 114A.

Further, similarly to the second example embodiment shown in FIG. 26, on the second side 70B, the first conductor 110B includes a projecting part 114B projecting in the X-axis direction at the end thereof in the −Y direction. Further, on the second side 70B, the second conductor 120B includes a projecting part 124B projecting in the X-axis direction at the end thereof in the −Y direction. The projecting part 124B projects beyond the first conductor 110B, on which the second conductor 120B is deposited, in the X-axis direction. Note that the projecting part 124B is disposed in the vicinity of the projecting part 114B.

The connection conductor 154B is directly connected to the first conductor 110B (the projecting part 114B), the second conductor 120B (the projecting part 124B), and the conductor layer 130B (a superconducting contact). Note that as shown in FIG. 26, a physically integral film of the connection conductor 154B may be formed so as to cover the whole areas near the projecting parts 114B and 124B. In other words, the connection conductor 154B covers both the first conductor 110B and the second conductor 120B. In this way, the second conductor 120B and the conductor layer 130B are directly connected to each other on the second side 70B. Further, the first conductor 110B and the conductor layer 130B are directly connected to each other on the second side 70B. Note that since the projecting part 124B is disposed in the vicinity of the projecting part 114B, the second conductor 120B and the conductor layer 130B are connected to each other in the vicinity of the projecting part 114B.

When the quantum device 50 according to the second example embodiment is manufactured by angled evaporation, the first and second conductors 110 and 120 are evaporated by using the same resist mask 310. In this case, as will be described hereinafter, it is difficult to increase the interval (the distance in the Y-axis direction) between projecting parts 114A and 124A. Similarly, it is difficult to increase the interval (the distance in the Y-axis direction) between the projecting parts 114B and 124B.

The amount of a deviation (hereinafter also referred to as a shift amount) in the Y-axis direction between the position of the opening 312 and the position of the corresponding superconductor (the first and second conductors 110 and 120) in the evaporation processing step is examined. The distance in the Z-axis direction between the end of the resist mask 310 in the +Z direction (i.e., the upper surface thereof) and the surface of the conductor layer 130A (i.e., the height of the resist mask 310) is represented by h. In this case, the amount of a deviation (corresponding to the shift amount) in the Y-axis direction between the recessed part 314A and the projecting part 114A as viewed in the −Z direction is expressed as $h*\tan \theta 1$. Therefore, when the width of the recessed part 314A (the projecting parts 114A and 124A) in the Y-axis direction is represented by W, the distance L between the projecting parts 114A and 124A can be conceptually expressed as $L=2*h*\tan \theta 1-W$ under the condition that the thickness of the resist mask 310 is not taken into consideration. When L>0, the projecting parts 114A and 124A are physically separated from each other. Note that, in many cases, the height h of the resist mask 310 is 1 μm or shorter. Therefore, in the angled evaporation method, it is difficult to increase the shift amount ($h*\tan \theta 1$). Therefore, in order to separate the projecting parts 114A and 124A from each other, it is necessary to significantly reduce the width W of the recessed part 314A (the projecting parts 114A and 124A) (approximately to 1 μm or shorter). The same applies to the projecting parts 114B and 124B. Therefore, it is difficult to connect, on the first side 70A, the connection conductor 152A to the projecting part 114A while preventing the connection conductor 152A from being in contact with the projecting part 124A as in the case of the second example embodiment. Further, even if the projecting part 114A and the connection conductor 152A can be connected to each other, the contact area between them is very small. The same applies to the second side 70B.

In contrast, in the third example embodiment, the first conductor 110A and the second conductor 120A are connected to the conductor layer 130A through the connection conductor 154A on the first side 70A. As a result, there is no need to physical separate the projecting parts 114A and 124A from each other. That is, it is possible to connect the first conductor 110A to the conductor layer 130A by a superconducting contact(s) in a manner simpler than that in the second example embodiment. Further, it is possible to make the contact area between the projecting part 114A and the connection conductor 154A larger than that in the second example embodiment. Therefore, as in the case of a fourth example embodiment described later, it is possible to increase the contact area between the first conductor 110A (the projecting part 114A) and the connection conductor 154A, and thereby to reduce the electrical resistance between them. Therefore, it is possible to short-circuit the first conductor 110A and the conductor layer 130A through the connection conductor 154A more reliably. Therefore, the electric field generated in the spurious junction 80A corresponding to the oxide film 140A can be suppressed even more, so that the possibility that the spurious junction 80A can be disabled is increased even further. The same applies to the first conductor 110B and the second conductor 120B on the second side 70B.

Fourth Example Embodiment

Next, a fourth example embodiment will be described. The following descriptions and drawings are partially omitted and simplified as appropriate to clarify the explanation. Further, the same reference numerals (or symbols) are assigned to the same components/structure, and redundant descriptions thereof are omitted as appropriate. The shape and number of the projecting part(s) in the fourth example embodiment are different from those in the third example embodiment. Note that the connection between the first conductors 110 and the conductor layer 130, and the connection between the second conductors 120 and the conductor layer 130 are substantially the same as those in the third example embodiment, and therefore descriptions thereof are omitted.

FIG. 30 shows a quantum device 50 according to the fourth example embodiment. FIG. 30 is a plan view showing a part of the quantum device 50 according to the fourth example embodiment. Specifically, FIG. 30 shows a first side 70A of the quantum device 50 according to the fourth example embodiment. Note that the second side 70B may have a structure substantially the same as that in FIG. 30. Further, the XYZ-orthogonal coordinate system introduced in the second example embodiment is also introduced in the fourth example embodiment.

On the first side 70A, the first conductor 110A includes a plurality of projecting parts 116A (first projecting parts) projecting in the X-axis direction. Further, on the first side 70A, the second conductor 120A includes a plurality of projecting parts 126A (second projecting parts) projecting in the X-axis direction. Each of the plurality of projecting parts 116A projects so as not to be covered by the second conductor 120A deposited on the first conductor 110A. Note that the projecting parts 116A and 126A are alternately arranged (deposited) in the Y-axis direction. Therefore, the projecting parts 126A are disposed in the vicinity of adjacent projecting parts 116A. Further, the plurality of projecting parts 116A are formed so as to project toward the same sides (+X and –X directions in FIG. 30). Similarly, the plurality of projecting parts 126A are formed so as to project toward the same sides (+X and –X directions in FIG. 30).

The first conductor 110A includes projecting parts 116A1 to 116A5. Further, the second conductors 120 includes projecting parts 126A1 to 126A5. Further, the projecting part 126A1 is disposed on the Y-direction positive side of the projecting part 116A1. Further, the projecting part 116A2 is disposed on the Y-direction positive side of the projecting part 126A1. Further, the projecting part 126A2 is disposed on the Y-direction positive side of the projecting part 116A2. Further, the projecting part 116A3 is disposed on the Y-direction positive side of the projecting part 126A2. Further, the projecting part 126A3 is disposed on the Y-direction positive side of the projecting part 116A3. Further, the projecting part 116A4 is disposed on the Y-direction positive side of the projecting part 126A3. Further, the projecting part 126A4 is disposed on the Y-direction positive side of the projecting part 116A4. Further, the projecting part 116A5 is disposed on the Y-direction positive side of the projecting part 126A4. Further, the projecting part 126A5 is disposed on the Y-direction positive side of the projecting part 116A5.

Note that, as will be described later, similarly to the above-described other example embodiments, the projecting parts 116A and 126A (e.g., the projecting parts 116A1 and 126A1) are formed by using the same resist mask by the angled evaporation method. Therefore, the shapes of the projecting parts 116A and 126A correspond to each other (i.e., are the same as each other). Note that "shapes corresponding to each other" do not necessarily mean that one of the shapes exactly corresponds (i.e., exactly identical) to the other. For example, when the projecting part 126A1 is deposited on the projecting part 116A1, the shape of the projecting part 126A1 could be different from the shape of the projecting part 116A1. Further, since the projecting parts 116A and 126A are formed by using the same resist mask, the number of projecting parts 116A is equal to the number of projecting parts 126A. Note that the number of projecting parts 116A, i.e., the number of projecting parts 126A does not necessarily have to be five. It is possible to change the number of projecting parts 116A, i.e., the number of projecting parts 126A as appropriate by changing the shape of the resist mask from that shown in FIGS. 30 and 31 (which will be described later). Further, the shape of each of the plurality of projecting parts 116A (i.e., each of the projecting parts 116A1 to 116A5) may be different from one another. Similarly, the shape of each of the projecting parts 126A (i.e., each of the projecting parts 126A1 to 126A5) may be different from one another.

The connection conductor 156A is directly connected to the projecting part 116A, the second conductor 120A (the projecting part 126A), and the conductor layer 130A (a superconducting contact). Note that as shown in FIG. 30, a physically integral film of the connection conductor 156A may be formed so as to cover at least a part of each of the plurality of projecting parts 116A and the plurality of projecting parts 126A. In other words, the connection conductor 156A covers both the first conductor 110A (the projecting parts 116A) and the second conductor 120A (the projecting parts 126A). In the example shown in FIG. 30, the connection conductor 156A is formed from the projecting part 116A2 to the projecting part 126A5. In this way, the first conductor 110A and the conductor layer 130A are directly connected to each other on the first side 70A. Further, the second conductor 120A and the conductor layer 130A are directly connected to each other on the first side 70A. Note that since at least the projecting parts 126A are disposed in the vicinity of the projecting parts 116A, the second conductor 120A and the conductor layer 130A are connected to each other in the vicinity of the projecting parts 116A.

Note that the plurality of projecting parts 116A (and the plurality of projecting parts 126A) according to the fourth example embodiment are formed so that their lengths in the X-axis direction are longer than the lengths of the projecting parts 114 (and the projecting parts 124) in the X-axis direction according to the second and third example embodiments. Further, a plurality of projecting parts 116A (and a plurality of projecting parts 126A) are provided in the fourth example embodiment. In this way, it is possible to increase the contact area between the first conductor 110A and the connection conductor 156A. It is possible to increase the contact area between the first conductor 110A and the connection conductor 156A by increasing the number of projecting parts 116A (and the projecting parts 126A).

Note that in the case where the lengths of the projecting parts 116A and 126A are increased, if a resist mask including a resist bridge like the one shown in FIG. 18 is used, there is a risk that the structure of the resist bridge may become unstable. That is, when the superconductors (the first and second conductors 110 and 120) are formed, the resist bridge is formed at the position in the resist mask corresponding to the position indicated by an arrow D in FIG. 30. Note that this resist bridge has a cantilever structure. Further, the length (the span) of the beam of this cantilever extremely longer than the size of the fixed end thereof, so that the cantilever is unstable in terms of the strength. Therefore, it is extremely difficult to keep the shape of this resist bridge. Accordingly, it is possible, by a method that will be described hereinafter with reference to 31, to form the superconductors according to the fourth example embodiment without using the resist bridge.

Figure 31:
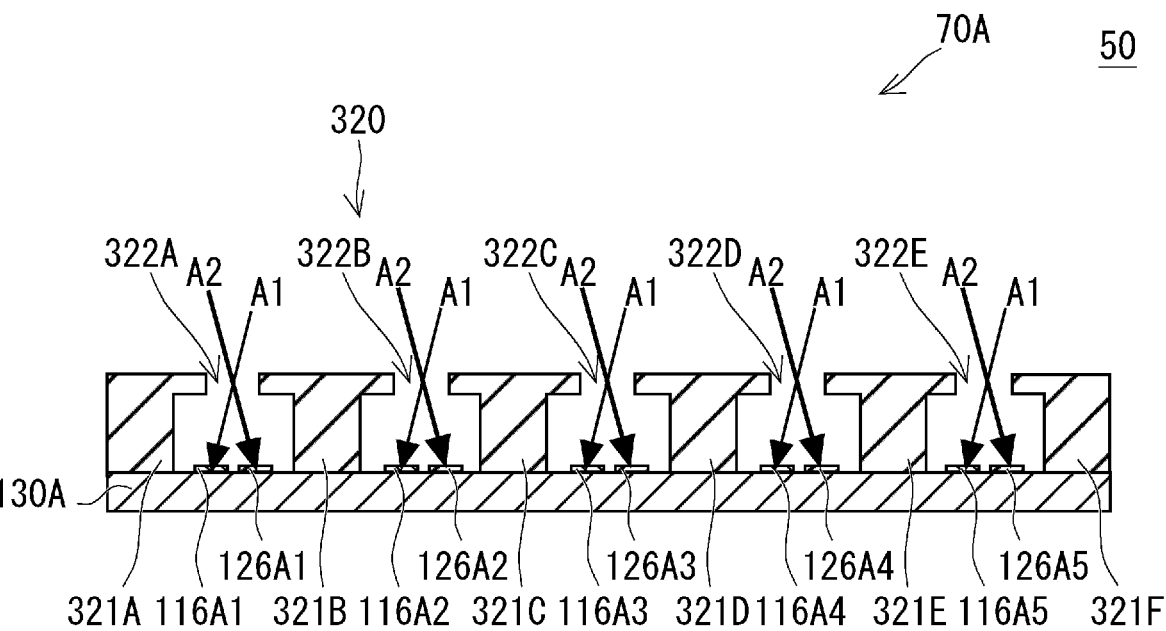
FIG. 31 is a diagram for explaining a method for manufacturing a quantum device according to the fourth example embodiment.

FIG. 31 is a diagram for explaining a method for manufacturing a quantum device 50 according to the fourth example embodiment. The quantum device 50 according to the fourth example embodiment is manufactured by substantially the same method as that according to the first example embodiment (FIGS. 17 to 24). However, the shape of the resist mask used in the fourth example embodiment is different from that of the resist mask used in the first example embodiment.

FIG. 31 corresponds to a cross-sectional diagram of FIG. 30 as viewed in the −X direction. A resist mask 320 is formed on the conductor layer 130A. Note that the resist mask 320 includes resist mask parts 321A to 321F arranged in the Y-axis direction with intervals therebetween. An opening 322A is provided between the resist mask parts 321A and 321B. An opening 322B is provided between the resist mask part 321B and 321C. An opening 322C is provided between the resist mask part 321C and 321D. An opening 322D is provided between the resist mask part 321D and 321E. An opening 322E is provided between the resist mask part 321E and 321F.

Similarly to FIG. 18, projecting parts 116A of a first conductor 110A are evaporated in a direction indicated by arrows A1 through the openings 322 in a first evaporation processing step. Specifically, a projecting part 116A1 of the first conductor 110A is evaporated between the resist mask parts 321A and 321B through the opening 322A. A projecting part 116A2 of the first conductor 110A is evaporated between the resist mask parts 321B and 321C through the opening 322B. A projecting part 116A3 of the first conductor 110A is evaporated between the resist mask parts 321C and 321D through the opening 322C. A projecting part 116A4 of the first conductor 110A is evaporated between the resist mask parts 321D and 321E through the opening 322D. A projecting part 116A5 of the first conductor 110A is evaporated between the resist mask parts 321E and 321F through the opening 322E.

Then, after the oxidation step (FIG. 19), similarly to FIG. 20, projecting parts 126A of a second conductor 120A are evaporated in a direction indicated by arrows A2 through the openings 322 in a second evaporation processing step. Specifically, a projecting part 126A1 of the second conductor 120A is evaporated on the Y-direction positive side of the projecting part 116A1 between the resist mask parts 321A and 321B through the opening 322A. A projecting part 126A2 of the second conductor 120A is evaporated on the Y-direction positive side of the projecting part 116A2 between the resist mask parts 321B and 321C through the opening 322B. A projecting part 126A3 of the second conductor 120A is evaporated on the Y-direction positive side of the projecting part 116A3 between the resist mask parts 321C and 321D through the opening 322C. A projecting part 126A4 of the second conductor 120A is evaporated on the Y-direction positive side of the projecting part 116A4 between the resist mask parts 321D and 321E through the opening 322D. A projecting part 126A5 of the second conductor 120A is evaporated on the Y-direction positive side of the projecting part 116A5 between the resist mask parts 321E and 321F through the opening 322E.

It is possible to dispose each pair of neighboring projecting parts 116A and 126A apart from each other by adjusting the size of the opening 322 and the height of the resist mask parts 321. Further, in FIG. 30, in practice, a space corresponding to an area where the resist mask part 321B had been formed is provided between the projecting part 126A1 and the projecting part 116A2. The same is true between the projecting parts 126A2 and 116A3, between the projecting parts 126A3 and 116A4, and between the projecting parts 126A4 and 116A5.

If the contact area between the first conductor 110A (the projecting part 114A) and the connection conductor 154A is too small on the first side 70A as in the third example embodiment (FIG. 29), the electrical resistance between them may become large, thus raising a risk that it could not function as a superconducting contact. In this case, since the contact area between the second conductor 120A and the conductor layer 130A is large, there is a possibility that a current flows through the first conductor 110A which constitutes the Josephson junction 100, the oxide film 140A, the second conductor 120A, the connection conductor 154A, and the conductor layer 130A. In this case, the electric field generated in the spurious junction 80A corresponding to the oxide film 140A increases, so that there is a possibility that the spurious junction 80A may not be completely disabled.

In contrast, in the fourth example embodiment, since the contact area between the first conductor 110A (the projecting parts 116A) and the connection conductor 156A can be increased on the first side 70A, the electrical resistance between them can be reduced. Therefore, the first conductor 110A and the conductor layer 130A can be short-circuited through the connection conductor 156A more reliably. Therefore, since the electric field generated in the spurious junction 80A corresponding to the oxide film 140A can be suppressed, the spurious junction 80A can be disabled. Therefore, the quantum device 50 according to the fourth example embodiment can suppress the deterioration of the performance thereof even more as compared with the quantum device according to the third example embodiment.

Fifth Example Embodiment

Next, a fifth example embodiment will be described. The following descriptions and drawings are partially omitted and simplified as appropriate to clarify the explanation. Further, the same reference numerals (or symbols) are assigned to the same components/structure, and redundant descriptions thereof are omitted as appropriate.

FIG. 32 shows a quantum device 52 according to the fifth example embodiment. FIG. 32 is a plan view of the quantum device 52 according to the fifth example embodiment. The quantum device 52 according to the fifth example embodiment is one that is obtained by manufacturing a structure corresponding to that of the quantum device 50 according to the first example embodiment by a bridge-less-type manufacturing method (the second comparative example).

The quantum device 52 according to the fifth example embodiment includes a plurality of first conductors 210 (210A and 210B), a plurality of second conductors 220 (220A and 220B), and conductor layers 230 (230A and 230B) that constitute a superconducting circuit. The first conductors 210, the second conductors 220, and the conductor layers 230 are deposited on a substrate 60. The structures of the first conductors 210, the second conductors 220, and the conductor layers 230 are substantially the same as those in the third comparative example unless otherwise specified, and therefore descriptions thereof are omitted as appropriate.

Note that in the fifth example embodiment, an XYZ-orthogonal coordinate system is introduced for the sake of explanation of the quantum device 52. A plane parallel to the plane on which the conductor layers 230 and superconductors and the like are mounted on the substrate 60 is defined as an XY-plane, and the direction perpendicular to this plane is defined as a Z-axis direction. Further, a direction along the XY-plane is defined as an XY-direction. The leftward direction in FIG. 32 is defined as a +Y direction and the downward direction in FIG. 32 is defined as a +X direction. Note that the X- and Y-directions are defined just for explanatory purposes and do not indicate the directions in which the actual quantum device 52 is disposed when it is used. Further, the position of the origin of the XYZ-orthogonal coordinate system is arbitrarily determined. The +Z direction corresponds to the direction from the back of the paper toward the front thereof in FIG. 32. Further, the direction from the Josephson junction 100 toward the first side 72A is defined as a +Y direction, and the direction from the Josephson junction 100 toward the second side 72B is defined as a +X direction. The above-described matters also apply to other bridge-less-type example embodiments described later.

The first conductors 210 correspond to the first conductors 2 shown in FIG. 1. The first conductors 210 are deposited on the conductor layer 230. Note that the conductor layers 230 correspond to the conductor layers 6 shown in FIG. 1. Further, the second conductors 220 correspond to the second conductors 4 shown in FIG. 1. The second conductors 220 are deposited on the first conductors 210. The first conductors 210, the second conductors 220, and the conductor layers 230 are formed of superconducting materials. For example, the first and second conductors 210 and 220 are formed of aluminum (Al). Further, for example, the conductor layers 230 (third conductors) are formed of niobium (Nb). However, the first and second conductors 210 and 220 do not necessarily have to be formed of aluminum (Al). Further, the conductor layers 230 do not necessarily have to be formed of niobium (Nb).

Further, an oxide film (AlOx) is formed between the first and second conductors 210 and 220. This oxide film corresponds to the oxide film 8 shown in FIG. 1. Further, a Josephson junction 200 is formed of a part of the first conductors 210 (210A) (a first conductor part 210Aa), a part of the second conductors 220 (220B) (a second conductor part 220Ba), and the oxide film (AlOx). The Josephson junction 200 corresponds to the Josephson junction 10 shown in FIG. 1. The structure of the Josephson junction 200 is substantially the same as those in the third comparative example and other example embodiments, and therefore the description thereof is omitted as appropriate.

Further, a narrow part 212A is formed so as to extend in the Y-axis direction in the vicinity of the Josephson junction 200 of the first conductor 210A. Further, a narrow part 222B is formed so as to extend in the X-axis direction in the vicinity of the Josephson junction 200 of the second conductor 220B. Further, the Josephson junction 200 is formed as the narrow parts 212A and 222B cross each other. Note that no narrow part is formed in the first conductor 210B. Further, no narrow part is formed in the second conductor 220A.

Similarly to the third comparative example, the first conductor 210A is deposited on the substrate 60 and the conductor layer 230A on the first side 72A. Further, the second conductor 220A is deposited on the first conductor 210A and the conductor layer 230A. Note that in the fifth example embodiment, an oxide film (NbOx) is formed on a part of the surface of the conductor layer 230A that is in contact with the first conductor 210A or the second conductor 220A. Further, an oxide film (AlOx) is formed on a part of the surface of the first conductor 210A that is not in contact with the substrate 60 nor with the conductor layer 230A. That is, the oxide film is formed on a part of the surface of the first conductor 210A that is in contact with second conductor 220A or 220B.

Meanwhile, similarly to the third comparative example, the first conductor 210B is deposited on the substrate 60 and the conductor layer 230B on the second side 72B. Further, the second conductor 220B is deposited on the substrate 60 and the first conductor 210B. Note that a second conductor part 220Ba, which is a part of the narrow part 222B of the second conductor 220B, is deposited on a first conductor part 210Aa, which is a part of the narrow part 212A of the first conductor 210A, with the oxide film interposed therebetween. The Josephson junction 200 is formed by depositing the second conductor part 220Ba on the first conductor part 210Aa with the oxide film (a tunnel barrier layer) interposed therebetween. Note that in the fifth example embodiment, an oxide film (NbOx) is formed on a part of the surface of the conductor layer 230B that is in contact with the first conductor 210B or the second conductor 220B. Further, an oxide film (AlOx) is formed on a part of the surface of the first conductor 210B that is not in contact with the substrate 60 nor with the conductor layer 230B. That is, the oxide film (AlOx) is formed on a part of the surface of the first conductor 210B that is in contact with the second conductor 220B.

Further, the quantum device 52 according to the fifth example embodiment further includes connection conductors 250 (250A and 250B). The connection conductors 250 are formed of a superconducting material. The connection conductors 250 may be formed of, for example, aluminum (Al). The connection conductor 250A is directly connected to the first conductor 210A and the conductor layer 230A on the first side 72A. As a result, the connection conductor 250A connects the first conductor 210A to the conductor layer 230A on the first side 72A (a superconducting contact). Note that in the fifth example embodiment, the connection conductor 250A is not connected to the second conductor 220A on the first side 72A.

Further, the connection conductor 250B is directly connected to the second conductor 220B and the conductor layer 230B on the second side 72B. As a result, the connection conductor 250B connects the second conductor 220B to the conductor layer 230B on the second side 72B (a superconducting contact). Note that in the fifth example embodiment, the connection conductor 250B is not connected to the first conductor 210B on the second side 72B.

Note that on the first side 72A, the first conductor 210A includes a projecting part 214A (a first projecting part) projecting in the +X direction. Further, on the first side 72A, the second conductor 220A includes a projecting part 224A projecting in the +X direction. The projecting part 214A projects so as not to be covered by the second conductor 220A deposited on the first conductor 210A. Note that the projecting part 224A is disposed in the vicinity of the projecting part 214A. Note that since the first conductor 210A and the second conductor 220A are formed by using the same resist mask while fixing the resist mask to the substrate 60 as described above, the shapes and numbers of projecting parts 214A and those of projecting parts 224A correspond to each other (i.e., are the same as each other).

The connection conductor 250A is directly connected to the projecting part 214A and the conductor layer 230A (a superconducting contact). As a result, the first conductor 210A and the conductor layer 230A are directly connected to each other on the first side 72A. Note that in the fifth example embodiment, the connection conductor 250A is not connected to the projecting part 224A.

Further, on the second side 72B, the first conductor 210B includes a projecting part 214B projecting in the +Y direction. Further, on the second side 72B, the second conductor 220B includes a projecting part 224B projecting in the +Y direction. The projecting part 214B projects beyond the first conductor 2101B, on which the second conductor 220B is deposited, in the +Y direction. Note that the projecting part 224B is disposed in the vicinity of the projecting part 214B. Note that since the first conductor 210B and the second conductor 220B are formed by using the same resist mask while fixing the resist mask to the substrate 60 as described above, the shapes and numbers of projecting parts 214B and those of projecting parts 224B correspond to each other (i.e., are the same as each other).

The connection conductor 250B is directly connected to the projecting part 224B and the conductor layer 230B (a superconducting contact). As a result, the second conductor 220B and the conductor layer 230B are directly connected to each other on the second side 72B. Note that in the fifth example embodiment, the connection conductor 250B is not connected to the projecting part 214B.

Figure 33:
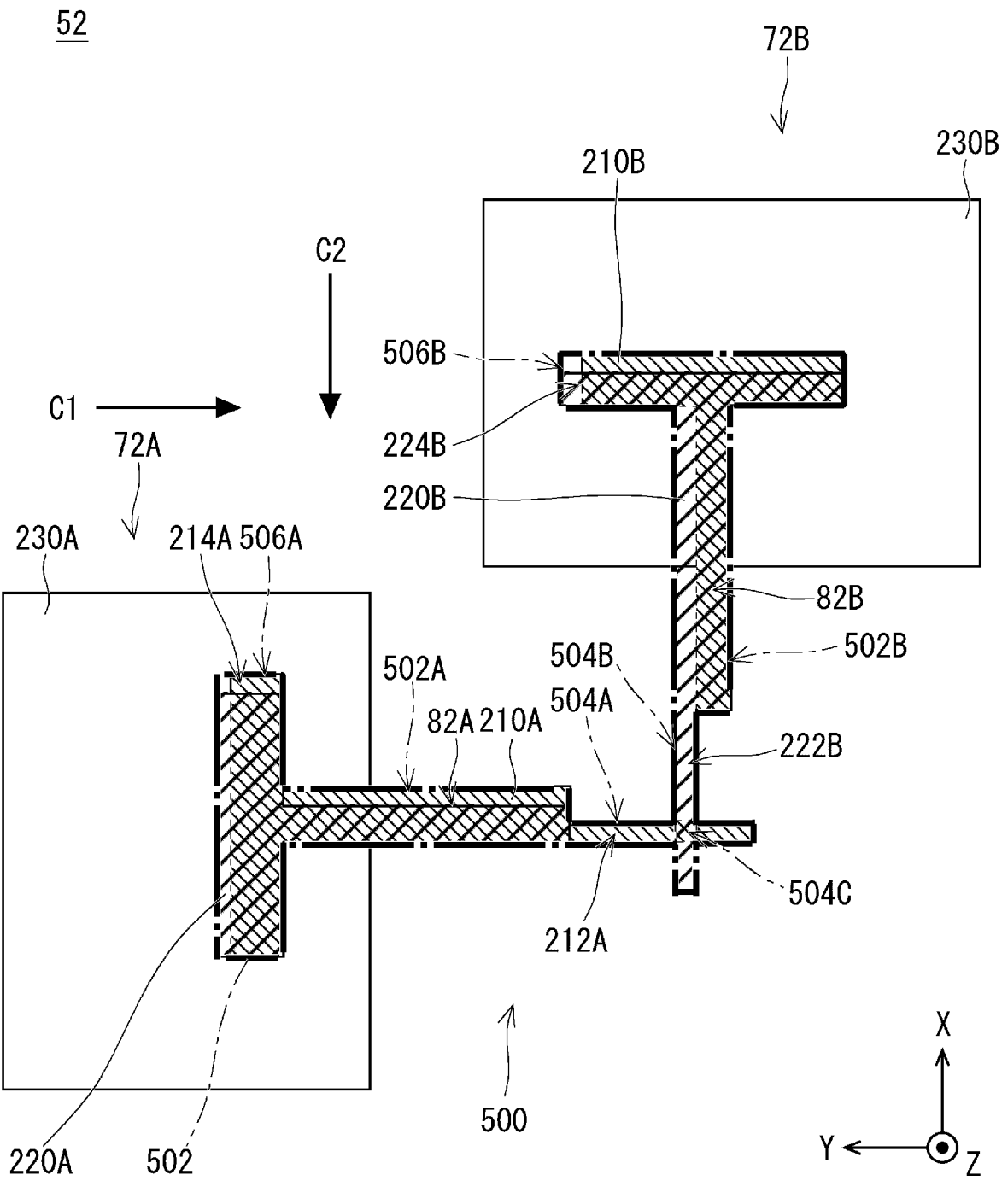
FIG. 33 is a diagram for explaining a method for manufacturing a quantum device according to the fifth example embodiment.

FIG. 33 is a diagram for explaining a method for manufacturing a quantum device 52 according to the fifth example embodiment. The quantum device 52 according to the fifth example embodiment is manufactured by substantially the same method as that according to the third comparative example (FIGS. 13 to 15). However, in the fifth example embodiment, similarly to the first example embodiment, the oxide film removal step, which is performed in other example embodiments before the first conductors 210 are formed, is not performed.

In FIG. 33, openings 502 (502A and 502B) of the resist mask 500, which are used to form the first and second conductors 210 and 220, are indicated by thick dashed lines. In practice, in FIG. 33, the areas other than the areas corresponding to the openings 502 are covered by the resist mask 500. The opening 502A is formed on the first side 72A and the opening 502B is formed on the second side 72B.

Further, the opening 502A includes a narrow hole part 504A that is formed so as to extend in the Y-axis direction and has a narrow width in the X-axis direction. The narrow hole part 504A corresponds to the opening part 31a shown in FIG. 13. Further, the opening 502B includes a narrow hole part 504B that is formed so as to extend in the X-axis direction and has a narrow width in the Y-axis direction. The narrow hole part 504B corresponds to the opening part 31b shown in FIG. 13. The narrow hole parts 504A and 504b intersect each other at an intersection part 504C. Therefore, in the fifth example embodiment, the openings 502A and 502B are integrally formed. Note that the shape of the narrow hole part 504A conforms to the shape of the narrow part 212A in the XY-direction, and the shape of the narrow hole part 504B conforms to the shape of the narrow part 222B in the XY-direction.

Further, a recessed part 506A recessed in the +X direction is provided in a part of the opening 502A corresponding to the conductor layer 230A. The shape of the recessed part 506A conforms to the shape of the projecting parts 214A and 224A. Further, a recessed part 506B recessed in the +Y direction is provided in a part of the opening 502B corresponding to the conductor layer 230B. The shape of the recessed part 506B conforms to the shape of the projecting parts 214B and 224B.

In the fifth example embodiment, similarly to the first example embodiment, after the conductor layer deposition step (FIG. 17), a resist mask 500 is formed on the substrate 60 in a resist mask formation step (FIG. 18). Then, in a first evaporation processing step (FIG. 18), as indicated by an arrow C1, the first conductors 210 are evaporated in a direction inclined from the −Z direction to the +Y direction by an angle θ2 as viewed from the substrate 60 side. Specifically, the first conductor 210A is evaporated through the opening 502A. Further, the first conductor 210B is evaporated through the opening 502B. In this process, a projecting part 214A having a shape conforming to that of the recessed part 506A is formed. Further, a projecting part 214B having a shape conforming to that of the recessed part 506B is formed.

Note that in the first evaporation processing step, the superconducting material does not reach the bottom part (i.e., the substrate 60 and the like) of the opening 502 in the vicinity of the wall thereof on the Y-direction positive side because the superconducting material is blocked by this wall. Therefore, a film of the first conductor 210 formed in the first evaporation processing step is formed in a place away from the wall on the Y-direction positive side of the opening 502 in a plan view (a view in the −Z direction). Therefore, no film of the first conductor 210 is formed at the position of the projecting part 224B corresponding to the recessed part 506B.

Note that the width of the narrow hole part 504B in the Y-axis direction is narrow. Therefore, as described above with reference to FIG. 14, the superconducting material does not reach the bottom part (the substrate 60) corresponding to the narrow hole part 504B in the first evaporation processing step. Therefore, no conductor layer corresponding to the narrow hole part 504B is formed in the first evaporation processing step. In contrast, the narrow hole part 504A extends in the Y-axis direction. Therefore, the superconducting material reaches the bottom part (the substrate 60) corresponding to the narrow hole part 504A, so that the narrow part 212A is formed in the first evaporation processing step.

Then, after the oxidation step (FIG. 19), in a second evaporation processing step (FIG. 20), as indicated by an arrow C2, second conductors 220 are evaporated in a direction inclined from the −Z direction to the +X direction by an angle θ2 as viewed from the substrate 60 side. Specifically, the second conductor 220A is evaporated through the opening 502A. Further, the second conductor 220B is evaporated through the opening 502B. In this process, a projecting part 224A having a shape conforming to that of the recessed part 506A is formed. Further, a projecting part 224B having a shape conforming to that of the recessed part 506B is formed.

Note that in the second evaporation processing step, the superconducting material does not reach the bottom part (i.e., the substrate 60 and the like) of the opening 502 in the vicinity of the wall thereof on the X-direction positive side because the superconducting material is blocked by this wall. Therefore, a film of the second conductor 220 formed in the second evaporation processing step is formed in a place away from the wall on the X-direction positive side of the opening 502 in the plan view. Therefore, since no film of the second conductor 220 is formed at the position of the projecting part 214A, the projecting part 214A is not covered by the second conductor 220.

Note that the width of the narrow hole part 504A in the X-axis direction is narrow. Therefore, as described above with reference to FIG. 14, the superconducting material does not reach the bottom part (the substrate 60) corresponding to the narrow hole part 504A in the second evaporation processing step. Therefore, no conductor layer corresponding to the narrow hole part 504A is formed in the second evaporation processing step. In contrast, the narrow hole part 504B extends in the X-axis direction. Therefore, the superconducting material reaches the bottom part (the substrate 60) corresponding to the narrow hole part 504B, so that the narrow part 222B is formed in the second evaporation processing step.

Next, after the resist mask 500 is removed in the lift-off step (FIG. 21), a resist mask for forming connection conductors 250 is formed (FIG. 22). Note that in the resist mask for forming the connection conductors 250, openings are provided at positions that are corresponding to, in the Z-axis direction, the place where the connection conductors 250 are formed. Then, after the oxide film removal step (FIG. 22), the connection conductors 250 are formed in a connection conductor evaporation step (FIG. 23). As a result, the projecting part 214A (the first conductor 210A) and the conductor layer 230A are connected to each other by the connection conductor 250A on the first side 72A. Further, the projecting part 224B (the second conductor 220B) and the conductor layer 230B are connected to each other by the connection conductor 250B on the second side 72B.

Since the quantum device 52 according to the fifth example embodiment is formed as described above, it provides substantially the same advantageous effects as those of the quantum device 50 according to the second example embodiment. That is, the first conductor 210A (the projecting part 214A) to the conductor layer 230A on the first side 72A, and the second conductor 220B is connected to the conductor layer 230B on the second side 72B. That is, in the fifth example embodiment, the first conductor 210A constituting the Josephson junction 200 is connected to the conductor layer 230A through the connection conductor 250A. Further, the second conductor 220B constituting the Josephson junction 200 is connected to the conductor layer 230B through the connection conductor 250B. Further, in the fifth example embodiment, the second conductor 220A, which does not constitute the Josephson junction 200, is not connected to the connection conductor 250A. Similarly, the first conductor 210B, which does not constitute the Josephson junction 200, is not connected to the connection conductor 250B. Therefore, similarly to the second example embodiment, the possibility that the spurious junction 82 can be disabled is high in the fifth example embodiment. Therefore, the quantum device 52 according to the fifth example embodiment can further suppress the deterioration of the coherence (the performance).

Note that since the Josephson junction 200 is formed by the angled evaporation method in the fifth example embodiment, there is a concern about substantially the same problem as that in the second example embodiment, i.e., the problem that could be caused by the fact that the shift amount is small. That is, because the shift amount described above in the second example embodiment is small, the distance in the X-axis direction between the projecting part 224A formed in the second evaporation processing step and the wall part in the +X direction of the recessed part 506A is very short. Therefore, the area of the projecting part 214A in the XY-direction not covered by the second conductors 220 is very small. Accordingly, it is difficult to connect the connection conductor 250A to the projecting part 214A while preventing the connection conductor 250A from being in contact with the projecting part 224A (the second conductors 220). Further, even if the projecting part 214A and the connection conductor 250A can be connected to each other, the contact area between them is very small.

Sixth Example Embodiment

Next, a sixth example embodiment will be described. The following descriptions and drawings are partially omitted and simplified as appropriate to clarify the explanation. Further, the same reference numerals (or symbols) are assigned to the same components/structure, and redundant descriptions thereof are omitted as appropriate. The structure of the projecting part of the sixth example embodiment is different from that in the fifth example embodiment.

Figure 34:
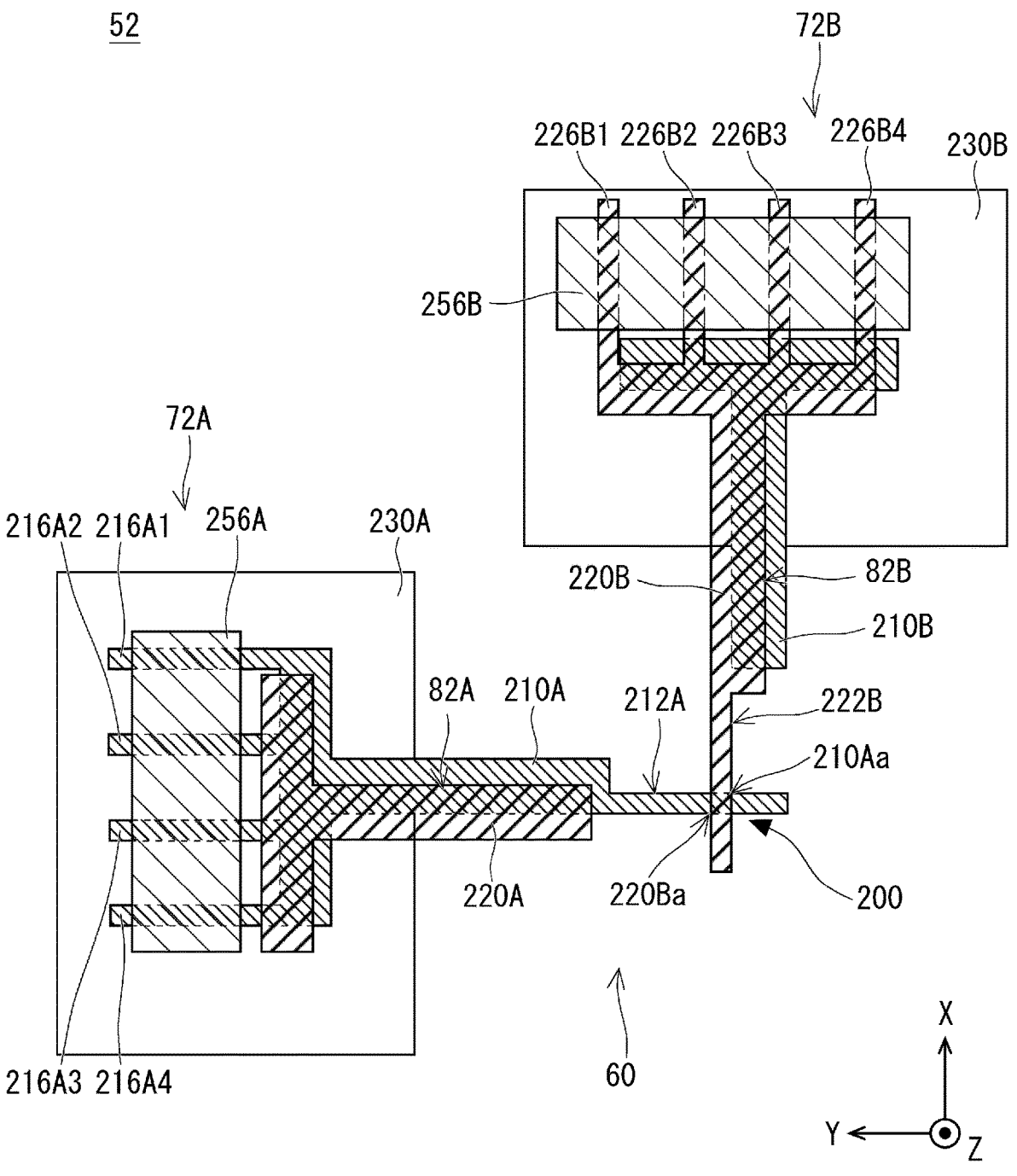
FIG. 34 shows a quantum device according to a sixth example embodiment.

FIG. 34 shows a quantum device 52 according to the sixth example embodiment. FIG. 34 is a plan view of the quantum device 52 according to the sixth example embodiment. The quantum device 52 according to the sixth example embodiment includes a plurality of first conductors 210 (210A and 210B), a plurality of second conductors 220 (220A and 220B), and conductor layers 230 (230A and 230B) that constitute a superconducting circuit. The first conductors 210, the second conductors 220, and the conductor layers 230 are deposited on a substrate 60. The structures of the first conductors 210, the second conductors 220, and the conductor layers 230 are substantially the same as those in the fifth example embodiment unless otherwise specified, and therefore descriptions thereof are omitted as appropriate.

Further, the quantum device 52 according to the sixth example embodiment further includes connection conductors 256 (256A and 256B). The connection conductors 256 are formed of a superconducting material. The connection conductors 256 may be formed of, for example, aluminum (Al). The connection conductor 256A is directly connected to the first conductor 210A and the conductor layer 230A on the first side 72A. As a result, the connection conductor 256A connects the first conductor 210A to the conductor layer 230A on the first side 72A (a superconducting contact). Note that in the sixth example embodiment, the connection conductor 256A is not connected to the second conductor 220A on the first side 72A.

Further, the connection conductor 256B is directly connected to the second conductor 220B and the conductor layer 230B on the second side 72B. As a result, the connection conductor 256B connects the second conductor 220B to the conductor layer 230B on the second side 72B (a superconducting contact). Note that in the sixth example embodiment, the connection conductor 256B is not connected to the first conductor 210B on the second side 72B.

Note that on the first side 72A, the first conductor 210A includes a plurality of projecting parts 216A (first projecting parts) projecting in the +Y direction. Each of the plurality of projecting parts 216A projects so as not to be covered by the second conductor 220A deposited on the first conductor 210A. FIG. 34 shows four projecting parts 216A1 to 216A4. However, the number of projecting parts 216A is not limited to four and may be any number equal to or greater than one. The projecting part 216A2 is disposed on the X-direction negative side of the projecting part 216A1. The projecting part 216A3 is disposed on the X-direction negative side of the projecting part 216A2. The projecting part 216A4 is disposed on the X-direction negative side of the projecting part 216A3. Note that in contrast to the fourth example embodiment, no projecting part related to the second conductor 220A is formed in the vicinity of the projecting parts 216A. Note that similarly to the narrow part 212A, each of the plurality of projecting parts 216A is formed so as to extend in the Y-axis direction. That is, each of the projecting parts 216A is formed so that its width in the X-axis direction is narrow.

The connection conductor 256A is directly connected to the projecting parts 216A and the conductor layer 230A (a superconducting contact). As a result, the first conductor 210A and the conductor layer 230A are directly connected to each other on the first side 72A. Note that as shown in FIG. 34, a physically integral film of the connection conductor 256A may be formed so as to cover at least a part of each of the plurality of projecting parts 216A1 to 216A4. Note that since no projecting part related to the second conductor 220A is formed in the vicinity of the projecting parts 216A, the connection conductor 256A is not in contact with the second conductor 220A.

Note that the plurality of projecting parts 216A according to the sixth example embodiment are formed so that their lengths in the +Y direction are longer than the length in the +X direction of the part of the projecting part 214A not covered by the second conductors 220 according to the fifth example embodiment. Further, a plurality of projecting parts 216A are provided in the sixth example embodiment. In this way, it is possible to increase the contact area between the first conductor 210A and the connection conductor 256A as compared with that in the fifth example embodiment.

Further, on the second side 72B, the second conductor 220B includes a plurality of projecting parts 226B (second projecting parts) projecting in the +X direction. Each of the plurality of projecting parts 226B projects beyond the first conductors 2101B, on which the second conductors 220B are deposited. FIG. 34 shows four projecting parts 226B1 to 226B4. However, the number of projecting parts 226B is not limited to four and may be any number equal to or greater than one. The projecting part 226B2 is disposed on the Y-direction negative side of the projecting part 226B1. The projecting part 226B3 is disposed on the Y-direction negative side of the projecting part 226B2. The projecting part 226B4 is disposed on the Y-direction negative side of the projecting part 226B3. Note that in contrast to the fourth example embodiment, no projecting part related to the first conductor 210B is formed in the vicinity of the projecting part 226B. Note that similarly to the narrow part 222B, each of the plurality of projecting parts 226B is formed so as to extend in the X-axis direction. That is, each of the projecting parts 226B is formed so that its width in the Y-axis direction is narrow.

The connection conductor 256B is directly connected to the projecting part 226B and the conductor layer 230B (a superconducting contact). As a result, the second conductor 220B and the conductor layer 230B are directly connected to each other on the second side 72B. Note that as shown in FIG. 34, a physically integral film of the connection conductor 256B may be formed so as to cover at least a part of each of the plurality of projecting parts 226B1 to 226B4. Note that since no projecting part related to the first conductor 210B is formed in the vicinity of the projecting parts 226B, the connection conductor 256B is not in contact with the first conductor 210B.

Note that the plurality of projecting parts 226B according to the sixth example embodiment are formed so that their lengths in the +X direction are longer than the length in the +Y direction of the part of the projecting part 224B projecting beyond the first conductors 210 according to the fifth example embodiment. Further, a plurality of projecting parts 226B are provided in the sixth example embodiment. As a result, it is possible to increase the contact area between the second conductor 220B and the connection conductor 256B.

Figure 35:
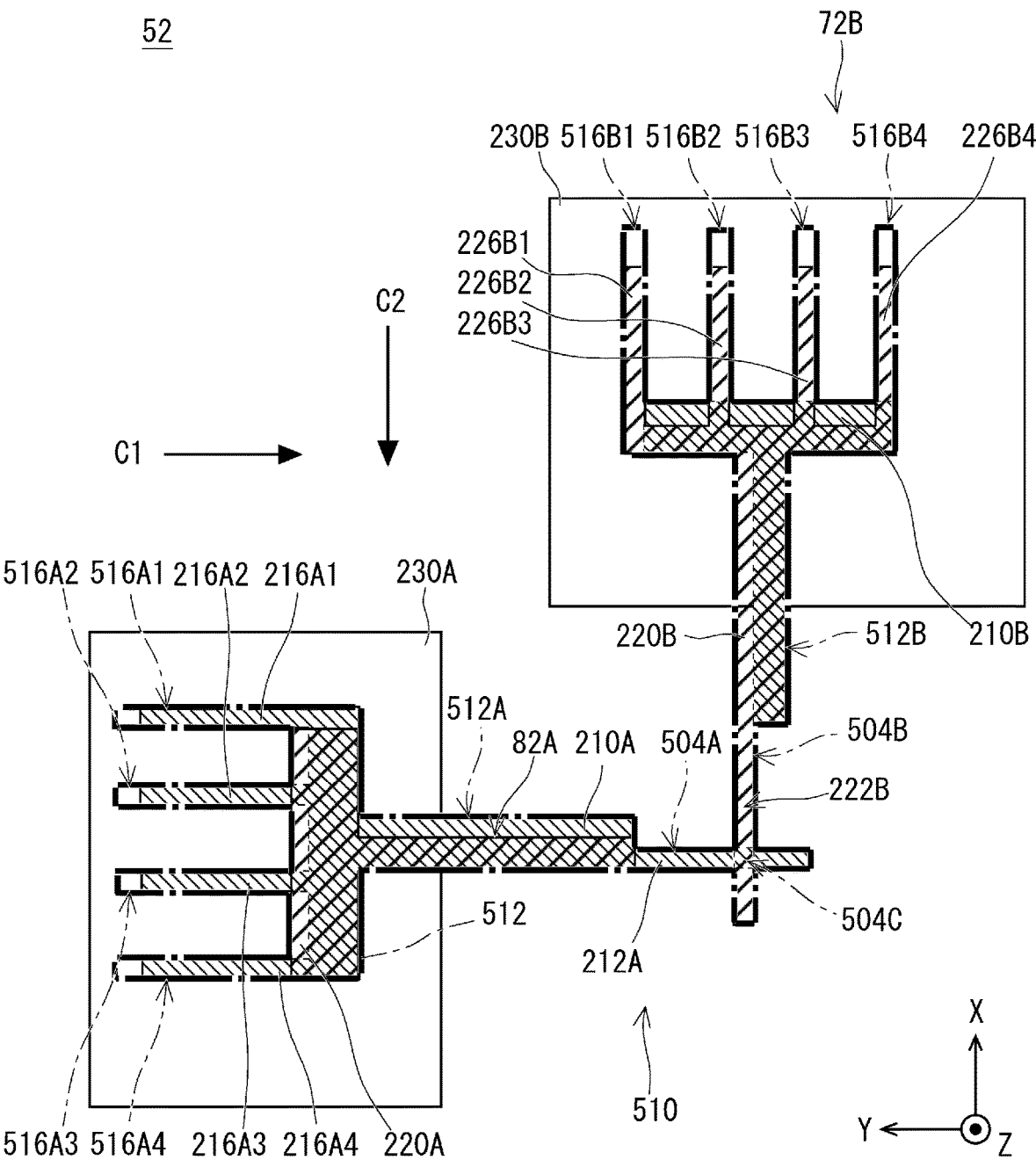
FIG. 35 is a diagram for explaining a method for manufacturing a quantum device according to the sixth example embodiment.

FIG. 35 is a diagram for explaining a method for manufacturing a quantum device 52 according to the sixth example embodiment. The quantum device 52 according to the sixth example embodiment is manufactured by substantially the same method as that according to the fifth example embodiment.

In FIG. 35, openings 512 (512A and 512B) of the resist mask 510, which are used to form the first and second conductors 210 and 220, are indicated by thick dashed lines. In practice, in FIG. 35, the areas other than the areas corresponding to the openings 512 are covered by the resist mask 510. The opening 512A is formed on the first side 72A and the opening 512B is formed on the second side 72B.

Further, the opening 512A includes a narrow hole part 504A that is formed so as to extend in the Y-axis direction and has a narrow width in the X-axis direction. Further, the opening 512B includes a narrow hole part 504B that is formed so as to extend in the X-axis direction and has a narrow width in the Y-axis direction. The narrow hole parts 504A and 504b intersect each other at the intersection part 504C. Note that the shape of the narrow hole part 504A conforms to the shape of the narrow part 212A in the XY-direction, and the shape of the narrow hole part 504B conforms to the shape of the narrow part 222B in the XY-direction.

Further, a plurality of recessed parts 516A recessed in the +Y direction are provided in a part of the opening 512A corresponding to the conductor layer 230A. The shape of each of the recessed parts 516A conforms to the shape of a respective one of the projecting parts 216A. Therefore, each of the recessed parts 516A is formed so as to extend in the Y-axis direction, and is formed so that its width in the X-axis direction is narrow. The opening 512A includes recessed parts 516A1 to 516A4 each of which is recessed in the +Y direction. The recessed part 516A2 is disposed on the X-direction negative side of the recessed part 516A1. The recessed part 516A3 is disposed on the X-direction negative side of the recessed part 516A2. The recessed part 516A4 is disposed on the X-direction negative side of the recessed part 516A3. Further, the shapes of the recessed parts 516A1 to 516A4 conform to the shapes of the projecting parts 216A1 to 216A4, respectively.

Further, recessed parts 516B recessed in the +X direction are provided in a part of the opening 512B corresponding to the conductor layer 230B. The shape of each of the recessed parts 516B conforms to the shape of a respective one of the projecting part 226B. Therefore, each of the recessed parts 516B is formed so as to extend in the X-axis direction, and is formed so that its width in the Y-axis direction is narrow. The opening 512B includes recessed parts 516B1 to 516B4 each of which is recessed in the +X direction. The recessed part 516B2 is disposed on the Y-direction negative side of the recessed part 516B1. The recessed part 516B3 is disposed on the Y-direction negative side of the recessed part 516B2. The recessed part 516B4 is disposed on the Y-direction negative side of the recessed part 516B3. Further, the shapes of the recessed parts 516B1 to 516B4 conform to the shapes of the projecting parts 226B1 to 226B4, respectively.

In the sixth example embodiment, similarly to the fifth example embodiment, after the conductor layer deposition step (FIG. 17), a resist mask 510 is formed on the substrate 60 in a resist mask formation step (FIG. 18). Then, in a first evaporation processing step (FIG. 18), as indicated by an arrow C1, the first conductors 210 are evaporated in a direction inclined from the −Z direction to the +Y direction by an angle θ2 as viewed from the substrate 60 side. Specifically, the first conductor 210A is evaporated through the opening 512A. Further, the first conductor 210B is evaporated through the opening 512B.

Note that since the width of the narrow hole part 504B in the Y-axis direction is narrow as described above in the fifth example embodiment, no conductor layer corresponding to the narrow hole part 504B is formed in the first evaporation processing step. Meanwhile, since the narrow hole part 504A extends in the Y-axis direction, the narrow part 212A is formed in the first evaporation processing step.

Further, similarly to the narrow hole part 504B, since the widths of the recessed parts 516B in the Y-axis direction are narrow, the superconducting material does not reach the bottom parts corresponding to the recessed parts 516B (i.e., the conductor layer 230B) in the first evaporation processing step. Therefore, no conductor layer (no projecting part) corresponding to the recessed parts 516B is formed in the first evaporation processing step. Meanwhile, similarly to the narrow hole part 504A, since the recessed parts 516A extend in the Y-axis direction, the superconducting material reaches the bottom parts corresponding to the recessed parts 516A (i.e., the conductor layer 230A) in the first evaporation processing step. Therefore, the projecting parts 216A corresponding to the recessed parts 516A are formed in the first evaporation processing step.

Then, after the oxidation step (FIG. 19), in a second evaporation processing step (FIG. 20), as indicated by an arrow C2, second conductors 220 are evaporated in a direction inclined from the −Z direction to the +X direction by an angle θ2 as viewed from the substrate 60 side. Specifically, the second conductor 220A is evaporated through the opening 512A. Further, the second conductor 220B is evaporated through the opening 512B.

Note that as described above in the fifth example embodiment, since the width of the narrow hole part 504A in the X-axis direction is narrow, no conductor layer corresponding to the narrow hole part 504A is formed in the second evaporation processing step. Meanwhile, since the narrow hole part 504B extends in the X-axis direction, the narrow part 222B is formed in the second evaporation processing step.

Further, similarly to the narrow hole part 504A, since the widths of the recessed parts 516A in the X-axis direction are narrow, the superconducting material does not reach the bottom parts corresponding to the recessed parts 516A (i.e., the conductor layer 230A) in the second evaporation processing step. Therefore, no conductor layer (no projecting part) corresponding to the recessed parts 516A is formed in the second evaporation processing step. Meanwhile, similarly to the narrow hole part 504B, since the recessed parts 516B extend in the X-axis direction, the superconducting material reaches the bottom parts corresponding to the recessed parts 516B (i.e., the conductor layer 230B) in the second evaporation processing step. Therefore, the projecting parts 226B corresponding to the recessed parts 516B are formed in the second evaporation processing step.

Next, after the resist mask 510 is removed in the lift-off step (FIG. 21), a resist mask for forming connection conductors 256 is formed (FIG. 22). Note that in the resist mask for forming the connection conductors 256, openings are provided at positions that are corresponding to, in the Z-axis direction, the place where the connection conductors 256 are formed. Then, after the oxide film removal step (FIG. 22), the connection conductors 256 are formed in a connection conductor evaporation processing step (FIG. 23). As a result, the projecting parts 216A (the first conductor 210A) and the conductor layer 230A are connected to each other by the connection conductor 256A on the first side 72A. Further, the projecting part 226B (the second conductor 220B) and the conductor layer 230B are connected to each other by the connection conductor 256B on the second side 72B.

Since the quantum device 52 according to the sixth example embodiment is formed as described above, it provides substantially the same advantageous effects as those of the quantum device 50 according to the second example embodiment. That is, the first conductor 210A (the projecting parts 216A) is connected to the conductor layer 230A on the first side 72A, and the second conductor 220B (the projecting part 226B) is connected to the conductor layer 230B on the second side 72B. That is, in the sixth example embodiment, the first conductor 210A constituting the Josephson junction 200 is connected to the conductor layer 230A through the connection conductor 256A. Further, the second conductor 220B constituting the Josephson junction 200 is connected to the conductor layer 230B through the connection conductor 256B. Further, in the sixth example embodiment, the second conductor 220A, which does not constitute the Josephson junction 200, is not connected to the connection conductor 252A. Similarly, the first conductor 210B, which does not constitute the Josephson junction 200, is not connected to the connection conductor 252B. Therefore, the possibility that the spurious junction 82 can be disabled is high in the sixth example embodiment. Therefore, the quantum device 52 according to the sixth example embodiment can further suppress the deterioration of the coherence (the performance).

Further, in the sixth example embodiment, the projecting parts 216A are formed in the first conductor 210A on the first side 72A. Further, the projecting parts 216A project beyond the second conductor 220A deposited on the first conductor 210A. Note that the projecting length of the projecting parts 216A is longer than that of the projecting part 214A according to the fifth example embodiment. Further, no projecting part related to the second conductor 220A is formed in the vicinity of the projecting parts 216A. Therefore, on the first side 72A, the connection conductor 256A can be brought into contact with the first conductor 210A (the projecting parts 216A) more reliably while preventing it from being in contact with the second conductor 220A. Further, since the projecting length of the projecting parts 216A is long in the sixth example embodiment, the contact area between the projecting parts 216A and the connection conductor 256A can be increased as compared with that in the fifth example embodiment. Therefore, the first conductor 210A and the conductor layer 230A can be short-circuited more reliably through the connection conductor 256A. Therefore, the electric field generated in the spurious junction 82A can be suppressed even more, so that the possibility that the spurious junction 82A can be disabled is increased even further.

Further, in the sixth example embodiment, the projecting parts 226B are formed in the second conductor 220B on the second side 72B. Further, the projecting parts 226B project beyond the first conductor 210B, on which the second conductor 220B is deposited. Note that the projecting length of the projecting parts 226B is longer than that of the projecting part 224B according to the fifth example embodiment. Further, no projecting part related to the first conductor 210B is formed in the vicinity of the projecting parts 226B. Therefore, on the second side 72B, the connection conductor 256B can be brought into contact with the second conductor 220B (the projecting parts 226B) more reliably while preventing it from being in contact with the first conductor 210B. Further, since the projecting length of the projecting parts 226B is long in the sixth example embodiment, the contact area between the projecting parts 226B and the connection conductor 256A can be increased as compared with that in the fifth example embodiment. Therefore, the second conductor 220B and the conductor layer 230B can be short-circuited more reliably through the connection conductor 256B. Therefore, the electric field generated in the spurious junction 82B can be suppressed even more, so that the possibility that the spurious junction 82B can be disabled is increased even further.

Further, in the sixth example embodiment, since a plurality of projecting parts 216A are provided, the contact area between the projecting parts 216A and the connection conductor 256A can be increased even more. Therefore, the first conductor 210A and the conductor layer 230A can be short-circuited more reliably through the connection conductor 256A. Therefore, the electric field generated in the spurious junction 82A can be suppressed even more, so that the possibility that the spurious junction 82A can be disabled is increased even further. The same applies to the projecting parts 226B.

Further, in the sixth example embodiment, while the second conductor 220A is not connected to the conductor layer 230A, the first conductor 210A is connected to the conductor layer 230A on the first side 72A. Meanwhile, while the first conductor 210B is not connected to the conductor layer 230B, the second conductor 220B is connected to the conductor layer 230B on the second side 72B. In this way, it is possible to make the superconductor connected to the conductor layer 230 on the first side 72A different from that connected to the conductor layer 230 on the second side 72B more reliably. As a result, the possibility that the spurious junction 82A can be disabled is increased even more.

Seventh Example Embodiment

Next, a seventh example embodiment will be described. The following descriptions and drawings are partially omitted and simplified as appropriate to clarify the explanation. Further, the same reference numerals (or symbols) are assigned to the same components/structure, and redundant descriptions thereof are omitted as appropriate.

Figure 36:
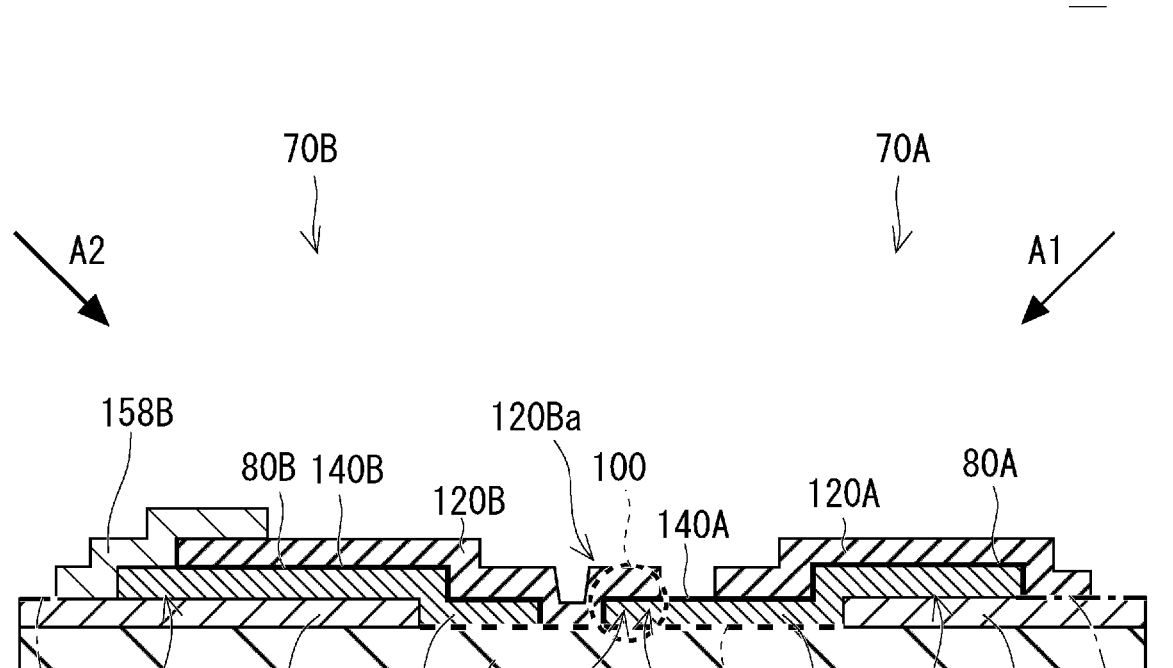
FIG. 36 shows a quantum device according to a seventh example embodiment.
Figure 36:
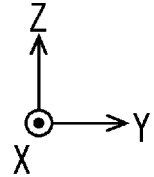

FIG. 36 shows a quantum device 50 according to the seventh example embodiment. FIG. 36 is a cross-sectional diagram of the quantum device 50 according to the seventh example embodiment. The quantum device 50 according to the seventh example embodiment is manufactured by the above-described bridge-type manufacturing method. Similarly to the first comparative example and the first example embodiment, the quantum device 50 according to the seventh example embodiment includes a substrate 60, a plurality of first conductors 110 (110A and 110B), a plurality of second conductors 120 (120A and 120B), and conductor layers 130 (130A and 130B). The structure of the first conductors 110, the second conductors 120, and the conductor layers 130 are substantially the same as that in the first comparative example unless otherwise specified, and therefore descriptions thereof are omitted as appropriate. Further, the XYZ-orthogonal coordinate system introduced in the second example embodiment is also introduced in the seventh example embodiment.

The first conductors 110 are deposited on the conductor layers 130. The second conductors 120 are deposited on the first conductors 110. The first conductors 110, the second conductors 120, and the conductor layers 130 are formed of superconducting materials. For example, the first and second conductors 110 and 120 are formed of aluminum (Al). Further, for example, the conductor layers 130 (third conductors) are formed of niobium (Nb). However, the first and second conductors 110 and 120 do not necessarily have to be formed of aluminum (Al). Further, the conductor layers 130 do not necessarily have to be formed of niobium (Nb).

Further, oxide films 140 (140A and 140B) are formed between the first and second conductors 110 and 120. Further, a Josephson junction 100 is formed by a part of the first conductors 110 (110A) (a first conductor part 110Aa), a part of the second conductors 120 (120B) (a second conductor part 120Ba), and the oxide film 140 (140A). The structure of the Josephson junction 100 is substantially the same as those in the first comparative example and the first example embodiment, and therefore the description thereof is omitted as appropriate.

On the first side 70A, the first conductor 110A is deposited on the substrate 60 and the conductor layer 130A. Further, the second conductor 120A is deposited on the first conductor 110A and the conductor layer 130A. Further, an oxide film 132A (NbOx) is formed on a part of the surface of the conductor layer 130A that is not in contact with the substrate 60 nor with the first conductor 110A. Further, an oxide film 140A (AlOx) is formed on a part of the surface of the first conductor 110A that is not in contact with the substrate 60 nor with the conductor layer 130A. That is, the oxide film 140A is formed on a part of the surface of the first conductor 110A that is in contact with the second conductor 120A or 120B. As described above, the oxide film 140A interposed between the first conductor 110A and the second conductor 120A functions as a spurious junction 80A.

Meanwhile, on the second side 70B, the first conductors 110B is deposited on the substrate 60 and the conductor layer 130B. Further, the second conductor 120B is deposited on the substrate 60 and the first conductor 110B. Further, an oxide film 132B (NbOx) is formed on a part of the surface of the conductor layer 130B that is not in contact with the substrate 60 nor with the first conductor 110B. Further, an oxide film 140B (AlOx) is formed on a part of the surface of the first conductor 110B that is not in contact with the substrate 60 nor with the conductor layer 130B. That is, the oxide film 140B is formed on a part of the surface of the first conductor 110B that is in contact with the second conductor 120B. As described above, the oxide film 140B functions as a spurious junction 80B.

Note that in contrast to the first example embodiment and the like, no oxide film 132A is formed on at least a part of the surface 130Aa of the conductor layer 130A that is in contact with the first conductor 110A in the seventh example embodiment. Similarly, no oxide film 132B is formed on at least a part of the surface 130Ba of the conductor layer 130B that is in contact with the first conductor 110B. Note that similarly to the first comparative example, it is possible to remove the oxide film 132 formed on the surface 130Aa of the conductor layer 130A and the surface 130Ba of the conductor layer 130B by performing an oxide film removal step for the conductor layer 130 before the evaporation process for the first conductors 110. As a result, a connection (a superconducting contact) between the conductor layers 130 and the superconductors (the first conductors 110) is formed. That is, the surfaces of the first conductors 110 and the conductor layers 130, which face each other when the first conductors 110 are deposited on the conductor layers 130, are directly connected to each other. Specifically, a connection (a superconducting contact) between the conductor layer 130A and the first conductor 110A is formed on the first side 70A. Similarly, a connection (a superconducting contact) between the conductor layer 130B and the first conductor 110B is formed on the second side 70B. Note that as described above in the first comparative example, since the oxide film removal step is performed before the evaporation process for the first conductors 110, a damaged layer 62 could be formed on a part of the surface of the substrate 60.

Further, the quantum device 50 according to the seventh example embodiment includes a connection conductor 158B on the second side 70B. The connection conductor 158B is formed of a superconducting material such as aluminum (Al). The connection conductor 158B is directly connected to at least the conductor layer 130B and the second conductor 120B. For example, the connection conductor 158B is deposited on the conductor layer 130B and the second conductor 120B. Note that no dielectric such as an oxide film is formed between the connection conductor 158B and the conductor layer 130B, and between the connection conductor 158B and the second conductor 120B. Therefore, the second conductor 120B is connected to the conductor layer 130B through the connection conductor 158B and with no oxide film (dielectric) interposed therebetween. Note that as described above, in the seventh example embodiment, a connection (a superconducting contact) between the conductor layer 130A and the first conductor 110A is formed on the first side 70A, no connection conductor may be formed on the first side 70A.

Figure 37:
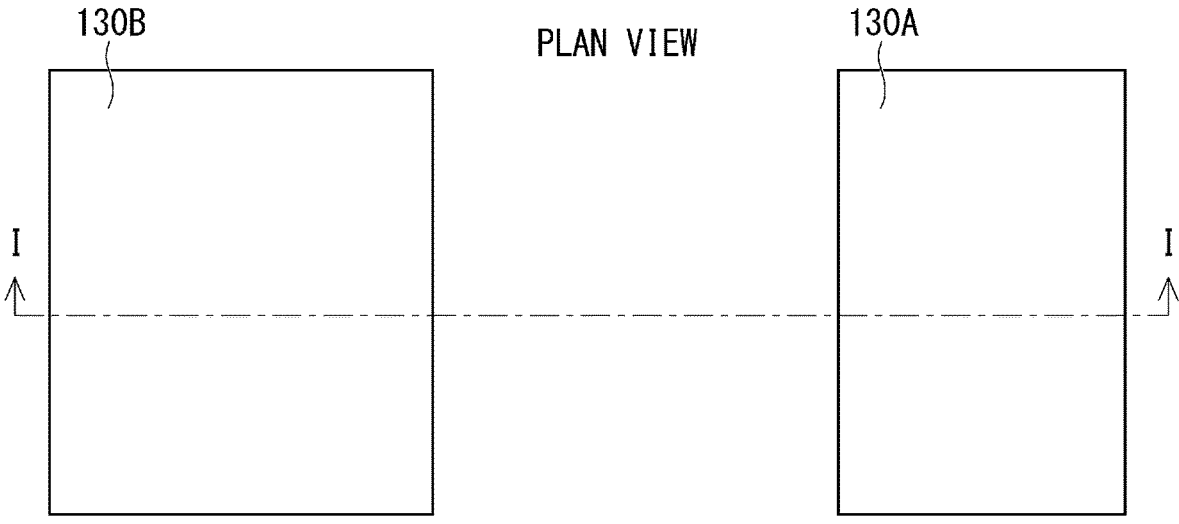
FIG. 37 is a diagram for explaining a method for manufacturing a quantum device according to the seventh example embodiment.
Figure 37:
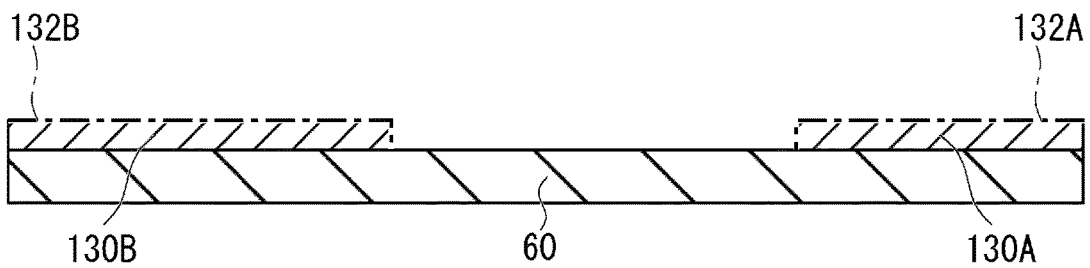

FIGS. 37 to 45 are diagrams showing steps included in a method for manufacturing a quantum device 50 according to the seventh example embodiment. Firstly, as shown in FIG. 37, similarly to the first comparative example (FIG. 3), a substrate 60 is prepared and a conductor layer 130 is formed on the substrate 60 (a conductor layer deposition step). The deposition of the conductor layer 130 can be performed, for example, by sputtering. Alternatively, the deposition of the conductor layers 130 can be performed by evaporation or CVD. Then, the formation of a circuit pattern in the conductor layer 130 can be performed, for example, by a combination of optical lithography and reactive ion etching. Note that an electron beam lithography method or the like may be used instead of using the optical lithography. Further, wet etching or the like may be used instead of using the reactive ion etching. Note that an oxide film 132 (a niobium oxide layer) is formed on a part of the surface of the conductor layer 130 (a part of the surface that is not in contact with the substrate 60).

Figure 38:
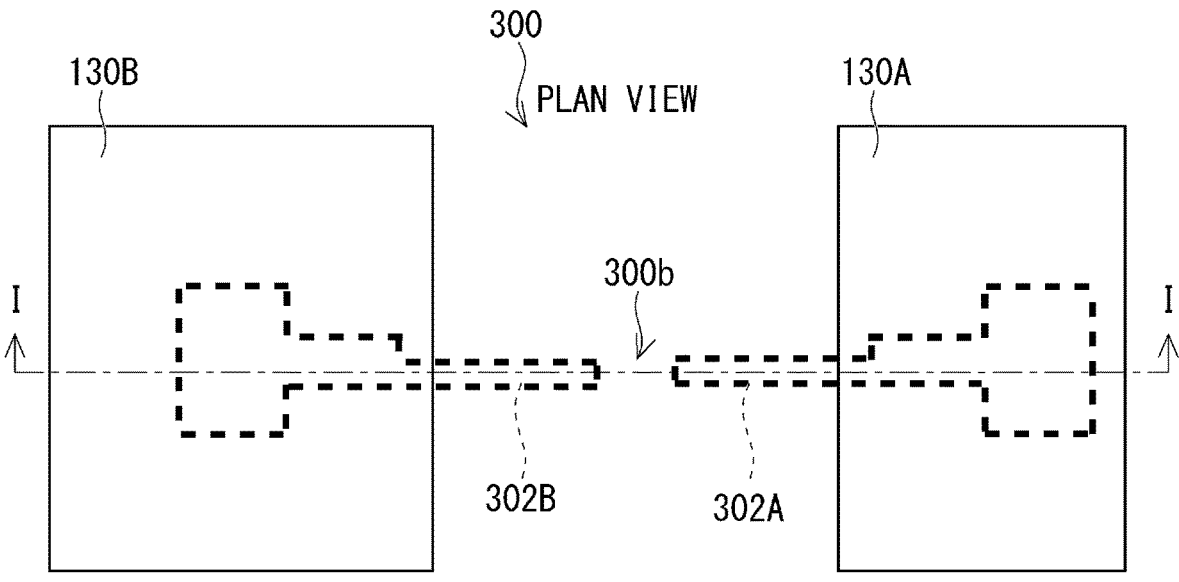
FIG. 38 is a diagram showing a step included in the method for manufacturing the quantum device according to the seventh example embodiment.
Figure 38:
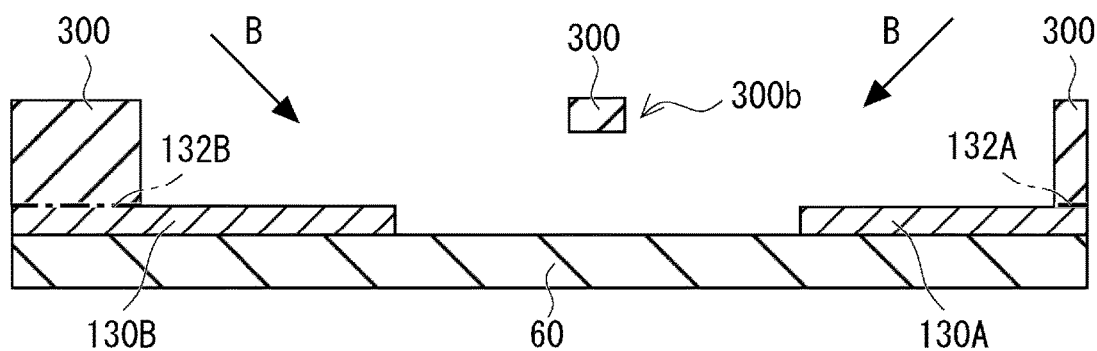

Next, as shown in FIG. 38, similarly to the first comparative example (FIG. 4), a resist mask 300 (a resist pattern) is formed (a resist mask formation step). In this process, the substrate 60 and the like are placed in a vacuum environment. That is, the substrate 60 and the like are disposed in a vacuum-sealed state inside a chamber inside of which is in a vacuum state. Further, the resist mask 300 is fixed and is not moved relative to the substrate 60 until the resist mask 300 is removed. Openings 302 (302A and 302B) are formed by the resist pattern of the resist mask 300. Note that after that and until the resist mask 300 is removed, the substrate 60 and the conductor layers 130 except for the parts thereof corresponding to the openings 302 are covered by the resist mask 300. Further, the resist mask 300 includes a resist bridge 300b. By this resist bridge 300b, the openings 302 are separated into two openings 302A and 302B. In this state, the oxide film 132 on the surface of the conductor layer 130 is removed (an oxide film removal step). The removal of the oxide film 132 is performed by, for example, ion milling or the like in which an ion beam is applied through the openings 302 as indicated by arrows B.

Figure 39:
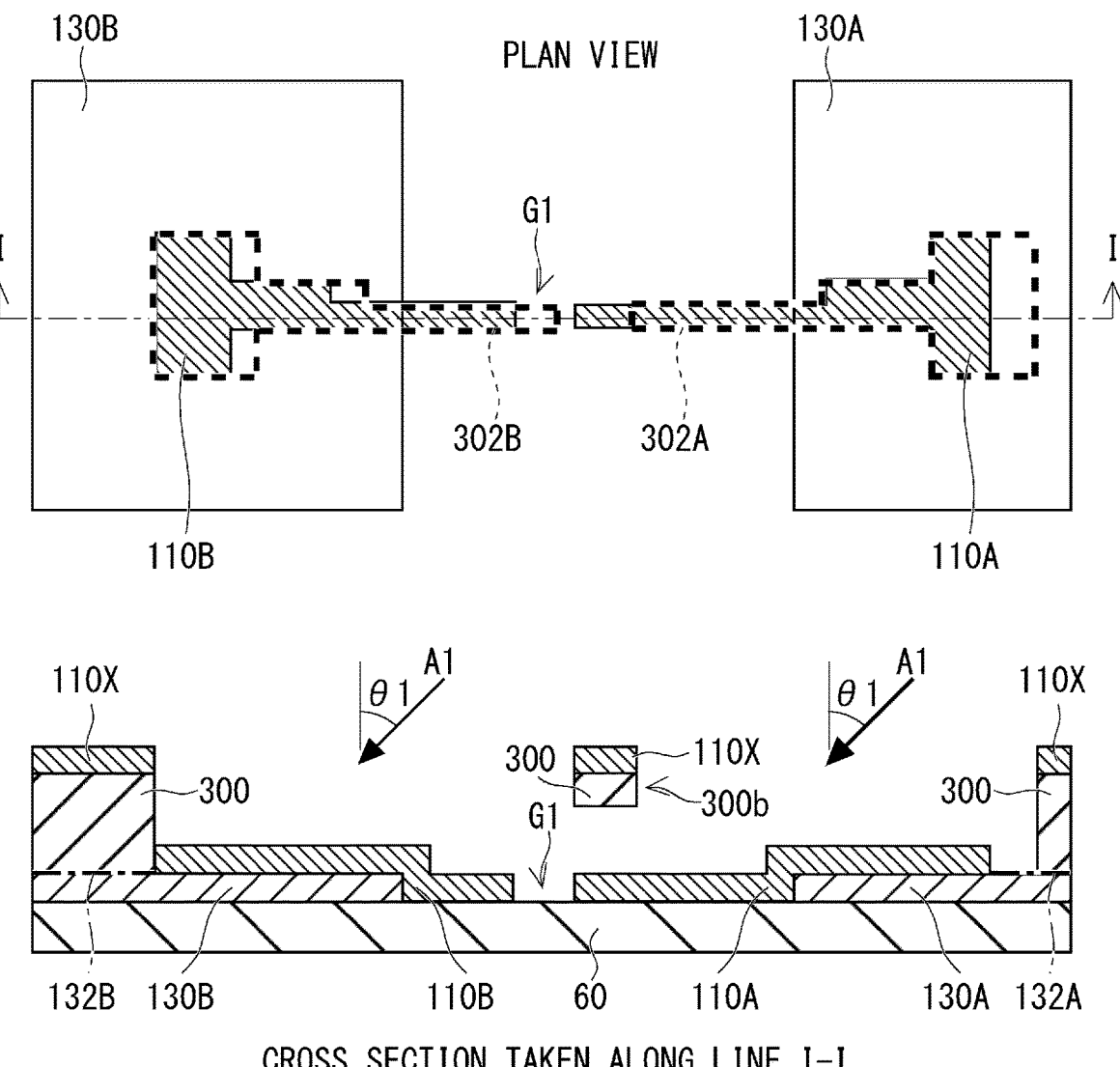
FIG. 39 is a diagram showing a step included in the method for manufacturing the quantum device according to the seventh example embodiment.

Next, as shown in FIG. 39, similarly to the first comparative example (FIG. 5), first conductors 110 are evaporated by angled evaporation in a direction indicated by arrows A1 (a first evaporation processing step). The direction of the angled evaporation is, for example, a direction about 20 degrees inclined from the direction perpendicular to the surface of the substrate 60 as viewed from the substrate 60 side. That is, when the angle from the direction perpendicular to the surface of the substrate 60 is represented by θ1, a superconducting material is evaporated roughly in the direc-tion expressed as θ1=20 degrees. In the first evaporation processing step, the superconducting material is ejected in the direction inclined from the direction perpendicular to the surface of the substrate 60 to the first side 70A by the angle θ1 as viewed from the substrate 60 side.

In this way, the first conductor 110A is evaporated through the opening 302A. Further, the first conductor 110B is evaporated through the opening 302B. Further, a superconducting material 110X (Al) that has been evaporated together with the first conductors 110 is deposited on the resist mask 300. Further, a gap G1, by which the first conductors 110A and 110B are separated from each other, is formed by the resist bridge 300b. Note that since the oxide film removal step (FIG. 38) has been performed, no oxide film 132A is formed between the first conductor 110A and the conductor layer 130A. Further, no oxide film 132B is formed between the first conductor 110B and the conductor layer 130B.

Figure 40:
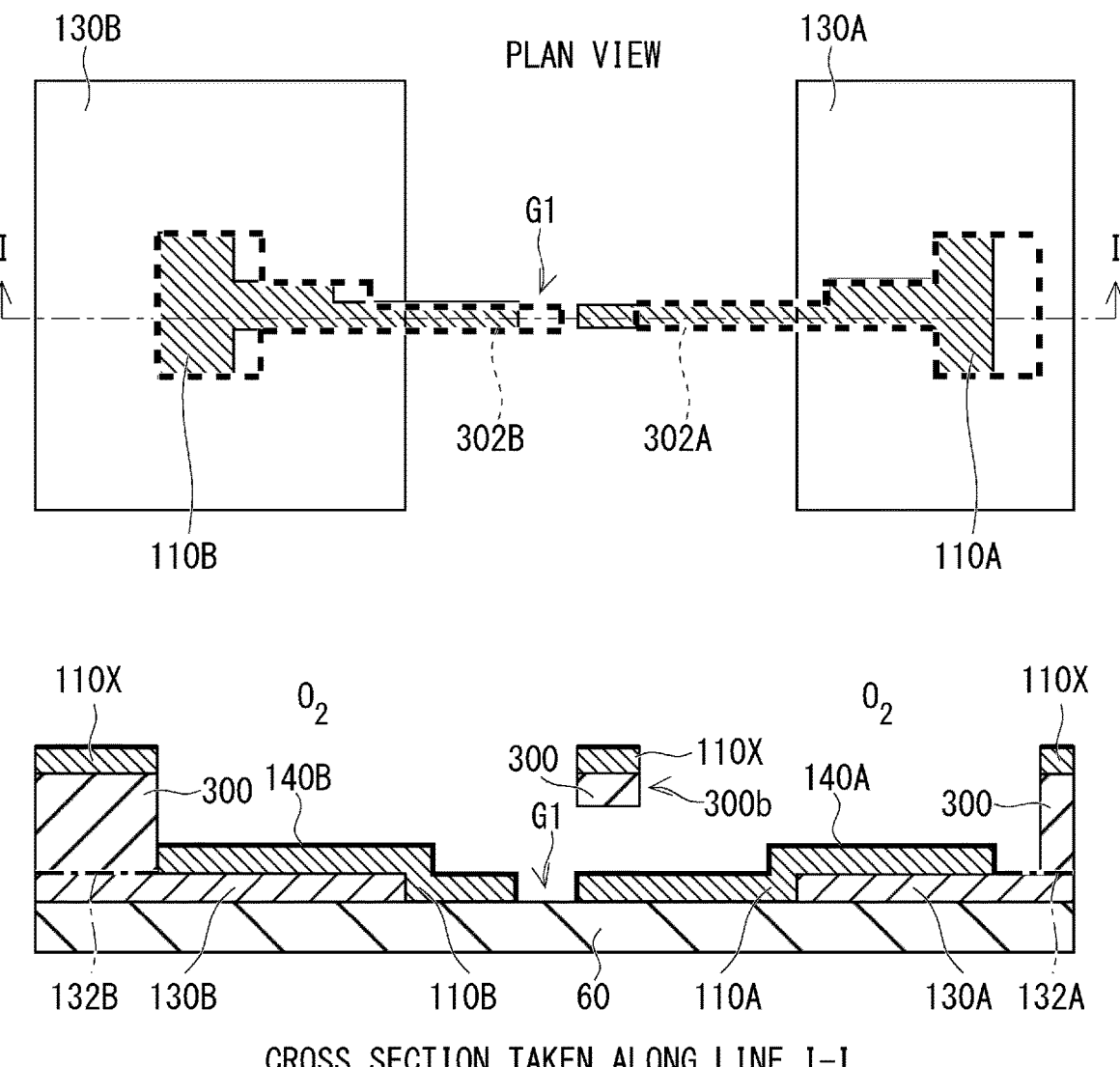
FIG. 40 is a diagram showing a step included in the method for manufacturing the quantum device according to the seventh example embodiment.

Next, as shown in FIG. 40, similarly to the first comparative example (FIG. 6), the surfaces of the first conductors 110 are oxidized (an oxidation step). As a result, an oxide film 140A (AlOx) is formed on the surface of the first conductor 110A. Further, an oxide film 140B (AlOx) is formed on the surface of the first conductor 110B.

Figure 41:
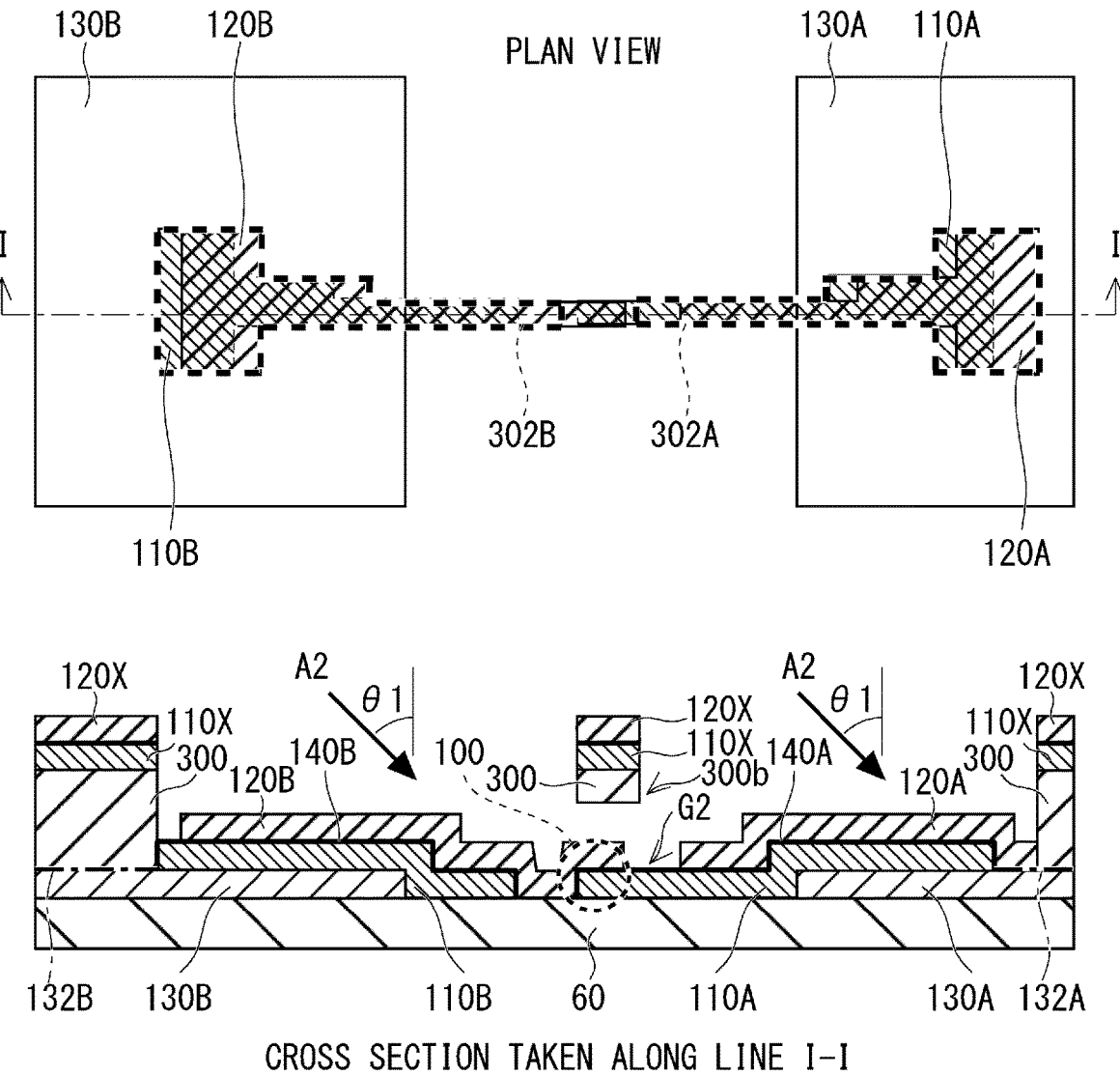
FIG. 41 is a diagram showing a step included in the method for manufacturing the quantum device according to the seventh example embodiment.

Next, as shown in FIG. 41, similarly to the first comparative example (FIG. 7), second conductors 120 are evaporated by angled evaporation in a direction indicated by arrows A2 (a second evaporation processing step). In this process, the second conductor 120A is evaporated through the opening 302A. Further, the second conductor 120B is evaporated through the opening 302B. Further, a superconducting material 120X (Al) that has been evaporated together with the second conductors 120 is deposited on the resist mask 300. Further, a gap G2, by which the second conductors 120A and 120B are separated from each other, is formed on the first conductor 110A by the resist bridge 300b. Further, the Josephson junction 100 is formed in a part where the first conductor 110A and second conductor 120B overlap each other.

Figure 42:
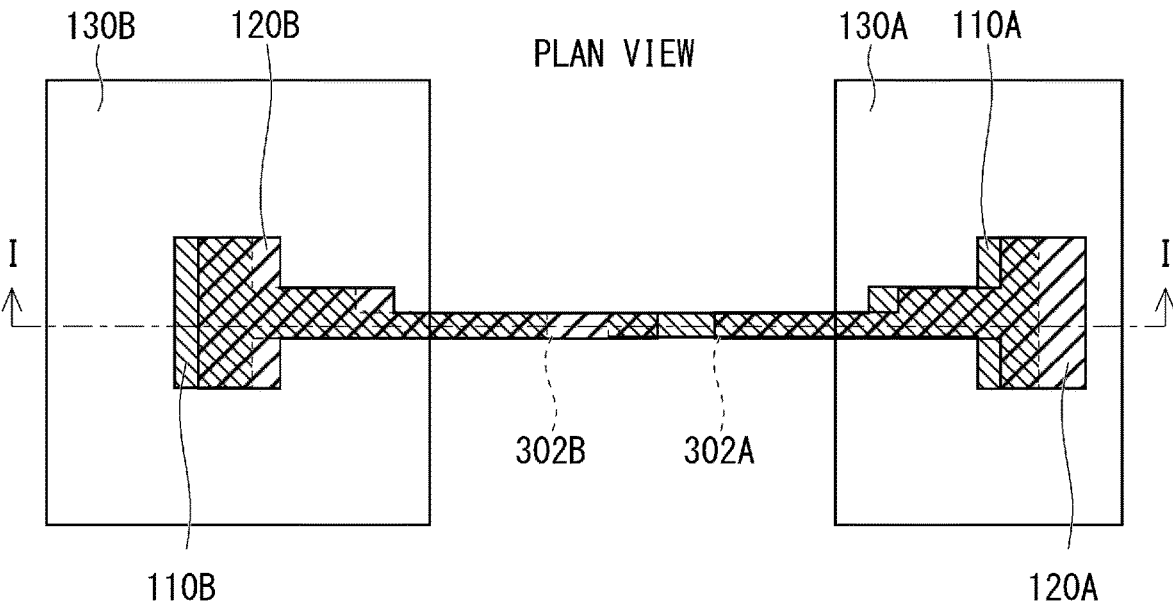
FIG. 42 is a diagram showing a step included in the method for manufacturing the quantum device according to the seventh example embodiment.
Figure 42:
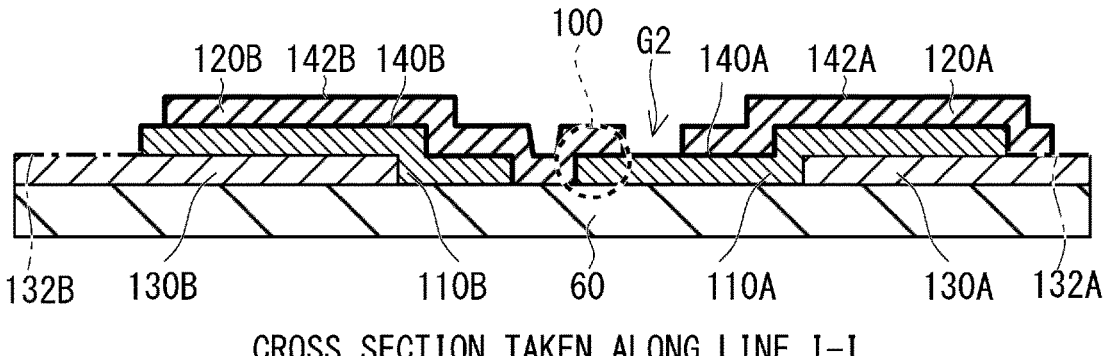

Next, as shown in FIG. 42, the resist mask 300 is removed (a lift-off step). As a result, the resist mask 300 and the excessive superconducting materials 110X and 120X deposited on the resist mask 300 are removed. At this point, the vacuum state (the sealed state) is released to the atmospheric environment. That is, the substrate 60 is disposed is released from the vacuum state (the vacuum-sealed state) and is placed under the atmospheric environment. Note that since the substrate 60 is placed under the atmospheric environment, an oxide film 142 is formed on the surface of the second conductors 120. That is, an oxide film 142A is formed on the surface of the second conductor 120A, and an oxide film 142B is formed on the surface of the second conductor 120B.

Figure 43:
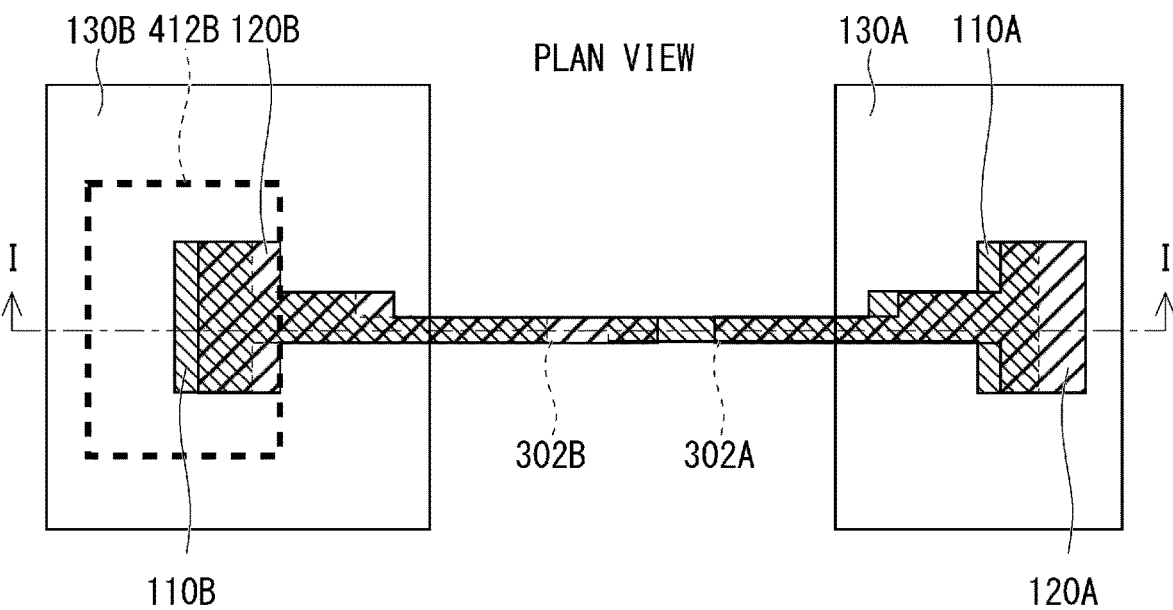
FIG. 43 is a diagram showing a step included in the method for manufacturing the quantum device according to the seventh example embodiment.
Figure 43:
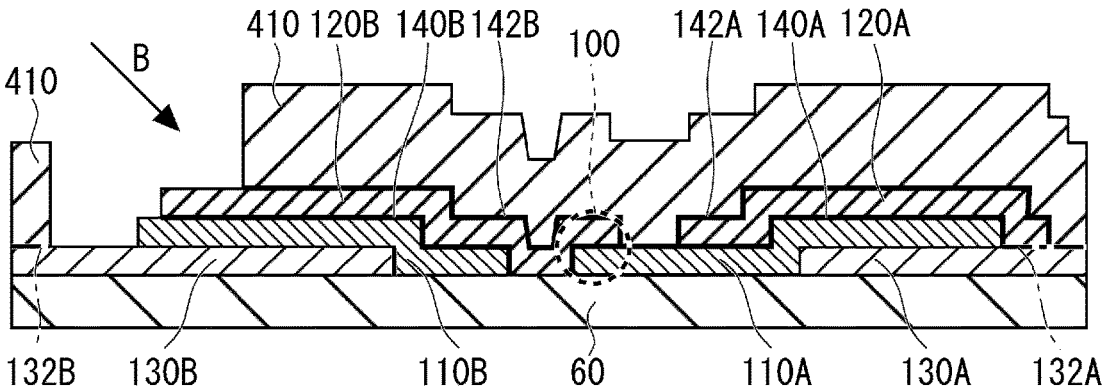

Next, as shown in FIG. 43, a resist mask 410 (a resist pattern) for forming a connection conductor 158B is formed (a connection conductor resist mask formation step). In this process, the substrate 60 and the like are placed in a vacuum environment. That is, the substrate 60 and the like are placed and vacuum-sealed inside a vacuumed chamber. An opening 412B is formed by the resist pattern of the resist mask 410 on the second side 70B. Note that in contrast to the first example embodiment, since no connection conductor is formed on the first side 70A, no opening is provided in the resist mask 410 on the first side 70A.

In this state, oxide films formed in the exposed parts of the first conductors 110, the second conductors 120, and the conductor layers 130 not covered by the resist mask 410 are removed (an oxide film removal step). As a result, a part of the oxide film 132 formed on a part of the surface of the conductor layer 130 that is not covered by the resist mask 410, a part of the oxide film 142 formed on a part of the surface of the second conductors 120 that is not covered by the resist mask 410, and a part of the oxide film 140 formed on a part of the surface of the first conductors 110 that is not covered by the resist mask 410 are removed. The removal of the oxide films 132, 140 and 142 is performed by, for example, ion milling or the like in which ion beams are applied to the oxide films through the openings 402 as indicated by arrows B.

Figure 44:
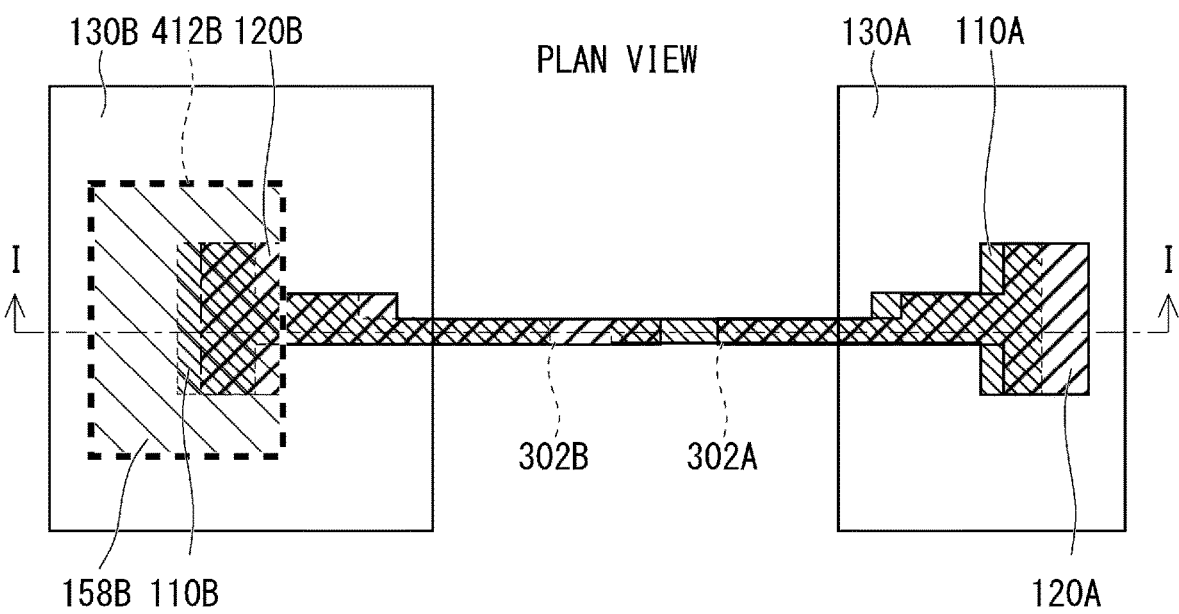
FIG. 44 is a diagram showing a step included in the method for manufacturing the quantum device according to the seventh example embodiment.
Figure 44:
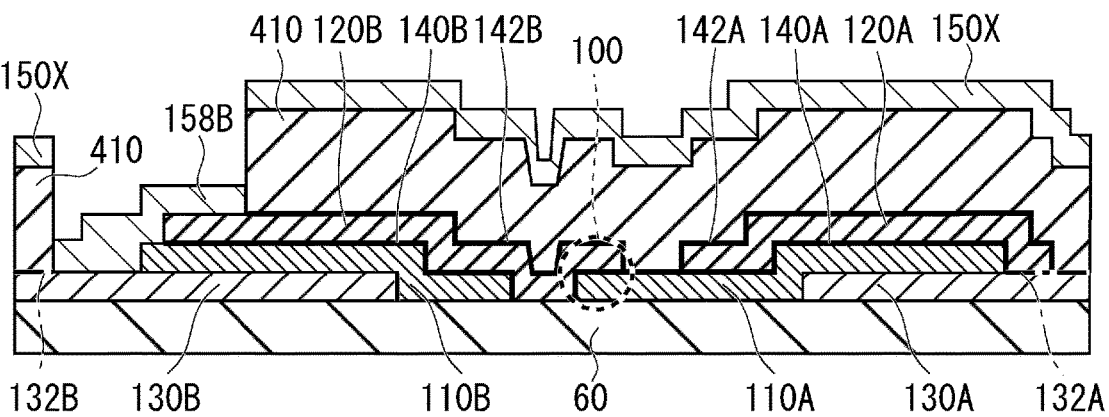

Next, as shown in FIG. 44, a connection conductor 158B is evaporated through the opening 412B (a connection conductor evaporation processing step). Note that the evaporation process for the connection conductor 158B does not necessarily have to be the angled evaporation. As a result, a film of the connection conductor 158B is formed through the opening 412B. Further, a superconducting material 150X (Al) that has been evaporated together with the connection conductor 158B is deposited on the resist mask 410.

Since the film of the connection conductor 158B is formed at a place corresponding to the opening 412B, the second conductor 120B is directly connected to the connection conductor 158B (a superconducting contact). Further, the conductor layer 130B is directly connected to the connection conductor 158B (a superconducting contact). Therefore, the second conductor 120B and the conductor layer 130B are connected to each other through the conductor (the connection conductor 158B). Note that the first conductor 110B is directly connected to the connection conductor 158B (a superconducting contact). Therefore, the first conductor 110B and the conductor layer 130B are connected to each other through the conductor (the connection conductor 158B).

Figure 45:
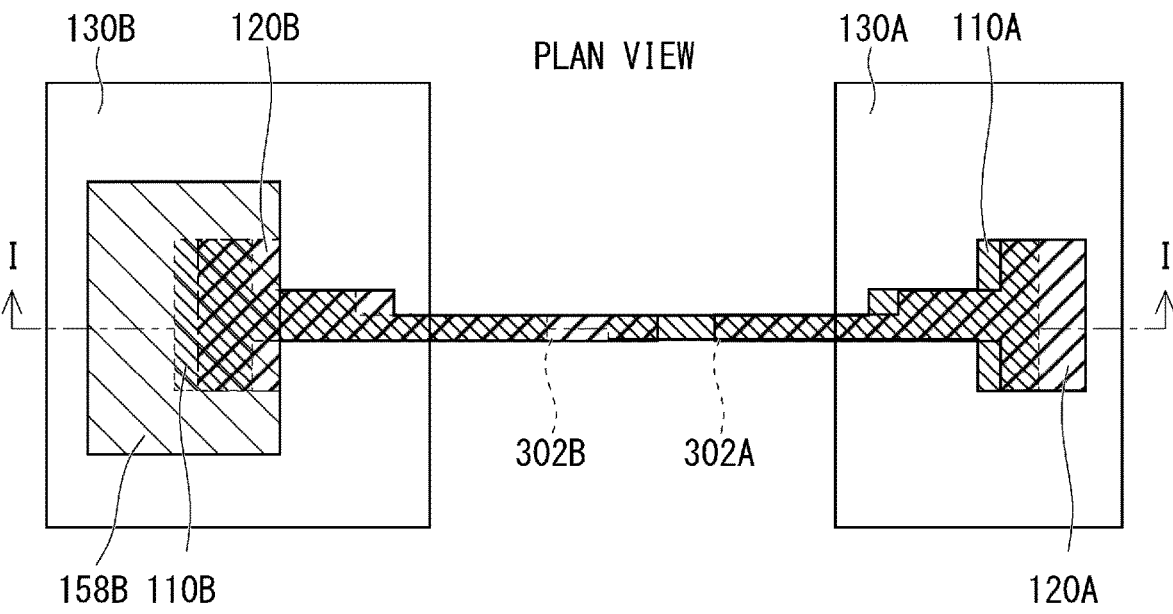
FIG. 45 is a diagram showing a step included in the method for manufacturing the quantum device according to the seventh example embodiment.
Figure 45:
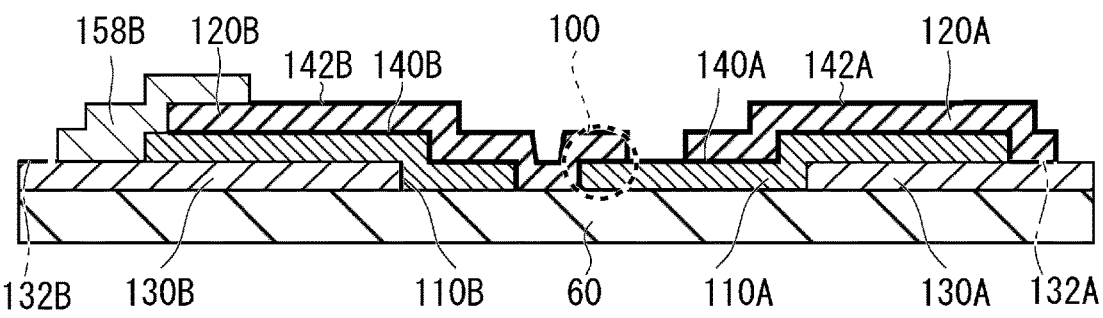

Next, as shown in FIG. 45, the resist mask 410 is removed (a lift-off step). As a result, the resist mask 410 and the excessive superconducting material 150X deposited on the resist mask 410 are removed. Through the above-described processes, the quantum device 50 according to the seventh example embodiment shown in FIG. 36 is manufactured. Note that the steps shown in FIGS. 38 to 41 are performed in the same vacuum-sealed state. That is, in the steps shown in FIGS. 38 to 41, the vacuum-sealed state is not released to the atmospheric environment. Further, in the steps shown in FIGS. 43 and 44 are performed in the same vacuum-sealed state. That is, in the steps shown in FIGS. 43 and 44, the vacuum-sealed state is not released to the atmospheric environment.

Figure 46:
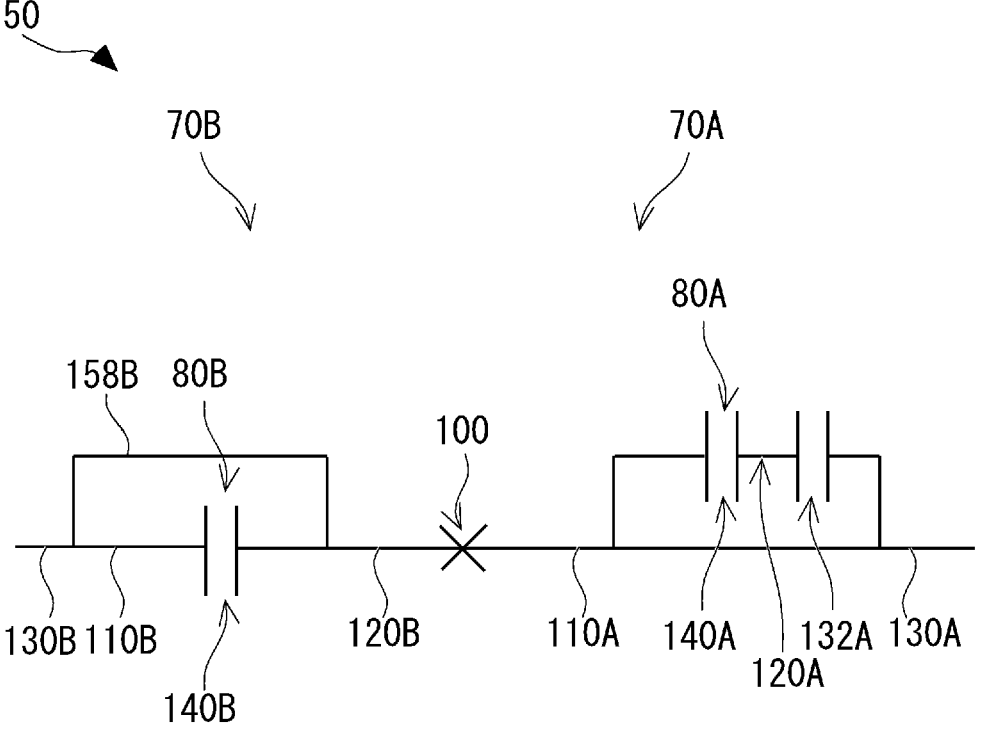
FIG. 46 schematically shows a circuit configuration of a quantum device according to the seventh example embodiment.

FIG. 46 schematically shows a circuit configuration of the quantum device 50 according to the seventh example embodiment. Meanwhile, on the first side 70A, as an electrical path from the Josephson junction 100 to the conductor layer 130A, there is a second path as well as the first path that passes through the spurious junction 80A functioning as a capacitor. That is, the first path is one through which the Josephson junction 100 is connected to the conductor layer 130A through the first conductor 110A, the spurious junction 80A (the oxide film 140A), the second conductor 120A, and the oxide film 132A. Note that the oxide film 132A is formed by the oxidation step (FIG. 40). Meanwhile, the second path is one through which the Josephson junction 100 is connected to the first conductor 110A, and the first conductor 110A is directly connected to the conductor layer 130A. That is, since no oxide film is formed between the first conductor 110A and the conductor layer 130A by the oxide film removal step (FIG. 38), the conductors at both ends of the spurious junction 80A (i.e., the first conductor 110A and the conductor layer 130A) are short-circuited. Therefore, the spurious junction 80A is electrically disabled. Therefore, since the electric field generated in the spurious junction 80A does not increase, the spurious junction 80A does not contribute to the cause of the loss.

Further, on the second side 70B, as an electrical path from the Josephson junction 100 to the conductor layer 130B, there is a second path as well as a first path that passes through the spurious junction 80B functioning as a capacitor. That is, the first path is one through which the Josephson junction 100 is connected to the conductor layer 130B through the second conductor 120B, the spurious junction 80B (the oxide film 140B), and the first conductor 110B. Meanwhile, the second path is one through which the Josephson junction 100 is connected to the second conductor 120B, and the second conductor 120B is connected to the conductor layer 130B through the connection conductor 158B. That is, the conductors at both ends of the spurious junction 80B (the second conductor 120B and the conductor layer 130B) are short-circuited by the connection conductor 158B, so that the spurious junction 80B is electrically disabled. Therefore, since the electric field generated in the spurious junction 80B does not increase, the spurious junction 80B does not contribute to the cause of the loss.

Therefore, the spurious junctions 80A and 80B can be disabled in the seventh example embodiment. As a result, the quantum device 50 according to the seventh example embodiment can suppress the deterioration of the performance thereof. Further, in the seventh example embodiment, the projecting parts formed in the first and second conductors 110 and 120 in the first example embodiment and the like are not formed. Therefore, the quantum device 50 according to the seventh example embodiment can suppress the deterioration of the performance thereof without being equipped with a projecting part. That is, in the quantum device 50 according to the seventh example embodiment, the shape of the superconductor can be simplified as compared with the first example embodiment and the like.

Note that in the seventh example embodiment, it is necessary to remove the oxide film 132 formed on the surface of the conductor layer 130 before the first conductors 110 are formed in the conductor layer 130. Therefore, the quantum device 50 according to the seventh example embodiment is manufactured through a larger number of processes than the number of processes required in the first example embodiment and the like. Conversely, the quantum device 52 in which the spurious junction 80 is disabled according to the first example embodiment or the like can be manufactured by a smaller number of processes than the number of processes required in the seventh example embodiment.

Figure 47:
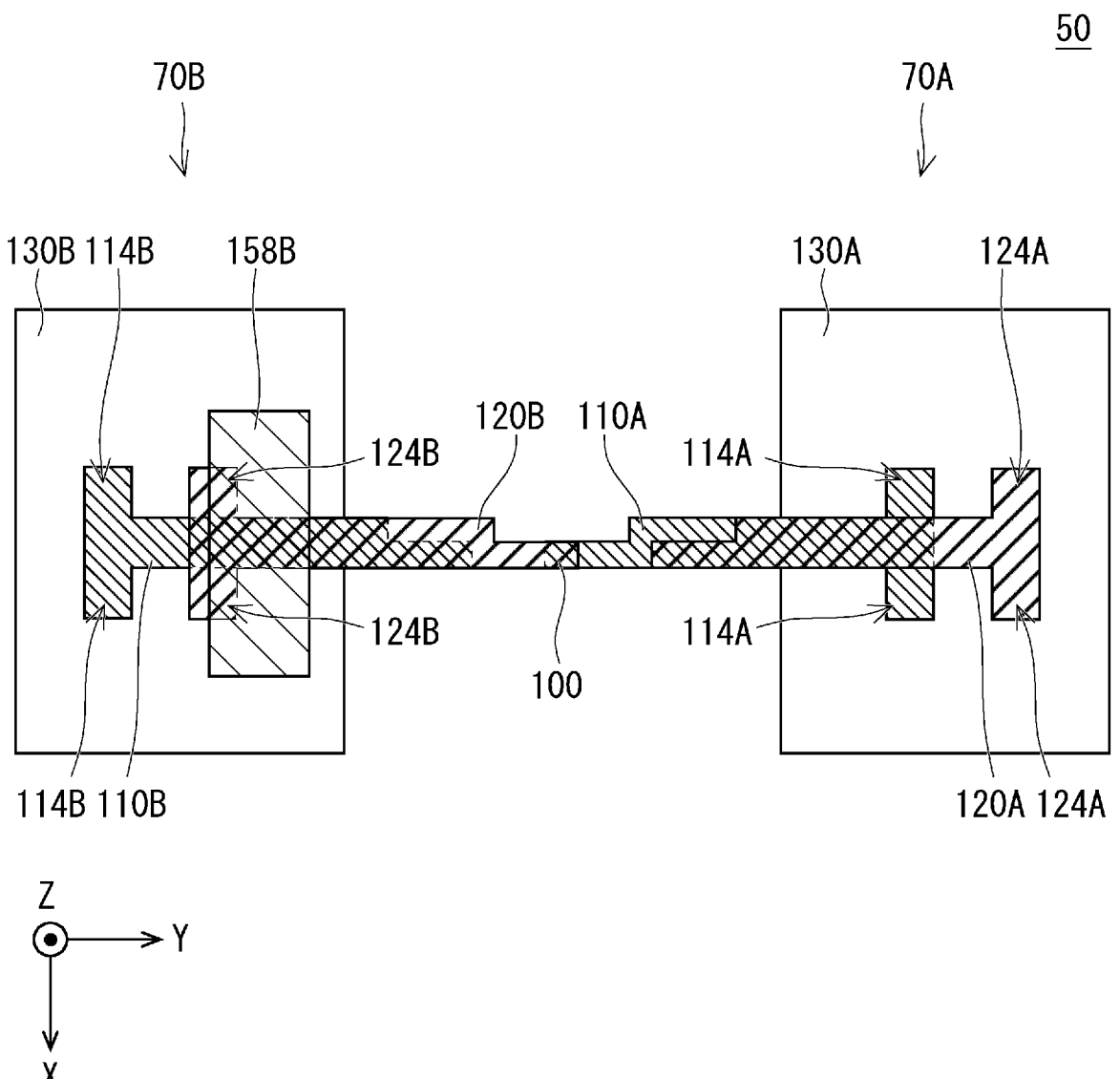
FIG. 47 shows a modified example of the quantum device according to the seventh example embodiment.

FIG. 47 shows a modified example of the quantum device 50 according to the seventh example embodiment. FIG. 47 is a plan view showing the modified example of the quantum device 50 according to the seventh example embodiment. The shapes of the first and second conductors 110 and 120 of the quantum device 50 shown in FIG. 47 are substantially the same as those of the second example embodiment. Further, on the second side 70B, the connection conductor 158B is deposited on the second conductor 120B so as to be in contact with the projecting part 124B. Note that the connection conductor 158B is deposited on the second conductor 120B so as not to be in contact with the projecting part 114B formed in the first conductor 110B. Further, the connection conductor 158B is also in contact with a part of the second conductor 120B other than the projecting part 124B. Therefore, the contact area between the second conductor 120B and the connection conductor 158B can be increased without bringing the connection conductor 158B into contact with the first conductor 110B.

Figure 48:
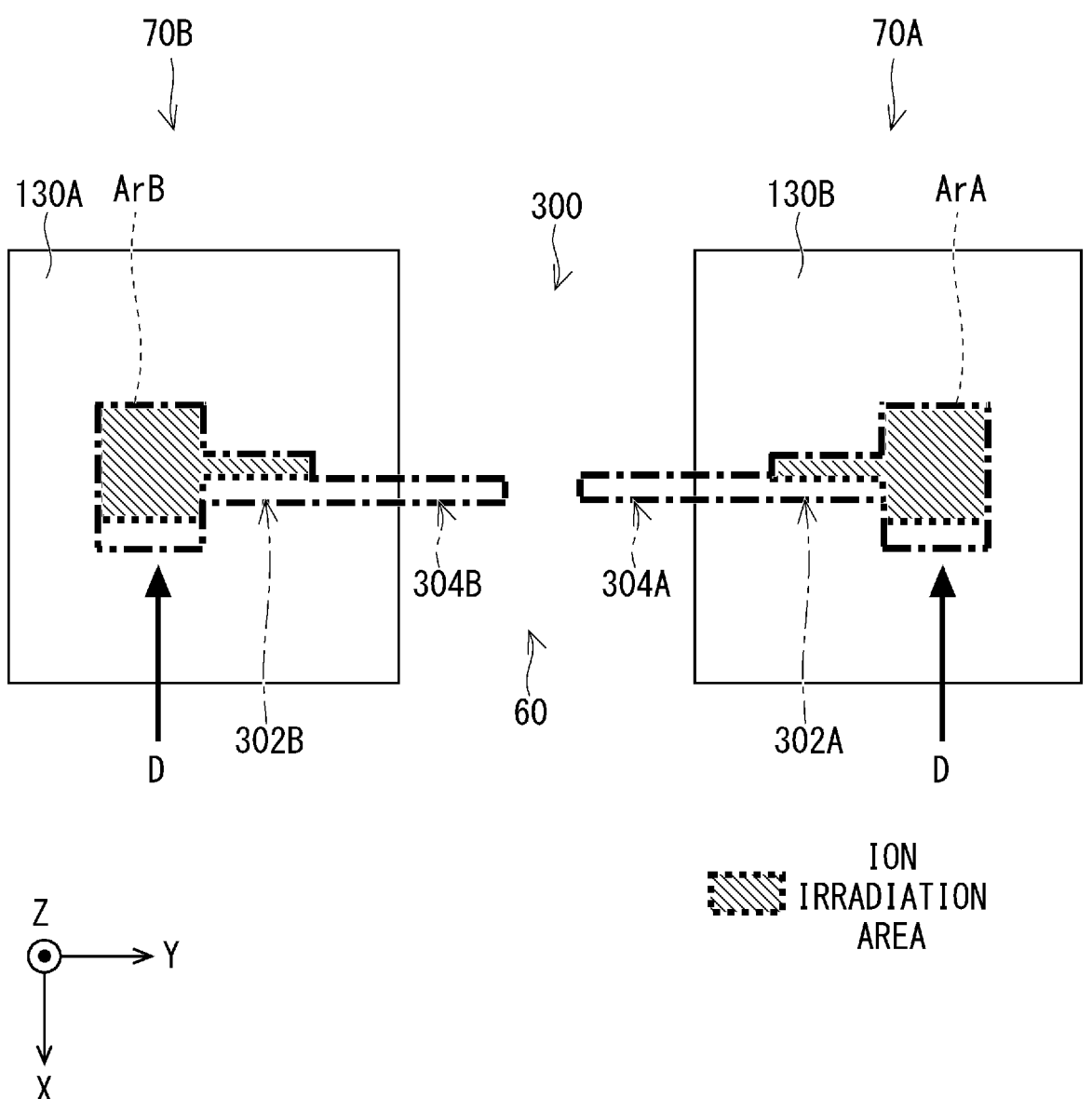
FIG. 48 is a diagram for explaining a modified example of an oxide film removal step according to the seventh example embodiment.

FIG. 48 is a diagram for explaining a modified example of the oxide film removal step (FIG. 38) according to the seventh example embodiment. As described above, if the oxide film removal step is performed before the evaporation process for the first conductors 110 as shown in FIG. 38, a damaged layer 62 could be formed on the surface of the substrate 60. Therefore, the formation of the damaged layer 62 on the surface of the substrate 60 is suppressed by the method shown in FIG. 48.

In the state in which the resist mask 300 is formed, an ion beam for removing the oxide film 132 is applied, as indicated by arrows D, in a direction (a third direction) inclined from the −Z direction to the +X direction as viewed from the substrate 60 side. The direction in which the ion beam is applied may be, for example, a direction about 45 degrees inclined from the −Z direction to the +X direction as viewed from the substrate 60 side. In this case, the ion beam is applied in the −X direction as indicated by the arrows D in the plan view. Meanwhile, the directions of the angled evaporation are the −Y direction (a first direction) and the +Y direction (a second direction) in the plan view. Therefore, the direction in which the ion beam is applied is different from the directions of the angled evaporation. In other words, the ion beam is applied in a direction different from the directions of the angled evaporation in the oxide film removal step.

As a result, the ion beam is applied to an irradiation area ArA on the first side 70A. Further, the ion beam is applied to an irradiation area ArB on the second side 70B. Note that the opening 302A includes a narrow hole part 304A for forming a first conductor part 110Aa constituting the Josephson junction 100. The narrow hole part 304A is formed so as to extend in the Y-axis direction. Further, the narrow hole part 304A is formed so that its width in the X-axis direction is narrow at least in the place corresponding to the substrate 60. Similarly, the opening 302B includes a narrow hole part 304B for forming a second conductor part 120Ba constituting the Josephson junction 100. The narrow hole part 304B is formed so as to extend in the Y-axis direction. Further, the narrow hole part 304B is formed so that its width in the X-axis direction is narrow at least in the place corresponding to the substrate 60.

Since the narrow hole parts 304 are formed as described above, when the ion beam is applied, it is blocked by the wall on the X-direction positive side of the resist mask 300 in the narrow hole parts 304, so that the substrate 60 is not irradiated with the ion beam. Therefore, it is possible to prevent the damaged layer 62 from being formed in the substrate 60. Note that regarding the parts of the openings 302 that are corresponding to the conductor layers 130, they have such a large width in the X-axis direction that at least a part of the ion beam is applied to the conductor layers 130. Therefore, it is possible to remove at least a part of the oxide film 132 that is formed on the part of the surface of the conductor layers 130 on which the first conductors 110 are deposited.

In the method shown in FIG. 48, the oxide film 132 is removed by applying the ion beam to the surface of the conductor layers 130 while preventing the ion beam from being applied to the areas other than the surface of the conductor layers 130. By the above-described method, it is possible to achieve the advantageous effects of the seventh example embodiment while preventing the damaged layer 62 from being formed on the surface of the substrate 60.

Eighth Example Embodiment

Next, an eighth example embodiment will be described. The following descriptions and drawings are partially omitted and simplified as appropriate to clarify the explanation. Further, the same reference numerals (or symbols) are assigned to the same components/structure, and redundant descriptions thereof are omitted as appropriate.

Figure 49:
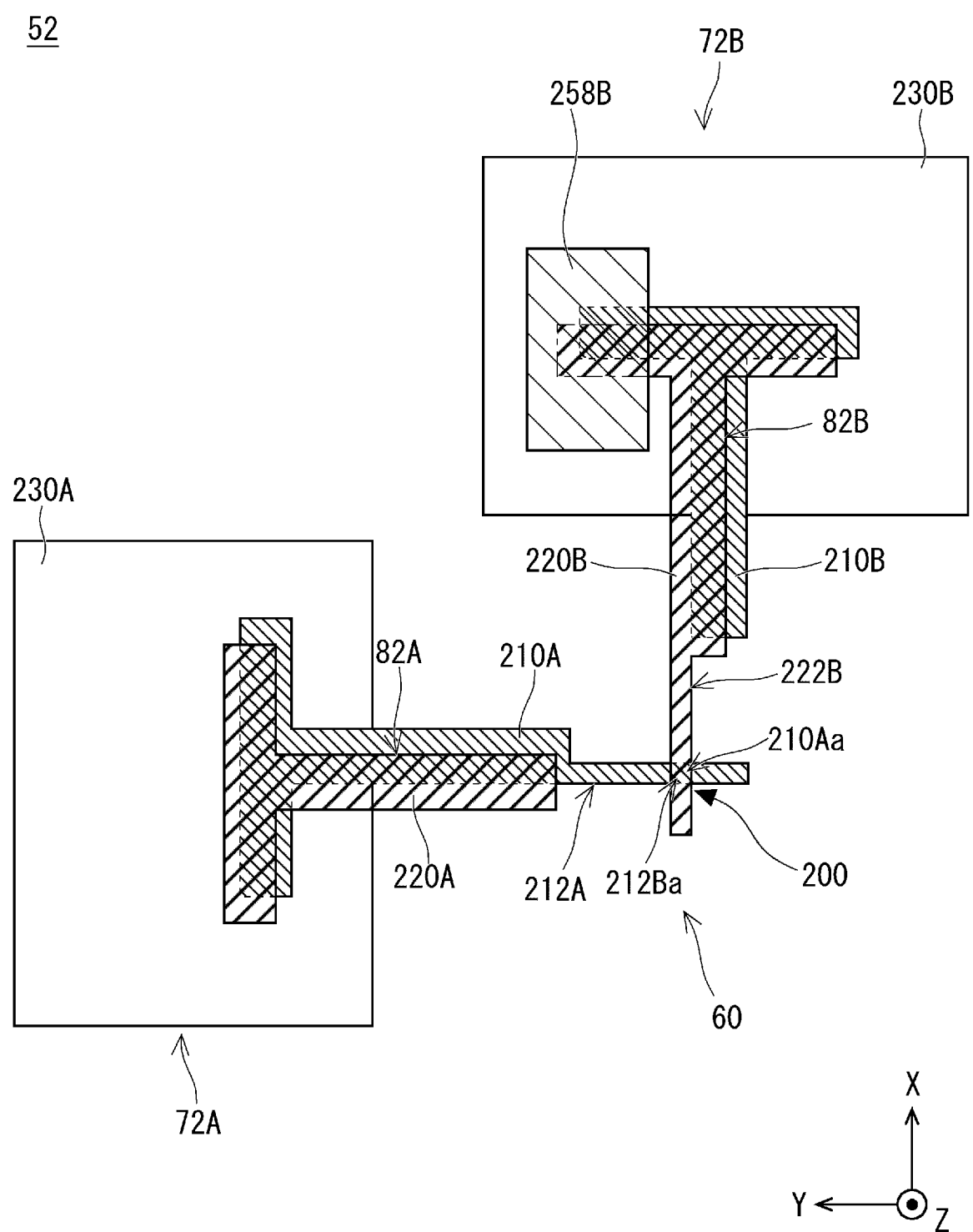
FIG. 49 shows a quantum device according to an eighth example embodiment.

FIG. 49 shows a quantum device 52 according to the eighth example embodiment. FIG. 49 is a plan view of the quantum device 52 according to the eighth example embodiment. The quantum device 52 according to the eighth example embodiment is one that is obtained by manufacturing a structure corresponding to that of the quantum device 50 according to the seventh example embodiment by a bridge-less-type manufacturing method.

The quantum device 52 according to the eighth example embodiment includes a plurality of first conductors 210 (210A and 210B), a plurality of second conductors 220 (220A and 220B), and conductor layers 230 (230A and 230B) that constitute a superconducting circuit. The first conductors 210, the second conductors 220, and the conductor layers 230 are deposited on a substrate 60. The structures of the first conductors 210, the second conductors 220, and the conductor layers 230 are substantially the same as those in the third comparative example unless otherwise specified, and therefore descriptions thereof are omitted as appropriate. Further, the XYZ-orthogonal coordinate system introduced in the fifth example embodiment is also introduced in the eighth example embodiment.

The first conductors 210 are deposited on the conductor layer 230. The second conductors 220 are deposited on the first conductors 210. The first conductors 210, the second conductors 220, and the conductor layers 230 are formed of superconducting materials. For example, the first and second conductors 210 and 220 are formed of aluminum (Al). Further, for example, the conductor layers 230 (third conductors) are formed of niobium (Nb).

Further, an oxide film (AlOx) is formed between the first and second conductors 210 and 220. Further, a Josephson junction 200 is formed by a part of the first conductors 210 (210A) (a first conductor part 210Aa), a part of the second conductors 220 (220B) (a second conductor part 220Ba), and the oxide film. The structure of the Josephson junction 200 is substantially the same as those in the third comparative example and the fifth example embodiment, and therefore the description thereof is omitted as appropriate. Further, the structures of the narrow parts 212A and 222B are substantially the same as those in the third comparative example and the fifth example embodiment, and therefore descriptions thereof are omitted.

Further, similarly to the third comparative example, the first conductor 210A is deposited on the substrate 60 and the conductor layer 230A on the first side 72A. Further, the second conductor 220A is deposited on the first conductor 210A and the conductor layer 230A. Further, an oxide film is formed on a part of the surface of the first conductor 210A that is in contact with the second conductor 220A or 220B. Further, similarly to the third comparative example, no oxide film is formed on a part of the surface of the conductor layer 230A on which the first conductor 210A is deposited. Therefore, the conductor layer 230A is directly connected to the first conductor 210A. That is, the surfaces of the first conductor 210A and the conductor layer 230A, which face each other when the first conductor 210A is deposited on the conductor layer 230A, are directly connected to each other.

Meanwhile, similarly to the third comparative example, the first conductor 210B is deposited on the substrate 60 and the conductor layer 230B on the second side 72B. Further, the second conductor 220B is deposited on the substrate 60 and the first conductor 210B. Further, an oxide film (AlOx) is formed on a part of the surface of the first conductor 210B that is in contact with the second conductor 220B. Further, similarly to the third comparative example, no oxide film is formed on a part of the surface of the conductor layer 230B on which the first conductor 210B is deposited. Therefore, the conductor layer 230B is directly connected to the first conductor 210B.

Further, the quantum device 52 according to the eighth example embodiment includes a connection conductor 258B on the second side 72B. The connection conductor 258B is formed of a superconducting material. The connection conductor 258B may be formed of, for example, aluminum (Al). The connection conductor 258B is directly connected to the second conductor 220B and the conductor layer 230B on the second side 72B. As a result, the connection conductor 258B connects the second conductor 220B to the conductor layer 230B on the second side 72B (a superconducting contact). Note that in the eighth example embodiment, the connection conductor 258B may be connected to the first conductor 210B on the second side 72B. Note that in the eighth example embodiment, a connection (a superconducting contact) between the conductor layer 230A and the first conductor 210A is formed on the first side 72A, no connection conductor is formed on the first side 72A.

Note that the circuit configuration of the quantum device 52 according to the eighth example embodiment is substantially the same as that shown in FIG. 46. That is, on the first side 72A, as an electrical path from the Josephson junction 200 to the conductor layer 230A, there is a second path as well as a first path that passes through the spurious junction 82A functioning as a capacitor. That is, the first path is one through which the Josephson junction 200 is connected to the conductor layer 230A through the first conductor 210A, the spurious junction 82A, the second conductor 220A, and the oxide film formed on the conductor layer 230A. Meanwhile, the second path is one through which the Josephson junction 200 is connected to the first conductor 210A, and the first conductor 210A and the conductor layer 230A are directly connected to each other. That is, the conductors at both ends of the spurious junction 82A are short-circuited, so that the spurious junction 82A is electrically disabled. Therefore, since the electric field generated in the spurious junction 82A does not increase, the spurious junction 82A does not contribute to the cause of the loss.

Further, on the second side 72B, as an electrical path from the Josephson junction 200 to the conductor layer 230B, there is a second path as well as a first path that passes through the spurious junction 82B functioning as a capacitor. That is, the first path is one through which the Josephson junction 200 is connected to the conductor layer 230B through the second conductor 220B, the spurious junction 82B, and the first conductor 210B. Meanwhile, the second path is one through which the Josephson junction 200 is connected to the second conductor 220B, and the second conductor 220B is connected to the conductor layer 230B through the connection conductor 258B. That is, the conductors at both ends of the spurious junction 82B (i.e., the second conductor 220B and the conductor layer 230B) are short-circuited by the connection conductor 258B, so that the spurious junction 82B is electrically disabled. Therefore, since the electric field generated in the spurious junction 82B does not increase, the spurious junction 82B does not contribute to the cause of the loss.

Therefore, the spurious junctions 82A and 82B can be disabled in the eighth example embodiment. As a result, the quantum device 52 according to the eighth example embodiment can suppress the deterioration of the performance thereof. Further, in the eighth example embodiment, the projecting parts formed in the first and second conductors 210 and 220 in the fifth example embodiment and the like may not be formed. Therefore, the quantum device 52 according to the eighth example embodiment can suppress the deterioration of the performance thereof without being equipped with a projecting part. That is, in the quantum device 52 according to the eighth example embodiment, the shape of the superconductor can be simplified as compared with the fifth example embodiment and the like.

Note that in the eighth example embodiment, it is necessary to remove the oxide film formed on the surface of the conductor layer 230 before the first conductor 210 is formed in the conductor layer 230. Therefore, the quantum device 52 according to the eighth example embodiment is manufactured through a larger number of processes than the number of processes required in the fifth example embodiment and the like. Conversely, the quantum device 52 in which the spurious junction 82 is disabled according to the fifth example embodiment can be manufactured by a smaller number of processes than the number of processes required in the eighth example embodiment.

Ninth Example Embodiment

Next, a ninth example embodiment will be described. The following descriptions and drawings are partially omitted and simplified as appropriate to clarify the explanation. Further, the same reference numerals (or symbols) are assigned to the same components/structure, and redundant descriptions thereof are omitted as appropriate.

Figure 50:
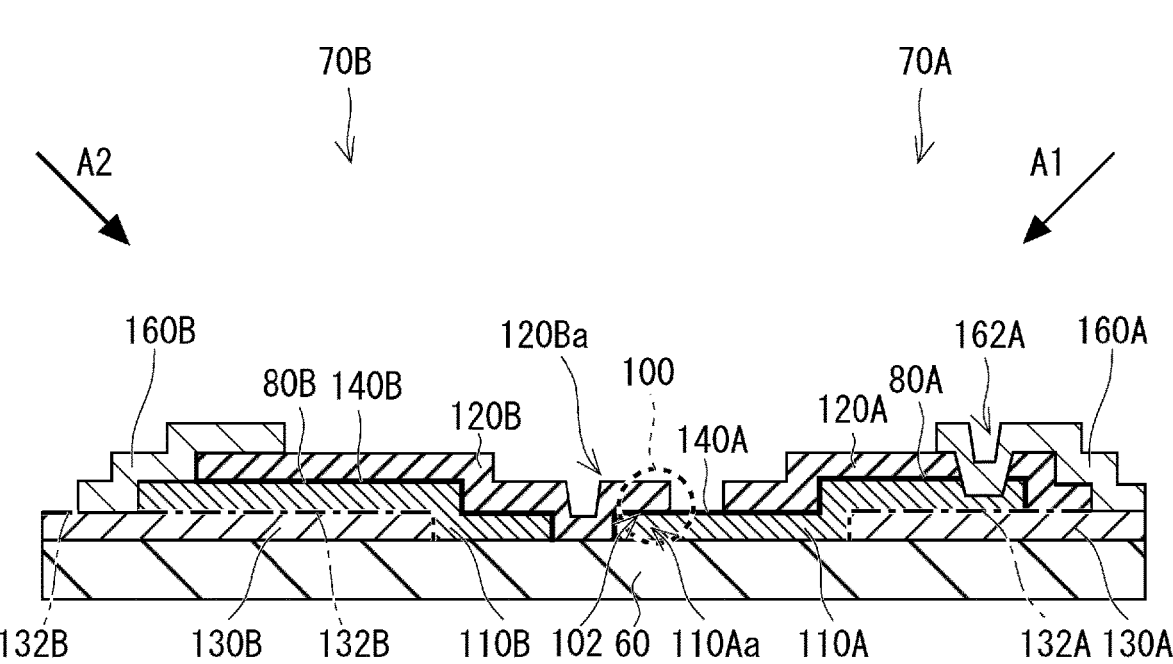
FIG. 50 shows a quantum device according to a ninth example embodiment.

FIG. 50 shows a quantum device 50 according to the ninth example embodiment. FIG. 50 is a cross-sectional diagram of the quantum device 50 according to the ninth example embodiment. The quantum device 50 according to the ninth example embodiment is manufactured by the above-described bridge-type manufacturing method. Similarly to the first example embodiment, the quantum device 50 according to the ninth example embodiment includes a substrate 60, a plurality of first conductors 110 (110A and 110B), a plurality of second conductors 120 (120A and 120B), and conductor layers 130 (130A and 130B). The structures of the first conductors 110, the second conductors 120, and the conductor layers 130 are substantially the same as those in the first example embodiment unless otherwise specified, and therefore descriptions thereof are omitted as appropriate.

The first conductors 110 are deposited on the conductor layers 130. The second conductors 120 are deposited on the first conductors 110. The first conductors 110, the second conductors 120, and the conductor layers 130 are formed of superconducting materials. For example, the first and second conductors 110 and 120 are formed of aluminum (Al). Further, for example, the conductor layers 130 (third conductors) are formed of niobium (Nb).

Further, the quantum device 50 according to the ninth example embodiment includes connection conductors 160 (160A and 160B). The connection conductors 160 are formed of, for example, a superconducting material such as aluminum (Al). Further, oxide films 140 (140A and 140B) are formed between the first and second conductors 110 and 120. Further, a Josephson junction 100 is formed by a part of the first conductors 110 (110A) (a first conductor part 110Aa), a part of the second conductors 120 (120B) (a second conductor part 120Ba), and the oxide film 140 (140A). The structure of the Josephson junction 100 is substantially the same as those in the first comparative example and the first example embodiment, and therefore the description thereof is omitted as appropriate.

On the first side 70A, the first conductor 110A is deposited on the substrate 60 and the conductor layer 130A. Further, the second conductor 120A is deposited on the first conductor 110A and the conductor layer 130A. Further, the connection conductor 160A is deposited on the conductor layer 130A and the second conductor 120A. Note that on the first side 70A, a connection hole 162A is formed at a place where the connection conductor 160A, the second conductor 120A, and the first conductor 110A overlap. That is, the connection hole 162A is formed at the place where the first conductor 110A is covered by the second conductor 120A on the first side 70A. Further, the connection hole 162A extends through the second conductor 120A and the oxide film 140A, and reaches the first conductor 110A. Further, the connection conductor 160A is deposited to the bottom part of the connection hole 162A (i.e., the connection hole 162A is filled with the connection conductor 160A to the bottom part thereof). As a result, the connection conductor 160A is directly connected to the first conductor 110A in the connection hole 162A.

As a result, the first conductor 110A and the conductor layer 130A are connected to each other through the connection conductor 160A (a superconducting contact). Therefore, the conductors at both ends of the spurious junction 80A (i.e., the first conductor 110A and the conductor layer 130A) are short-circuited. Therefore, the spurious junction 80A is electrically disabled. Therefore, since the electric field generated in the spurious junction 80A does not increase, the spurious junction 80A does not contribute to the cause of the loss.

Meanwhile, on the second side 70B, the first conductor 110B is deposited on the substrate 60 and the conductor layer 130B. Further, the second conductor 120B is deposited on the substrate 60 and the first conductor 110B. Further, the connection conductor 160B is deposited on the conductor layer 130B, the first conductor 110B, and the second conductor 120B. As a result, the second conductor 120B is connected to the connection conductor 160B. Therefore, the second conductor 120B is connected through the conductor layer 130B and the connection conductor 160B. That is, the conductors at both ends of the spurious junction 80B (i.e., the second conductor 120B and the conductor layer 130B) are short-circuited by the connection conductor 160B, so that the spurious junction 80B is electrically disabled. Therefore, since the electric field generated in the spurious junction 80B does not increase, the spurious junction 80B does not contribute to the cause of the loss.

Figure 51:
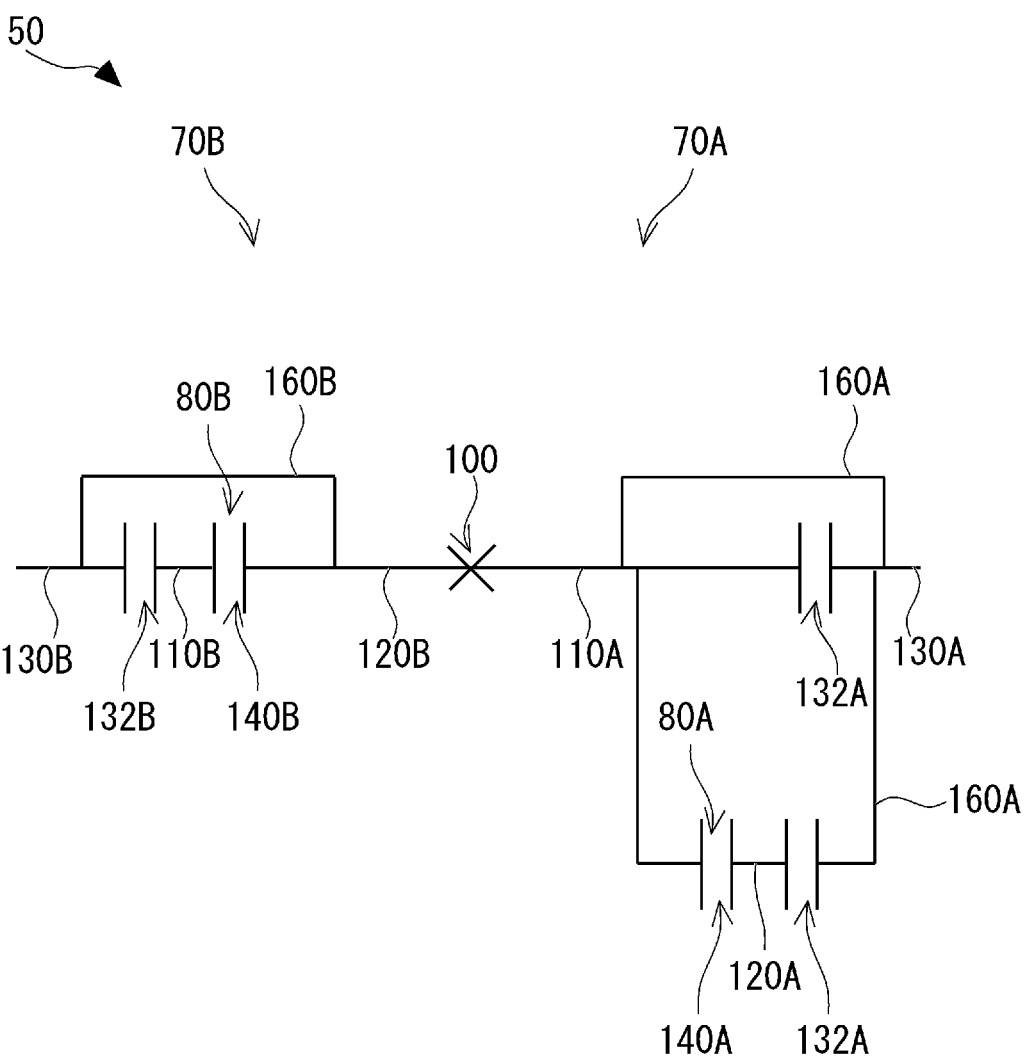
FIG. 51 schematically shows a circuit configuration of a quantum device according to the ninth example embodiment.

FIG. 51 schematically shows a circuit configuration of the quantum device 50 according to the ninth example embodiment. On the first side 70A, as an electrical path from the Josephson junction 100 to the conductor layer 130A, there are a second path and a third path as well as the first path that passes through the spurious junction 80A functioning as a capacitor. That is, the first path is one through which the Josephson junction 100 is connected to the conductor layer 130A through the first conductor 110A, the spurious junction 80A (the oxide film 140A), the second conductor 120A, and the oxide film 132A. Further, the second path is one through which the Josephson junction 100 is connected to the first conductor 110A, and the first conductor 110A is connected to the conductor layer 130A through the oxide film 132A. Meanwhile, the third path is one through which the Josephson junction 100 is connected to the first conductor 110A, and the first conductor 110A is connected to the conductor layer 130A through the connection conductor 160A formed in the connection hole 162A. That is, the conductors at both ends of the spurious junction 80A (i.e., the first conductor 110A and the conductor layer 130A) are short-circuited by the connection conductor 160A. Therefore, the spurious junction 80A is electrically disabled. Accordingly, since the electric field generated in the spurious junction 80A does not increase, the spurious junction 80A does not contribute to the cause of the loss.

Further, on the second side 70B, as an electrical path from the Josephson junction 100 to the conductor layer 130B, there is a second path as well as a first path that passes through the spurious junction 80B functioning as a capacitor. That is, the first path is one through which the Josephson junction 100 is connected to the conductor layer 130B through the second conductor 120B, the spurious junction 80B (the oxide film 140B), the first conductor 110B, and the oxide film 132B. Meanwhile, the second path is one through which the Josephson junction 100 is connected to the second conductor 120B, and the second conductor 120B is connected to the conductor layer 130B through the connection conductor 160B. That is, the conductors at both ends of the spurious junction 80B (i.e., the second conductor 120B and the conductor layer 130B) are short-circuited by the connection conductor 160B, so that the spurious junction 80B is electrically disabled. Therefore, since the electric field generated in the spurious junction 80B does not increase, the spurious junction 80B does not contribute to the cause of the loss.

Figure 52:
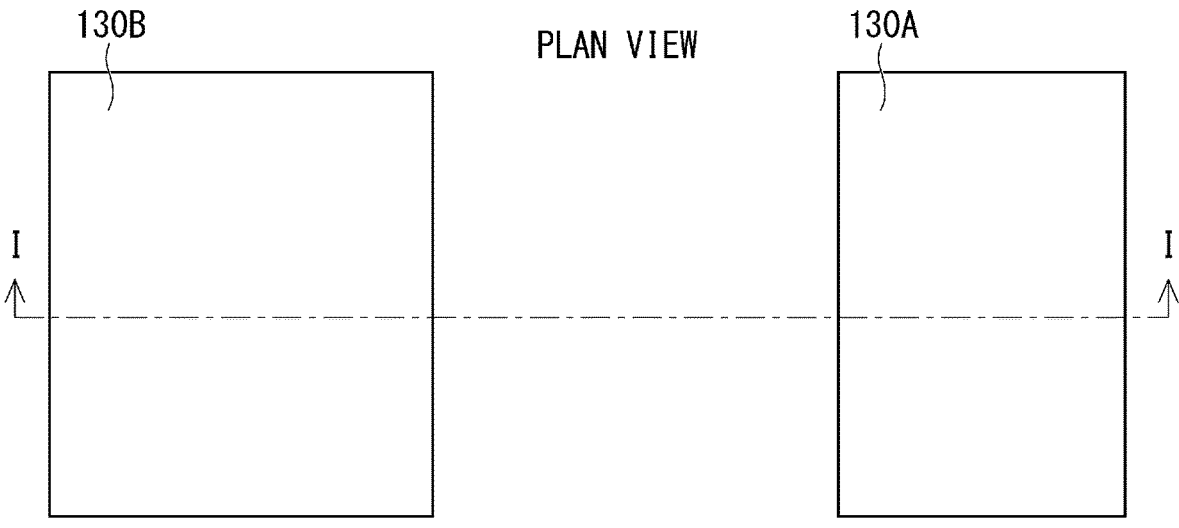
FIG. 52 is a process diagram showing a method for manufacturing a quantum device according to the ninth example embodiment.
Figure 52:
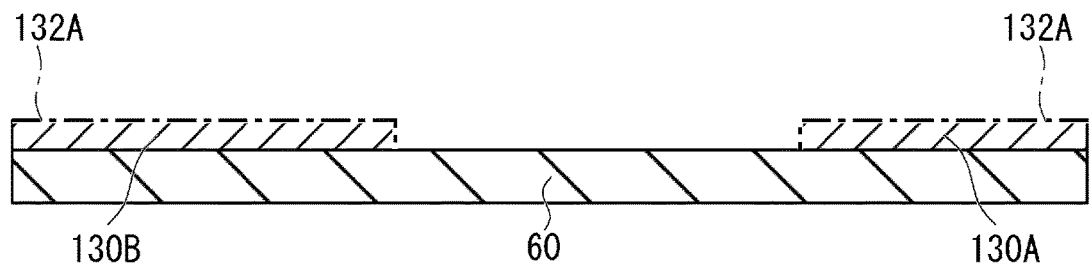

FIGS. 52 to 60 are diagrams showing steps included in a method for manufacturing a quantum device 50 according to the ninth example embodiment. Firstly, as shown in FIG. 52, similarly to the first example embodiment (FIG. 17), a substrate 60 is prepared, and conductor layers 130 are formed on the substrate 60 (a conductor layer deposition step). Note that an oxide film 132 (NbOx) has been formed on the surface of the conductor layers 130 (a part of the surface that is not in contact with the substrate 60).

Figure 53:
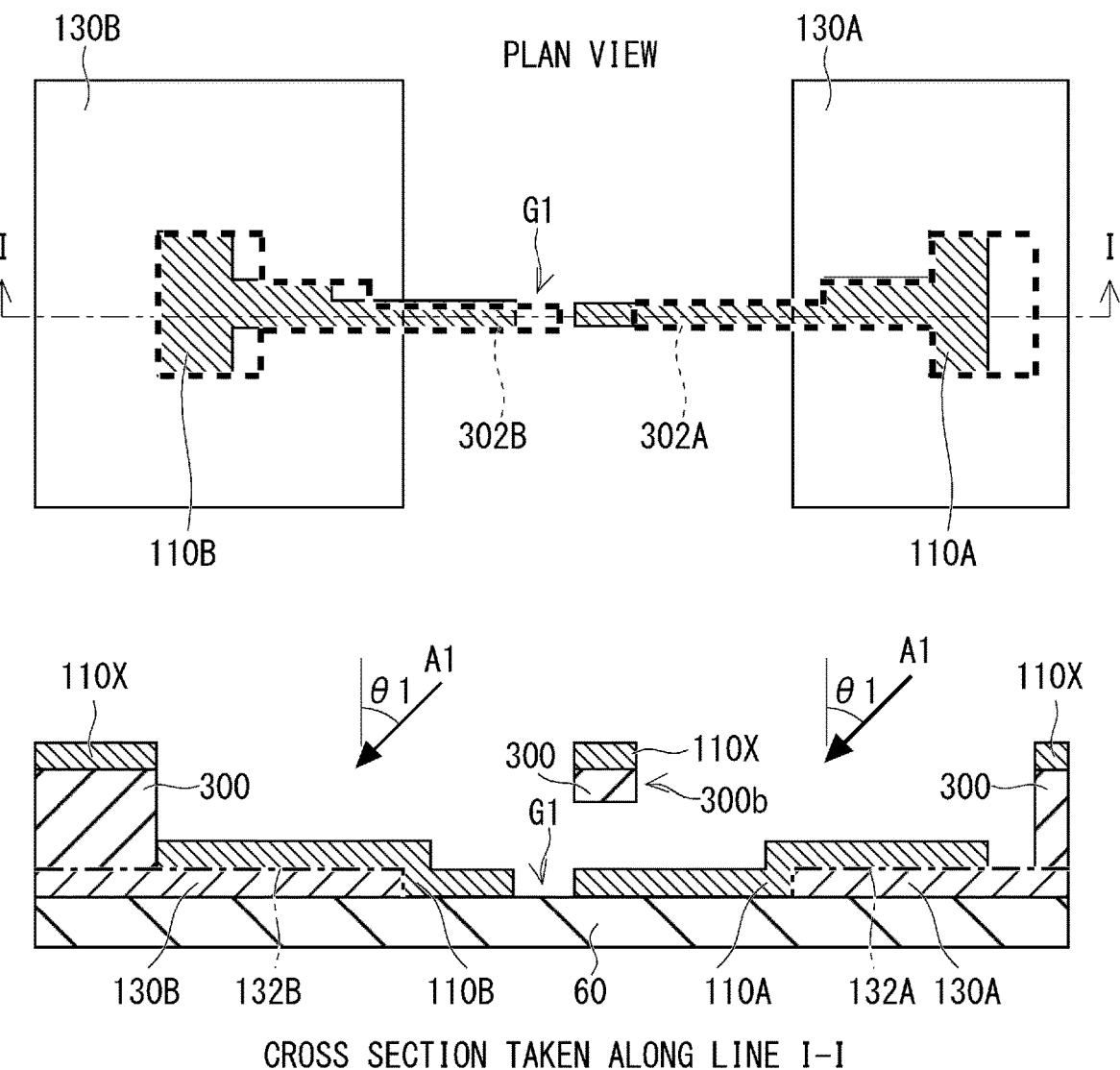
FIG. 53 is a process diagram showing the method for manufacturing the quantum device according to the ninth example embodiment.

Next, as shown in FIG. 53, similarly to the first example embodiment (FIG. 18), a resist mask 300 (a resist pattern) is formed on the substrate 60 (a resist mask formation step). In the ninth example embodiment, similarly to the first example embodiment, the oxide film removal step is not performed at this stage. In this state, the first conductors 110 are evaporated by angled evaporation in a direction indicated by arrows A1 (a first evaporation processing step). In this process, the first conductor 110A is evaporated through the opening 302A. Further, the first conductor 110B is evaporated through the opening 302B. Further, a superconducting material 110X (Al) that has been evaporated together with the first conductors 110 is deposited on the resist mask 300. Further, since the oxide film removal step has not been performed, an oxide film 132A has been formed between the first conductor 110A and the conductor layer 130A. Further, an oxide film 132B has been formed between the first conductor 110B and the conductor layer 130B.

Figure 54:
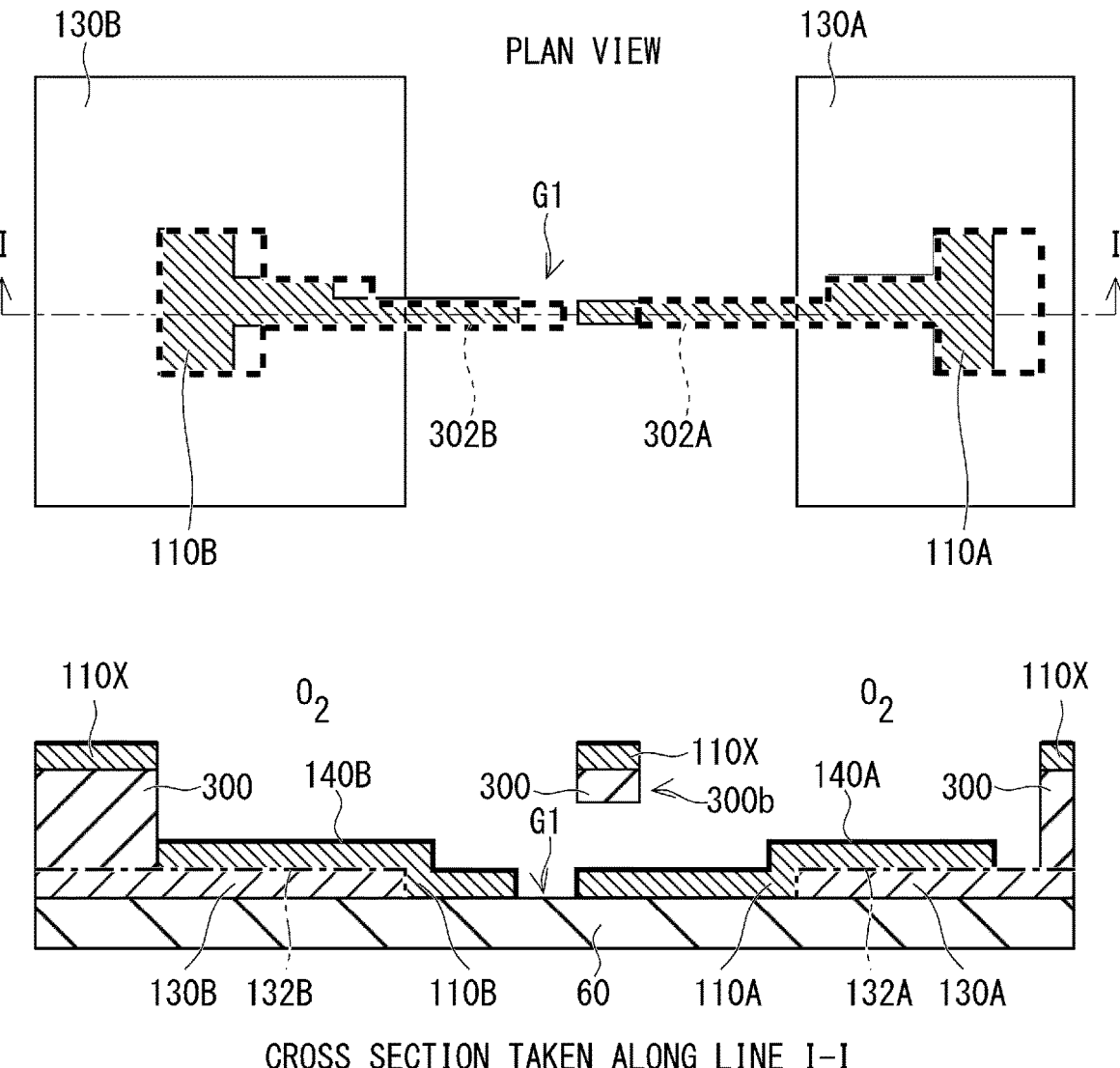
FIG. 54 is a process diagram showing the method for manufacturing the quantum device according to the ninth example embodiment.

Next, as shown in FIG. 54, similarly to the first example embodiment (FIG. 19), the surfaces of the first conductors 110 are oxidized (an oxidation step). As a result, an oxide film 140A (AlOx) is formed on the surface of the first conductor 110A. Further, an oxide film 140B (AlOx) is formed on the surface of the first conductor 110B.

Figure 55:
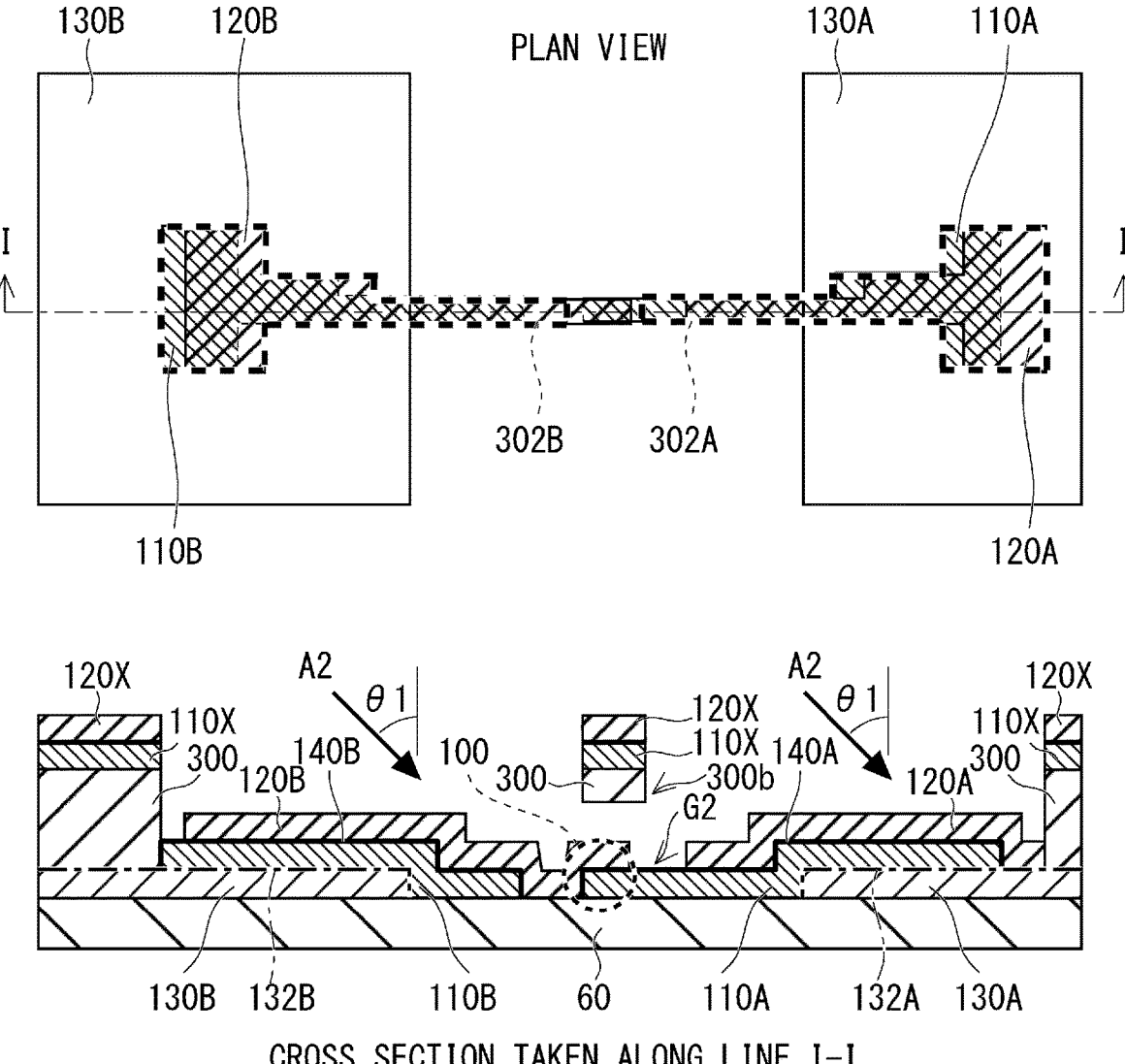
FIG. 55 is a process diagram showing the method for manufacturing the quantum device according to the ninth example embodiment.

Next, as shown in FIG. 55, similarly to the first example embodiment (FIG. 20), second conductors 120 are evaporated by angled evaporation in a direction indicated by arrows A2 (a second evaporation processing step). In this process, the second conductor 120A is evaporated through the opening 302A. Further, the second conductor 120B is evaporated through the opening 302B. Further, a superconducting material 120X (Al) that has been evaporated together with the second conductors 120 is deposited on the resist mask 300. Further, the Josephson junction 100 is formed in a part where the first conductor 110A and second conductor 120B overlap each other.

Figure 56:
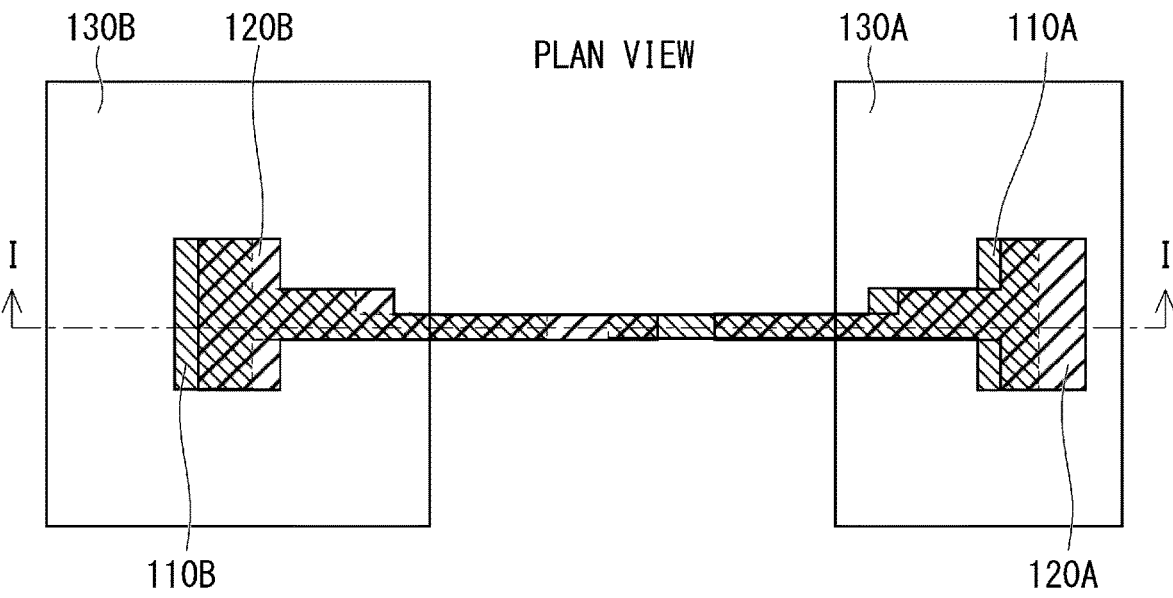
FIG. 56 is a process diagram showing the method for manufacturing the quantum device according to the ninth example embodiment.
Figure 56:
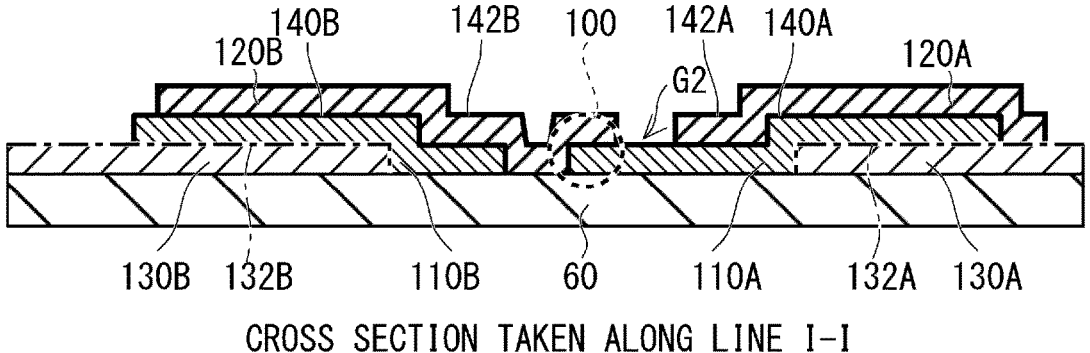

Next, as shown in FIG. 56, similarly to the first example embodiment (FIG. 21), the resist mask 300 is removed (a lift-off step). As a result, the resist mask 300 and the excessive superconducting materials 110X and 120X deposited on the resist mask 300 are removed. At this point, the vacuum state (the sealed state) is released to the atmospheric environment. That is, the apparatus in which the substrate 60 is disposed is released from the vacuum state (the vacuum-sealed state) and is placed under the atmospheric environment. Note that since the substrate 60 is placed under the atmospheric environment, an oxide film 142 is formed on the surface of the second conductors 120. That is, an oxide film 142A is formed on the surface of the second conductor 120A, and an oxide film 142B is formed on the surface of the second conductor 120B.

Figure 57:
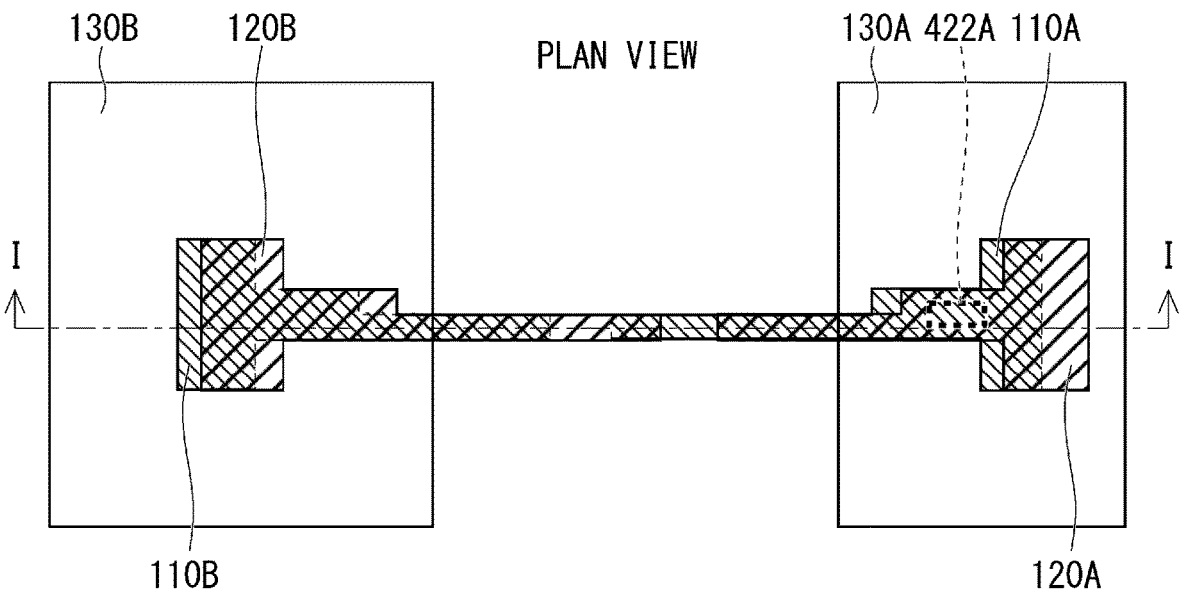
FIG. 57 is a process diagram showing the method for manufacturing the quantum device according to the ninth example embodiment.
Figure 57:
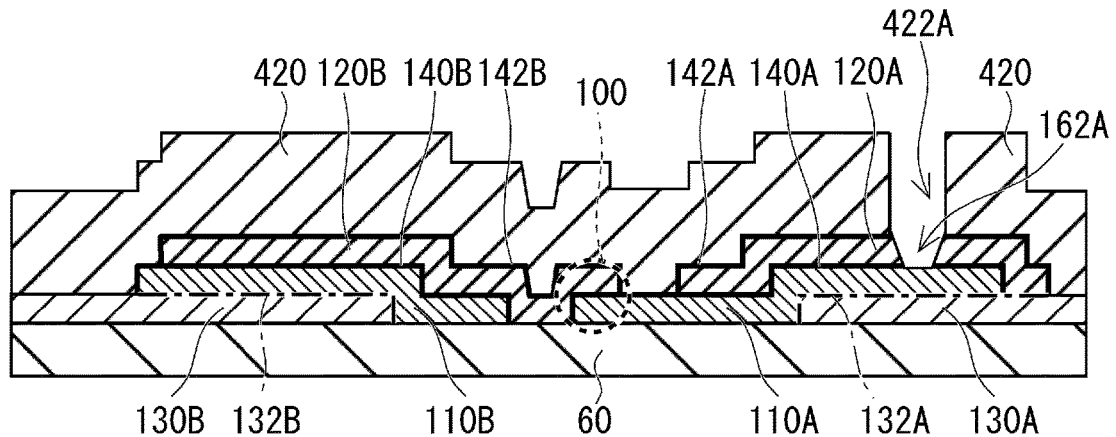

Next, as shown in FIG. 57, a connection hole 162A is formed (a connection hole formation step). Specifically, a resist mask 420 (a resist pattern) for forming the connection hole 162A is formed (a connection hole resist mask formation step). In the resist mask 420, an opening 422A is provided at a place where the second conductor 120A is deposited on the first conductor 110A on the first side 70A. Then, the second conductor 120A and the oxide film 140A deposited at the place corresponding to the opening 422A are removed by a surface treatment process such as etching. When doing so, a part of the first conductor 110A may be removed. As a result, the connection hole 162A is formed at the place corresponding to the opening 422A, so that the first conductor 110A is exposed there. Then, the resist mask 420 is removed.

Figure 58:
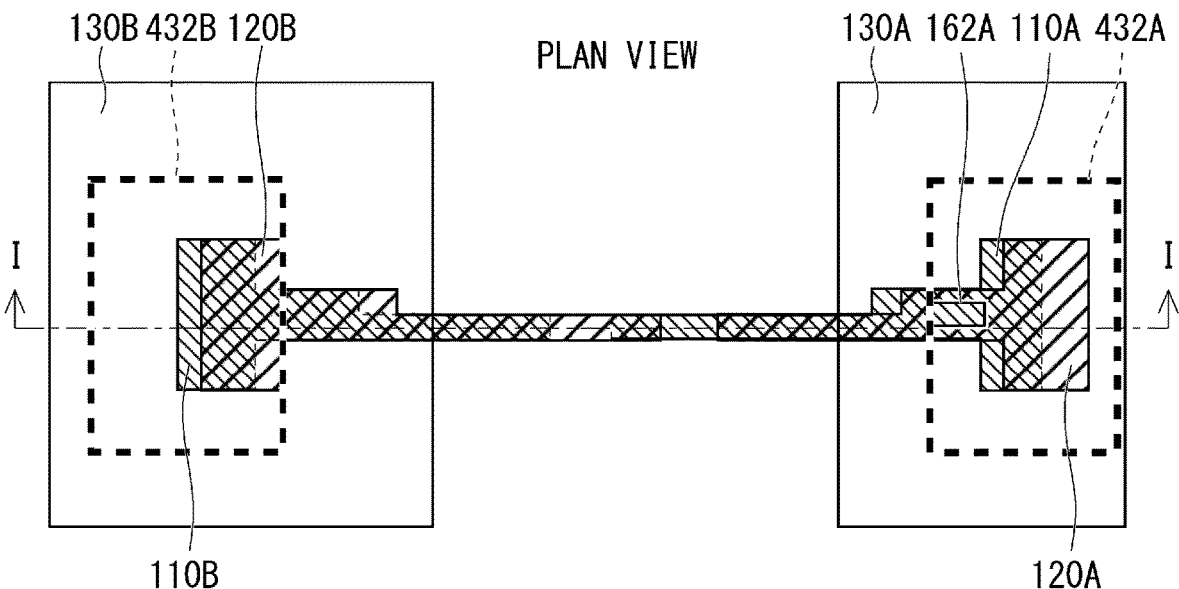
FIG. 58 is a diagram showing a step included in the method for manufacturing the quantum device according to the ninth example embodiment.
Figure 58:
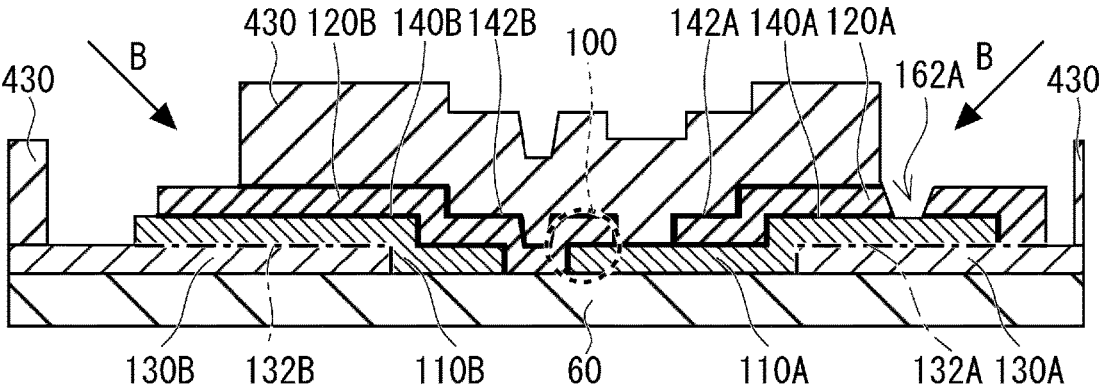

Next, as shown in FIG. 58, a resist mask 430 (a resist pattern) for forming connection conductors 160 is formed (a connection conductor resist mask formation step). In this process, the substrate 60 and the like are placed in a vacuum environment. That is, the substrate 60 and the like are placed and vacuum-sealed inside a vacuumed chamber. Openings 432 (432A and 432B) are formed by the resist pattern of the resist mask 430. In the resist mask 430, the opening 432A is provided on the first side 70A and the opening 432B is provided on the second side 70B. Note that after that and until the resist mask 430 is removed, the substrate 60 and the like except for the parts thereof corresponding to the openings 432 are covered by the resist mask 430. Note that as will be described later, the connection conductors 160 are formed at the places corresponding to the openings 432.

Note that the connection hole 162A is provided at the place corresponding to the opening 432A. In other words, the resist mask 430 is formed so that the connection hole 162A is exposed through the opening 432A. In still other words, the resist mask 430 is formed so as not to cover the connection hole 162A.

Similarly to the first example embodiment, in this state, oxide films formed in the exposed parts of the first conductors 110, the second conductors 120, and the conductor layers 130 not covered by the resist mask 430 are removed (an oxide film removal step). As a result, a part of the oxide film 132 formed on a part of the surface of the conductor layer 130 that is not covered by the resist mask 430, a part of the oxide film 142 formed on a part of the surface of the second conductors 120 that is not covered by the resist mask 430, and a part of the oxide film 140 formed on a part of the surface of the first conductors 110 that is not covered by the resist mask 430 are removed. The removal of the oxide films 132, 140 and 142 is performed by, for example, ion milling or the like in which ion beams are applied to the oxide films through the openings 402 as indicated by arrows B. Note that the oxide films 132, 140 and 142 are removed in order to form a connection (a superconducting contact) between the conductor layers 130 and the superconductors (the first and second conductors 110 and 120) by the connection conductors 160.

Figure 59:
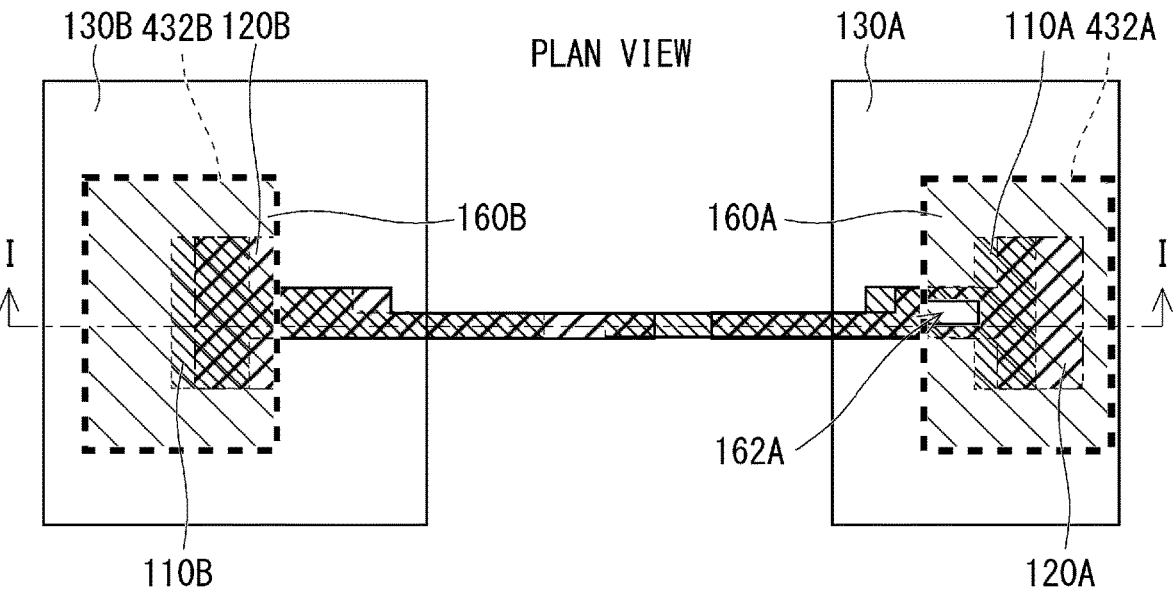
FIG. 59 is a diagram showing a step included in the method for manufacturing the quantum device according to the ninth example embodiment.
Figure 59:
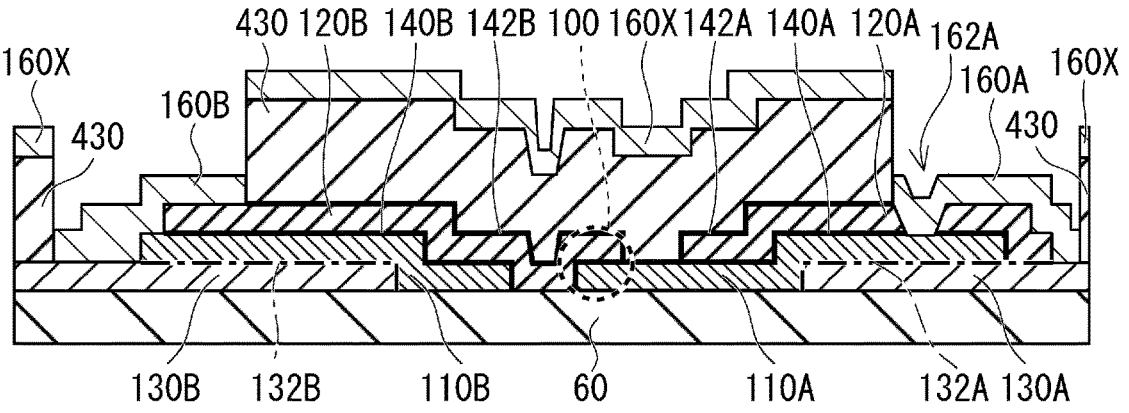

Next, as shown in FIG. 59, similarly to the first example embodiment (FIG. 23), the connection conductors 160 are evaporated through the openings 432 (a connection conductor evaporation step). Note that the evaporation process for the connection conductors 160 does not necessarily have to be the angled evaporation. As a result, a film of the connection conductor 160A is formed through the opening 432A. Note that the film of the connection conductor 160A is formed in the connection hole 162A. Further, the film of the connection conductor 160A is formed on the first conductor 110A through the connection hole 162A. Further, a film of the connection conductor 160B is formed through the opening 432B. Further, a superconducting material 160X (Al) that has been evaporated together with the connection conductors 160 is deposited on the resist mask 430.

Since the film of the connection conductor 160A is formed at the place corresponding to the opening 432A, the first conductor 110A is directly connected to the connection conductor 160A through the connection hole 162A (a superconducting contact). Further, the conductor layer 130A is directly connected to the connection conductor 160A (a superconducting contact). Therefore, the first conductor 110A is connected to the conductor layer 130A through the conductor (the connection conductor 160A). Note that the second conductor 120A is directly connected to the connection conductor 160A (a superconducting contact). Therefore, the second conductor 120A is connected to the conductor layer 130A through the conductor (the connection conductor 160A).

Further, since the film of the connection conductor 160B is formed at the place corresponding to the opening 432B, the second conductor 120B is directly connected to the connection conductor 160B (a superconducting contact). Further, the conductor layer 130B is directly connected to the connection conductor 160B (a superconducting contact). Therefore, the second conductor 120B is connected to the conductor layer 130B through the conductor (the connection conductor 160B). Note that the first conductor 110B is directly connected to the connection conductor 160B (a superconducting contact). Therefore, the first conductor 110B is connected to the conductor layer 130B through the conductor (the connection conductor 160B).

Figure 60:
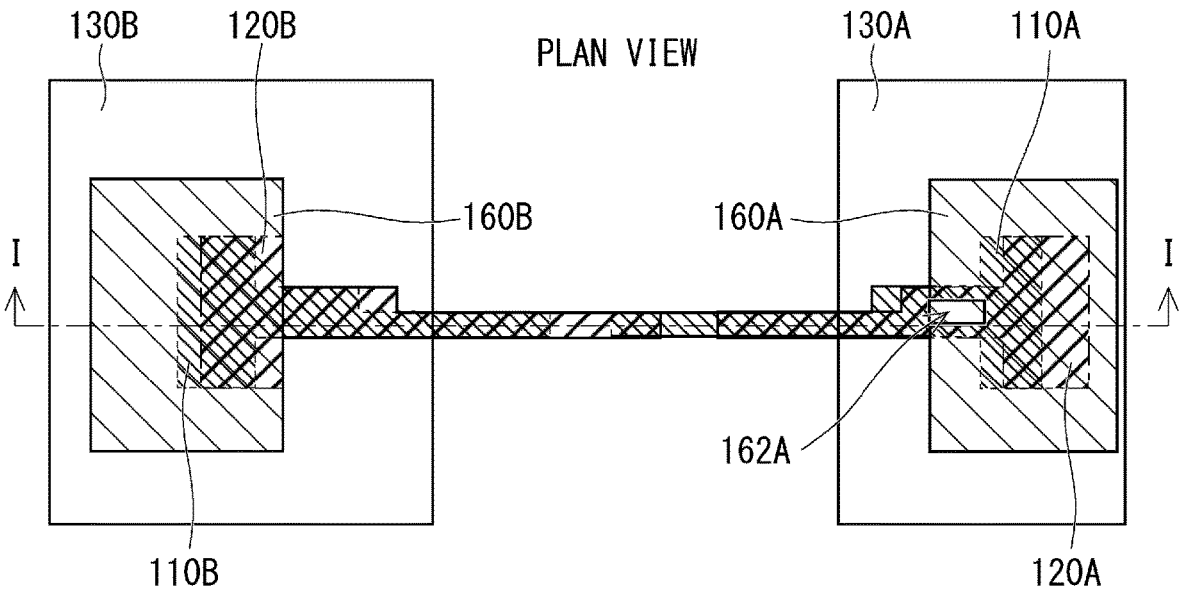
FIG. 60 is a diagram showing a step included in the method for manufacturing the quantum device according to the ninth example embodiment.
Figure 60:
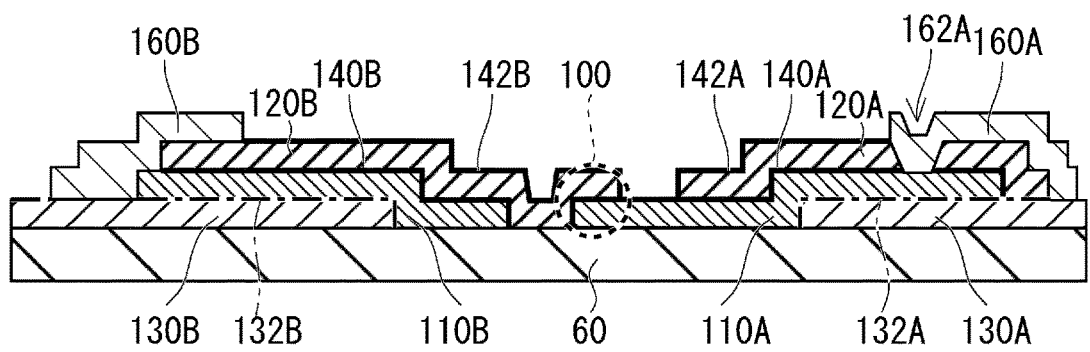

Next, as shown in FIG. 60, similarly to the first example embodiment (FIG. 24), the resist mask 430 is removed (a lift-off step). As a result, the resist mask 430 and the excessive superconducting material 160X deposited on the resist mask 430 are removed. Through the above-described processes, the quantum device 50 according to the ninth example embodiment shown in FIG. 50 is manufactured. Note that the steps shown in FIGS. 53 to 55 are performed in the same vacuum-sealed state. That is, in the steps shown in FIGS. 53 to 55, the vacuum-sealed state is not released to the atmospheric environment. Further, the steps shown in FIGS. 58 and 59 are performed in the same vacuum-sealed state. That is, in the steps shown in FIGS. 58 to 59, the vacuum-sealed state is not released to the atmospheric environment.

As described above, the spurious junctions 80A and 80B can be disabled in the ninth example embodiment. As a result, the quantum device 50 according to the ninth example embodiment can suppress the deterioration of the performance thereof. Further, in the ninth example embodiment, the projecting parts formed in the first and second conductors 110 and 120 in the first example embodiment and the like are not formed. Therefore, the quantum device 50 according to the ninth example embodiment can suppress the deterioration of the performance thereof without being equipped with a projecting part. That is, in the quantum device 50 according to the ninth example embodiment, the shape of the superconductor can be simplified as compared with the first example embodiment and the like.

Note that in the ninth example embodiment, it is necessary to form the connection hole 162A before the films of the connection conductors 160 are formed. Therefore, the quantum device 50 according to the ninth example embodiment is manufactured through a larger number of processes than the number of processes required in the first example embodiment and the like. Conversely, the quantum device 50 in which the spurious junction 80 is disabled according to the first example embodiment or the like can be manufactured by a smaller number of processes than the number of processes required in the ninth example embodiment.

Tenth Example Embodiment

Next, a tenth example embodiment will be described. The following descriptions and drawings are partially omitted and simplified as appropriate to clarify the explanation. Further, the same reference numerals (or symbols) are assigned to the same components/structure, and redundant descriptions thereof are omitted as appropriate.

Figure 61:
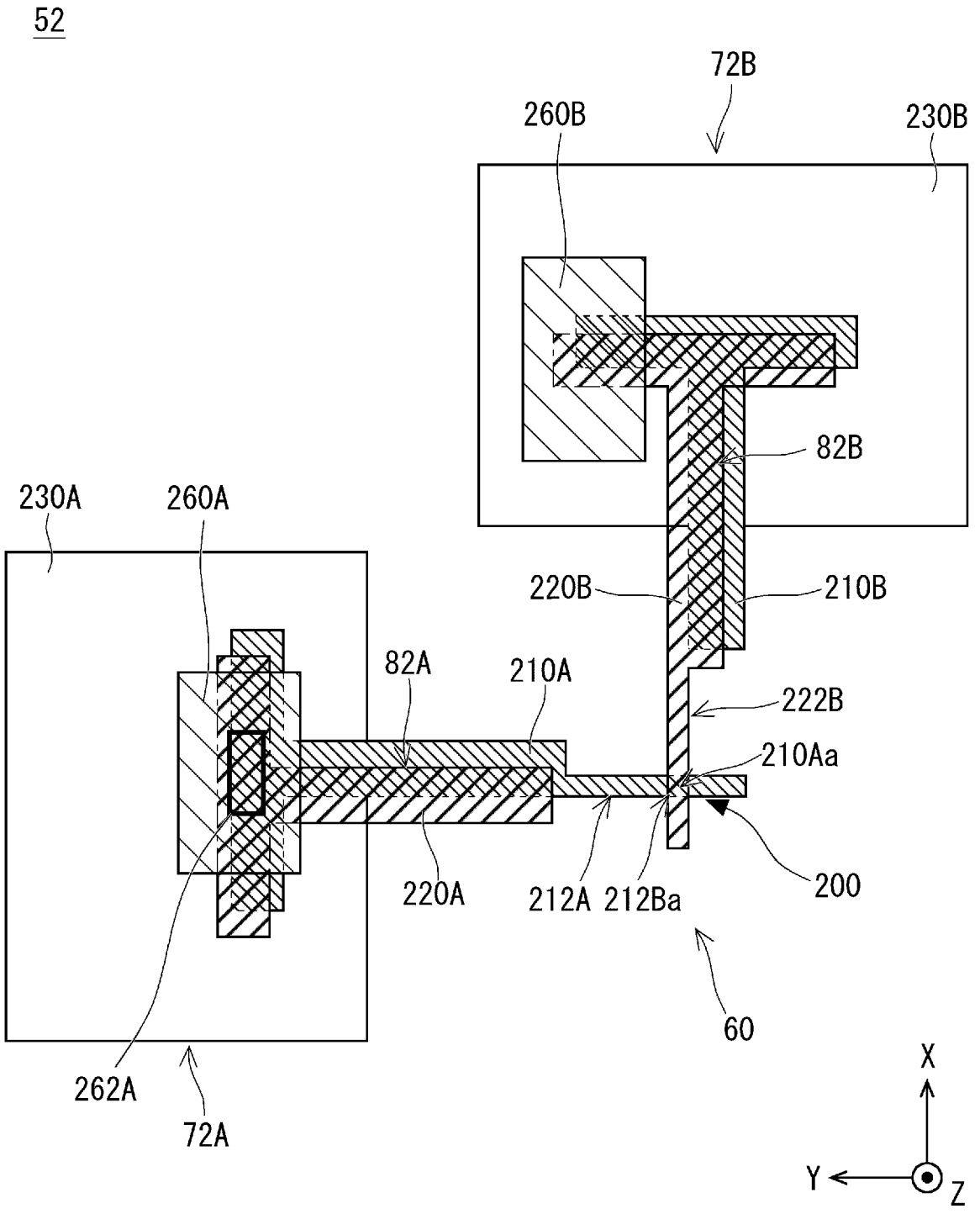
FIG. 61 shows a quantum device according to a tenth example embodiment.

FIG. 61 shows a quantum device 52 according to the tenth example embodiment. FIG. 61 is a plan view of the quantum device 52 according to the tenth example embodiment. The quantum device 52 according to the tenth example embodiment is one that is obtained by manufacturing a structure corresponding to that of the quantum device 50 according to the ninth example embodiment by a bridge-less-type manufacturing method.

The quantum device 52 according to the tenth example embodiment includes a plurality of first conductors 210 (210A and 210B), a plurality of second conductors 220 (220A and 220B), and conductor layers 230 (230A and 230B) that constitute a superconducting circuit. The first conductors 210, the second conductors 220, and the conductor layers 230 are deposited on a substrate 60. The structures of the first conductors 210, the second conductors 220, and the conductor layers 230 are substantially the same as those in the third comparative example unless otherwise specified, and therefore descriptions thereof are omitted as appropriate. Further, the XYZ-orthogonal coordinate system introduced in the fifth example embodiment is also introduced in the tenth example embodiment.

The first conductors 210 are deposited on the conductor layer 230. The second conductors 220 are deposited on the first conductors 210. The first conductors 210, the second conductors 220, and the conductor layers 230 are formed of superconducting materials. For example, the first and second conductors 210 and 220 are formed of aluminum (Al). Further, for example, the conductor layers 230 (third conductors) are formed of niobium (Nb).

Further, an oxide film (AlOx) is formed between the first and second conductors 210 and 220. Further, a Josephson junction 200 is formed by a part of the first conductors 210 (210A) (a first conductor part 210Aa), a part of the second conductors 220 (220B) (a second conductor part 220Ba), and the oxide film. The structure of the Josephson junction 200 is substantially the same as those in the third comparative example and the fifth example embodiment, and therefore the description thereof is omitted as appropriate. Further, the structures of the narrow parts 212A and 222B are substantially the same as those in the third comparative example and the fifth example embodiment, and therefore descriptions thereof are omitted.

Further, similarly to the third comparative example, the first conductor 210A is deposited on the substrate 60 and the conductor layer 230A on the first side 72A. Further, the second conductor 220A is deposited on the first conductor 210A and the conductor layer 230A. Further, an oxide film is formed on a part of the surface of the first conductor 210A that is in contact with the second conductor 220A or 220B. Further, similarly to the fifth example embodiment and the like, an oxide film is formed on a part of the surface of the conductor layer 230A on which the first conductor 210A and the second conductor 220A are deposited.

Meanwhile, similarly to the third comparative example, the first conductor 210B is deposited on the substrate 60 and the conductor layer 230B on the second side 72B. Further, the second conductor 220B is deposited on the substrate 60 and the first conductor 210B. Further, an oxide film (AlOx) is formed on a part of the surface of the first conductor 210B that is in contact with the second conductor 220B. Further, similarly to the fifth example embodiment and the like, an oxide film is formed on a part of the surface of the conductor layer 230B on which the first conductor 210B and the second conductor 220B are deposited.

Further, the quantum device 52 according to the tenth example embodiment includes connection conductors 260 (260A and 260B). The connection conductors 260 are formed of a superconducting material. The connection conductors 260 may be formed of, for example, aluminum (Al). The connection conductor 260A is directly connected to the first conductor 210A and the conductor layer 230A on the first side 72A. As a result, the connection conductor 260A connects the first conductor 210A to the conductor layer 230A on the first side 72A (a superconducting contact). Note that in the tenth example embodiment, the connection conductor 260A may be connected to the second conductor 220A on the first side 72A. The connection conductor 260A is deposited on the conductor layer 230A and the second conductor 220A.

Note that on the first side 72A, a connection hole 262A is formed in a place where the connection conductor 260A, the second conductor 220A, and the first conductor 210A are deposited. That is, the connection hole 262A is formed in the place where the first conductor 210A is covered by the second conductor 220A on the first side 72A. Further, the connection hole 262A extends through the second conductor 220A and the oxide film of the first conductor 210A and reaches the first conductor 210A. Further, the connection conductor 260A is deposited to the bottom part of the connection hole 262A (i.e., the connection hole 262A is filled with the connection conductor 260A to the bottom part thereof). As a result, the connection conductor 260A is directly connected to the first conductor 210A in the connection hole 262A.

As a result, the first conductor 210A and the conductor layer 230A are connected to each other through the connection conductor 260A formed in the connection hole 262A (a superconducting contact). Therefore, the conductors at both ends of the spurious junction 82A (i.e., the first conductor 210A and the conductor layer 230A) are short-circuited. Therefore, the spurious junction 82A is electrically disabled. Therefore, since the electric field generated in the spurious junction 82A does not increase, the spurious junction 82A does not contribute to the cause of the loss.

Further, the connection conductor 260B is directly connected to the second conductor 220B and the conductor layer 230B on the second side 72B. As a result, the connection conductor 260B connects the second conductor 220B to the conductor layer 230B on the second side 72B (a superconducting contact). Note that in the tenth example embodiment, the connection conductor 260B may be connected to the first conductor 210B on the second side 72B. The connection conductor 260B is deposited on the conductor layer 230B, the first conductor 210B, and the second conductor 220B. As a result, the second conductor 220B is connected to the connection conductor 260B. The conductors at both ends of the spurious junction 82B (i.e., the second conductor 220B and the conductor layer 230B) are short-circuited by the connection conductor 260B, so that the spurious junction 82B is electrically disabled. Therefore, since the electric field generated in the spurious junction 82B does not increase, the spurious junction 82B does not contribute to the cause of the loss.

Note that the circuit configuration of the quantum device 52 according to the tenth example embodiment is substantially the same as that shown in FIG. 51. That is, on the first side 72A, as an electrical path from the Josephson junction 200 to the conductor layer 230A, there are a second path and a third path as well as a first path that passes through the spurious junction 82A functioning as a capacitor. That is, the first path is one through which the Josephson junction 200 is connected to the conductor layer 230A through the first conductor 210A, the spurious junction 82A, the second conductor 220A, and the oxide film formed on the conductor layer 230A. Further, the second path is one through which the Josephson junction 200 is connected to the first conductor 210A, and the first conductor 210A is connected to the conductor layer 230A through the oxide film formed in the conductor layer 230A. Meanwhile, the third path is one through which the Josephson junction 200 is connected to the first conductor 210A, and the first conductor 210A is connected to the conductor layer 230A through the connection conductor 260A formed in the connection hole 262A. That is, the conductors at both ends of the spurious junction 82A (i.e., the first conductor 210A and the conductor layer 230A) are short-circuited. Therefore, the spurious junction 82A is electrically disabled. Accordingly, since the electric field generated in the spurious junction 82A does not increase, the spurious junction 82A does not contribute to the cause of the loss.

Further, on the second side 70B, as an electrical path from the Josephson junction 200 to the conductor layer 230B, there is a second path as well as a first path that passes through the spurious junction 82B functioning as a capacitor. That is, the first path is one through which the Josephson junction 200 is connected to the conductor layer 230B through the second conductor 220B, the spurious junction 82B, the first conductor 210B, and the oxide film formed in the conductor layer 230B. Meanwhile, the second path is one through which the Josephson junction 200 is connected to the second conductor 220B, and the second conductor 220B is connected to the conductor layer 230B through the connection conductor 260B. That is, the conductors at both ends of the spurious junction 82B (i.e., the second conductor 220B and the conductor layer 230B) are short-circuited by the connection conductor 260B, so that the spurious junction 82B is electrically disabled. Therefore, since the electric field generated in the spurious junction 82B does not increase, the spurious junction 82B does not contribute to the cause of the loss.

Therefore, the spurious junctions 82A and 82B can be disabled in the tenth example embodiment. As a result, the quantum device 52 according to the tenth example embodiment can suppress the deterioration of the performance thereof. Further, in the tenth example embodiment, the projecting parts formed in the first and second conductors 210 and 220 in the fifth example embodiment and the like may not be formed. Therefore, the quantum device 52 according to the tenth example embodiment can suppress the deterioration of the performance thereof without being equipped with a projecting part. That is, in the quantum device 52 according to the tenth example embodiment, the shape of the superconductor can be simplified as compared with the fifth example embodiment and the like.

Note that in the tenth example embodiment, it is necessary to form the connection hole 262A before the films of the connection conductors 260 are formed. Therefore, the quantum device 52 according to the tenth example embodiment is manufactured through a larger number of processes than the number of processes required in the fifth example embodiment and the like. Therefore, the quantum device 52 in which the spurious junction 82 is disabled according to the fifth example embodiment or the like can be manufactured by a smaller number of processes than the number of processes required in the tenth example embodiment.

Modified Example

Note that the present invention is not limited to the above-described example embodiments, and they can be modified as appropriate without departing from the scope and spirit of the invention. For example, a plurality of example embodiments can be applied to each other. For example, the ninth example embodiment may be applied to the first example embodiment. As a result, it is possible to increase the connection area between the connection conductors and the first conductor 110A. Further, although the first conductors 110 is deposited on the conductor layers 130 in the above-described first example embodiment, the structure is not limited to this example. Even when the first conductors 110 is not deposited on the conductor layers 130, the first conductors 110 may be connected to the conductor layers 130 by the connection conductors 150. The same applies to other example embodiments.

Although the present invention has been described above with reference to example embodiments, the present invention is not limited by the above-described example embodiments. Various modifications that can be understood by those skilled in the art can be made to the structures and details of the present invention within the scope of the invention.

The whole or part of the example embodiments disclosed above can be described as, but not limited to, the following supplementary notes.

(Supplementary Note 1)

A quantum device comprising:

a plurality of first conductors formed of a superconducting material in a layered state;

a plurality of second conductors formed of a superconducting material, at least a part of the second conductors being deposited on the first conductors; and a conductor layer formed of a superconducting material, wherein an oxide film is formed between the first conductors and the second conductors, and a Josephson junction is formed by a part of one of the plurality of first conductors, a part of one of the plurality of second conductors, and the oxide film, the one first conductor constituting the Josephson junction and the conductor layer are connected to each other directly or through a conductor, and the one second conductor constituting the Josephson junction and the conductor layer are connected to each other directly or through a conductor.

(Supplementary Note 2)

The quantum device described in Supplementary note 1, further comprising at least one connection conductor formed of a superconducting material, wherein the one second conductor constituting the Josephson junction and the conductor layer are connected to each other by the connection conductor.

(Supplementary Note 3)

The quantum device described in Supplementary note 1 or 2, wherein the one first conductor constituting the Josephson junction is directly connected to the conductor layer.

(Supplementary Note 4)

The quantum device described in Supplementary note 3, wherein the first conductors are deposited on the conductor layer, and a surface of the one first conductor constituting the Josephson junction and a surface of the conductor layer, which face each other when the one first conductor is deposited on the conductor layer, are directly connected to each other.

(Supplementary Note 5)

The quantum device described in Supplementary note 1 or 2, wherein in a part of the one first conductor constituting the Josephson junction that is covered by at least one of the second conductors that does not constitute the Josephson junction, a hole extending through the at least one of the second conductors and the oxide film, and reaching the one first conductor is formed, and the one first conductor is connected to the conductor layer in the hole.

(Supplementary Note 6)

The quantum device described in Supplementary note 5, wherein a connection conductor formed of a superconducting material is formed in the hole, and the one first conductor is connected to the conductor layer by the connection conductor.

(Supplementary Note 7)

A method for manufacturing a quantum device comprising:

forming a resist mask on a substrate, the substrate including a conductor layer formed of a superconducting material formed therein, the resist mask being a mask for forming a Josephson junction by a first conductor formed of a superconducting material and a second conductor formed of a superconducting material;

depositing a plurality of first conductors on the substrate, on which the resist mask has been formed, by angled evaporation performed in a first direction;

oxidizing a surface of the first conductors and thereby forming an oxide film thereon;

depositing at least a part of the second conductors on each of the plurality of first conductors by angled evaporation performed in a second direction, and thereby forming a Josephson junction by a part of one of the first conductors, a part of one of the second conductors, and the oxide film; and connecting the one second conductor constituting the Josephson junction to the conductor layer directly or through a conductor.

(Supplementary Note 8)

The method for manufacturing a quantum device described in Supplementary note 7, wherein the one second conductor constituting the Josephson junction is connected to the conductor layer by depositing a connection conductor formed of a superconducting material on the one second conductor and the conductor layer.

(Supplementary Note 9)

The method for manufacturing a quantum device described in Supplementary note 7 or 8, wherein the oxide film formed on a surface of the conductor layer is removed, and then the first conductors are deposited on the conductor layer.

(Supplementary Note 10)

The method for manufacturing a quantum device described in Supplementary note 9, wherein a surface of the one first conductor constituting the Josephson junction and a surface of the conductor layer, which face each other when the one first conductor is deposited on the conductor layer, are directly connected to each other.

(Supplementary Note 11)

The method for manufacturing a quantum device described in Supplementary note 9 or 10, wherein the oxide film formed on the surface of the conductor layer is removed by applying a beam for removing the oxide film to the surface of the conductor layer while preventing the beam being applied to an area other than the surface of the conductor layer.

(Supplementary Note 12)

The method for manufacturing a quantum device described in Supplementary note 11, wherein after the resist mask is formed, the oxide film formed on the surface of the conductor layer is removed by applying the beam in a third direction different from the first and second directions while preventing the beam being applied to the area other than the surface of the conductor layer.

(Supplementary Note 13)

The method for manufacturing a quantum device described in Supplementary note 7 or 8, wherein in a part of the one first conductor constituting the Josephson junction that is covered by at least one of the second conductors that does not constitute the Josephson junction, a hole extending through the at least one of the second conductors and the oxide film, and reaching the one first conductor is formed.

(Supplementary Note 14)

The method for manufacturing a quantum device described in Supplementary note 13, wherein the one first conductor is connected to the conductor layer by forming a connection conductor formed of a superconducting material in the hole.

REFERENCE SIGNS LIST

1 QUANTUM DEVICE
2 FIRST CONDUCTOR

2a PROJECTING PART
4 SECOND CONDUCTOR
6 CONDUCTOR LAYER
8 OXIDE FILM
10 JOSEPHSON JUNCTION
50, 52 QUANTUM DEVICE
60 SUBSTRATE
70A, 72A FIRST SIDE
70B, 72B SECOND SIDE
80, 82 SPURIOUS JUNCTION
100 JOSEPHSON JUNCTION
102 TUNNEL BARRIER LAYER
110 FIRST CONDUCTOR
110Aa FIRST CONDUCTOR PART
110B FIRST CONDUCTOR
112A PROJECTING PART
114 PROJECTING PART
116A PROJECTING PART
120 SECOND CONDUCTOR
120Ba SECOND CONDUCTOR PART
120X SUPERCONDUCTING MATERIAL
124 PROJECTING PART
126A PROJECTING PART
130 CONDUCTOR LAYER
132 OXIDE FILM
140 OXIDE FILM
142 OXIDE FILM
150 CONNECTION CONDUCTOR
152 CONNECTION CONDUCTOR
154 CONNECTION CONDUCTOR
156A CONNECTION CONDUCTOR
158B CONNECTION CONDUCTOR
160 CONNECTION CONDUCTOR
162A CONNECTION HOLE
200 JOSEPHSON JUNCTION
210 FIRST CONDUCTOR
210Aa FIRST CONDUCTOR PART
212A NARROW PART
214A PROJECTING PART
214B PROJECTING PART
216A PROJECTING PART
220 SECOND CONDUCTOR
220Ba SECOND CONDUCTOR PART
222B NARROW PART
224A PROJECTING PART
224B PROJECTING PART
226B PROJECTING PART
230 CONDUCTOR LAYER
250 CONNECTION CONDUCTOR
256 CONNECTION CONDUCTOR
258B CONNECTION CONDUCTOR
260 CONNECTION CONDUCTOR
262A CONNECTION HOLE
300 RESIST MASK
300b RESIST BRIDGE
302 OPENING
304 NARROW HOLE PART
310 RESIST MASK

312 OPENING
314A RECESSED PART
314B RECESSED PART
320 RESIST MASK
321 RESIST MASK PART
322 OPENING
400 RESIST MASK
402 OPENING
410 RESIST MASK
412B OPENING
420 RESIST MASK
422A OPENING
430 RESIST MASK
432 OPENING
500 RESIST MASK
502 OPENING
504A NARROW HOLE PART
504B NARROW HOLE PART
506A RECESSED PART
506B RECESSED PART
510 RESIST MASK
512 OPENING
516A RECESSED PART
516B RECESSED PART

What is claimed is:

1. A quantum device comprising:

a plurality of first conductors formed of a superconducting material layer;

a plurality of second conductors formed of a superconducting material, at least a part of the second conductors being deposited on the first conductors; and at least one conductor layer formed of a superconducting material, wherein:

an oxide film is formed between the first conductors and the second conductors, and a Josephson junction is formed by a part of one of the plurality of first conductors, a part of one of the plurality of second conductors, and the oxide film, the one first conductor constituting the Josephson junction and the conductor layer are connected to each other directly or through a conductor, the one second conductor constituting the Josephson junction and the conductor layer are connected to each other directly or through a conductor, and in a part of the one first conductor constituting the Josephson junction that is covered by at least one of the second conductors that does not constitute the Josephson junction, a hole extending through the at least one of the second conductors and the oxide film, and reaching the one first conductor is formed, and the one first conductor is connected to the conductor layer in the hole.

2. The quantum device according to claim 1, wherein a connection conductor formed of a superconducting material is formed in the hole, and the one first conductor is connected to the conductor layer by the connection conductor.

* * * * *